United States Patent
Watanabe et al.

(10) Patent No.: US 6,246,629 B1
(45) Date of Patent: Jun. 12, 2001

(54) SEMICONDUCTOR IC DEVICE HAVING A MEMORY AND A LOGIC CIRCUIT IMPLEMENTED WITH A SINGLE CHIP

(75) Inventors: Takao Watanabe, Fuchu; Kazushige Ayukawa, Kokubunji; Ryo Fujita, Hitachi; Kazumasa Yanagisawa, Kokubunji; Hitoshi Tanaka, Ome, all of (JP)

(73) Assignees: Hitachi, Ltd.; Hitachi ULSI Engineering Corp., both of Tokyo (JP)

( * ) Notice: Subject to any disclaimer, the term of this patent is extended or adjusted under 35 U.S.C. 154(b) by 0 days.

(21) Appl. No.: 09/551,878

(22) Filed: Apr. 18, 2000

Related U.S. Application Data

(60) Continuation of application No. 09/413,641, filed on Oct. 6, 1999, now Pat. No. 6,097,663, which is a division of application No. 09/188,367, filed on Nov. 10, 1998, now Pat. No. 5,995,439, which is a continuation of application No. 08/813,900, filed on Mar. 7, 1997, now Pat. No. 6,069,834.

(30) Foreign Application Priority Data

| Mar. 8, 1996 | (JP) | .................................... 8-051321 |
| Mar. 8, 1996 | (JP) | .................................... 8-051330 |
| Jun. 10, 1996 | (JP) | .................................... 8-147010 |
| Nov. 13, 1996 | (JP) | .................................... 8-301538 |

(51) Int. Cl.$^7$ ...................................................... G11C 8/00
(52) U.S. Cl. ................. 365/230.03; 365/63; 365/189.08
(58) Field of Search ................................. 365/63, 52, 51, 365/230.03, 195, 189.08, 230.06

(56) References Cited

U.S. PATENT DOCUMENTS

| 5,371,896 | 12/1994 | Gove et al. ........................... 395/800 |
| 5,384,745 | 1/1995 | Konishi et al. ................. 365/230.03 |
| 5,386,391 | 1/1995 | Watanabe ............................. 365/233 |
| 5,535,161 | 7/1996 | Kato ..................................... 365/200 |
| 5,535,172 | 7/1996 | Reddy et al. .................... 365/230.03 |
| 5,566,371 | 10/1996 | Ogawa ............................. 365/230.03 |
| 5,570,319 | 10/1996 | Santoro et al. ................. 365/230.03 |
| 5,657,273 | 8/1997 | Ayukawa et al. ............... 365/189.01 |
| 5,675,537 | 10/1997 | Bill et al. ........................ 365/185.22 |
| 5,691,955 | 11/1997 | Yamauchi ............................. 365/233 |
| 5,708,612 | 1/1998 | Abe ...................................... 365/200 |
| 5,835,424 | 11/1998 | Kikukawa et al. ................... 365/200 |
| 5,926,431 | 7/1999 | Toda ................................. 365/230.03 |
| 5,953,278 | 9/1999 | McAdams et al. .................. 365/219 |
| 5,953,280 | 9/1999 | Matsui ............................. 365/230.03 |

FOREIGN PATENT DOCUMENTS 726 575    8/1996  (EP) .

OTHER PUBLICATIONS

IEEE Journal of Solid–State Circuit, vol. 30, No. 9, Sep. 1995, pp. 1006–1014.

*Primary Examiner*—Richard Elms
*Assistant Examiner*—Hien Nguyen
(74) *Attorney, Agent, or Firm*—Mattingly, Stanger & Malur, P.C.

(57) ABSTRACT

A semiconductor IC device is designed using a memory core with a plurality of I/O lines, a transfer circuit module and a logic library which are produced beforehand and stored in a data base. The memory core and a logic circuit are arranged so that their I/O lines extend in the same direction. A transfer circuit including plural stages of switch groups is arranged between the I/O lines of the memory core and the I/O lines of the logic circuit. Switches forming each stage of switch group are formed between the I/O lines of the memory core and the I/O lines of the logic circuit. When one stage of or a small number of stages of switch groups are turned on, the I/O lines of the memory core and the I/O lines of the logic circuit are turned on, thereby forming a desired transfer pattern. The memory core is constructed by the combination of functional modules such as an amplifier module, a bank module and a power supply module. In the bank module are arranged row-system circuits which operate independently of each other and a multiplicity of I/O lines which extend in a bit line direction.

15 Claims, 44 Drawing Sheets

| TRANSFER PATTERN | CONTROL SIGNAL | | |
|---|---|---|---|
| | TGCi 1 2 3 4 5 6 7 | TGRW | LIOEi 0 1 2 3 |
| P0 | 1 1 0 0 0 0 0 | 0/1 | 1 1 1 1 |
| P1 | 0 1 1 0 0 0 0 | 1 | 1 1 0 0 |
| P2 | 0 1 0 0 0 0 0 | 0/1 | 1 1 0 0 |
| P3 | 0 0 1 0 0 0 0 | 0/1 | 1 1 0 0 |
| P4 | 0 0 0 1 0 0 0 | 0/1 | 0 1 0 0 |
| P5 | 0 0 0 0 1 0 0 | 0/1 | 0 1 0 0 |
| P6 | 0 0 0 0 0 1 0 | 0/1 | 0 1 0 0 |
| P7 | 0 0 0 0 0 0 1 | 0/1 | 0 1 0 0 |

| TRANSFER PATTERN | TRANSFER CIRCUIT CONTROL SIGNAL ECi 0 1 2 3 4 5 6 7 |
|---|---|
| P0 | 1 0 0 0 0 0 0 0 |
| P1 | 0 1 0 0 0 0 0 0 |
| P2 | 0 0 1 0 0 0 0 0 |
| P3 | 0 0 0 1 0 0 0 0 |
| P4 | 0 0 0 0 1 0 0 0 |
| P5 | 0 0 0 0 0 1 0 0 |
| P6 | 0 0 0 0 0 0 1 0 |
| P7 | 0 0 0 0 0 0 0 1 |

FIG.17a

| BASIC TRANSFER PATTERN | ENABLE SIGNAL |
|---|---|
| P0 | i=0-3,j=0-3<br><br>LIOEi-j=1<br>MIOEi-j=1 |

FIG.17b

| BASIC TRANSFER PATTERN | ENABLE SIGNAL |
|---|---|
| P0 | i=0-3,j=0-1<br>LIOEi-j=1<br>MIOEi-j=1<br>i=0-3,j=2-3<br>LIOEi-j=0<br>MIOEi-j=0 |

FIG.17c

| BASIC TRANSFER PATTERN | ENABLE SIGNAL |
|---|---|
| P3 | i=0,1;j=0-3<br>LIOEi-j=1<br>MIOEi-j=0<br>i=2,3;j=0-3<br>LIOEi-j=0<br>MIOEi-j=1 |

FIG.17d

| BASIC TRANSFER PATTERN | ENABLE SIGNAL |
|---|---|
| P3 | i=0,1;j=0,3   i=0,1;j=1,2<br>LIOEi-j=0   LIOEi-j=0<br>MIOEi-j=0   MIOEi-j=1<br>i=2,3;j=0,3   i=2,3;j=1,2<br>MIOEi-j=0   LIOEi-j=1<br>MIOEi-j=0 |

FIG.18a ALLOTMENT OF DATA
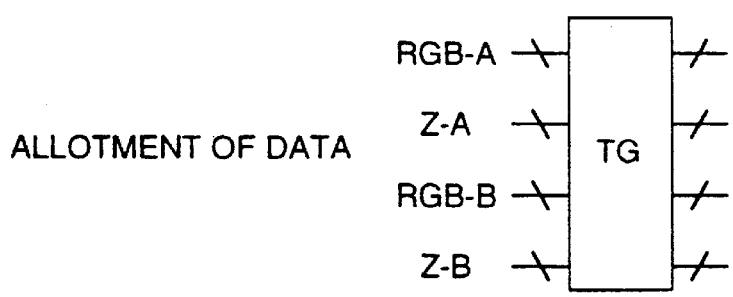
FIG.18b
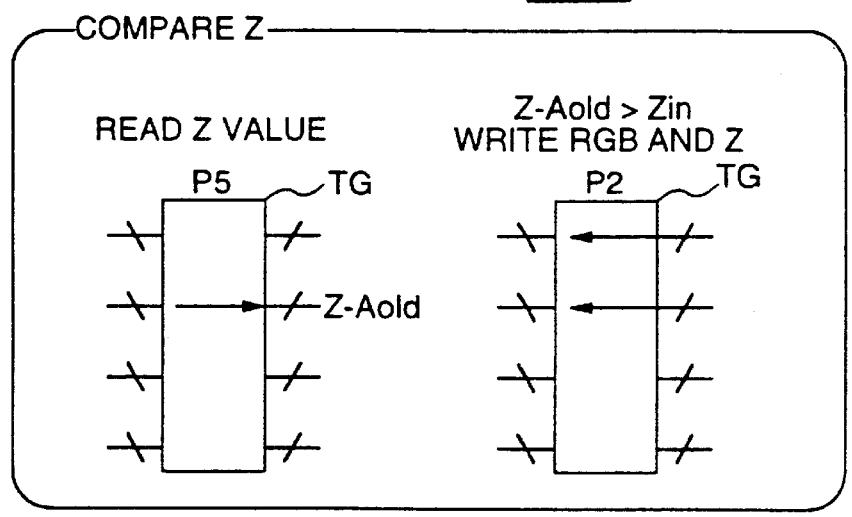
FIG.18c
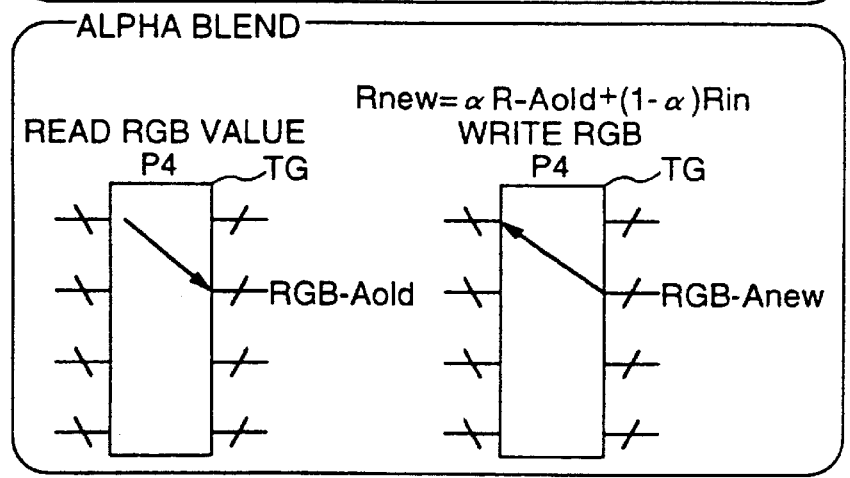
FIG.18d
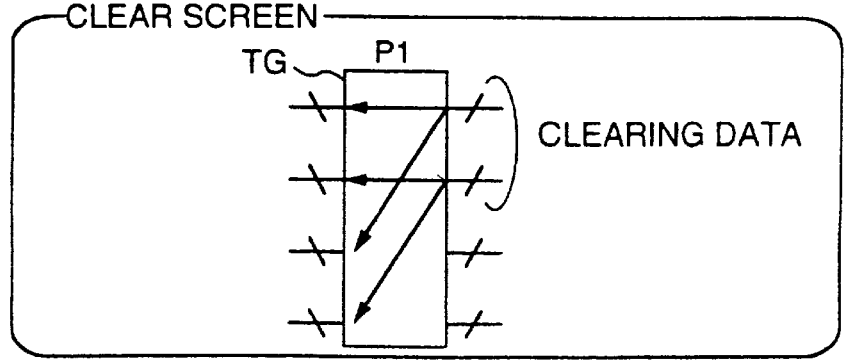

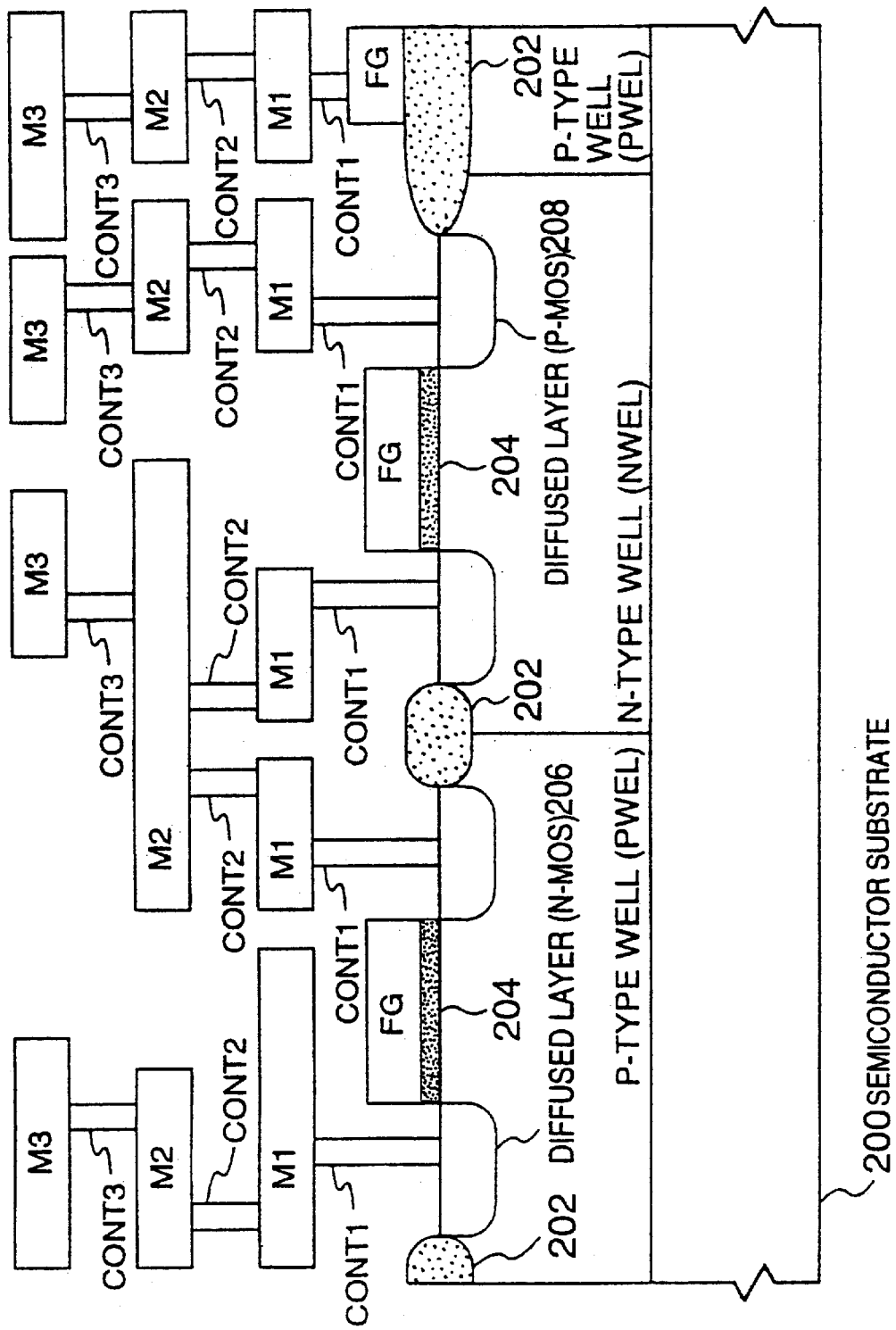

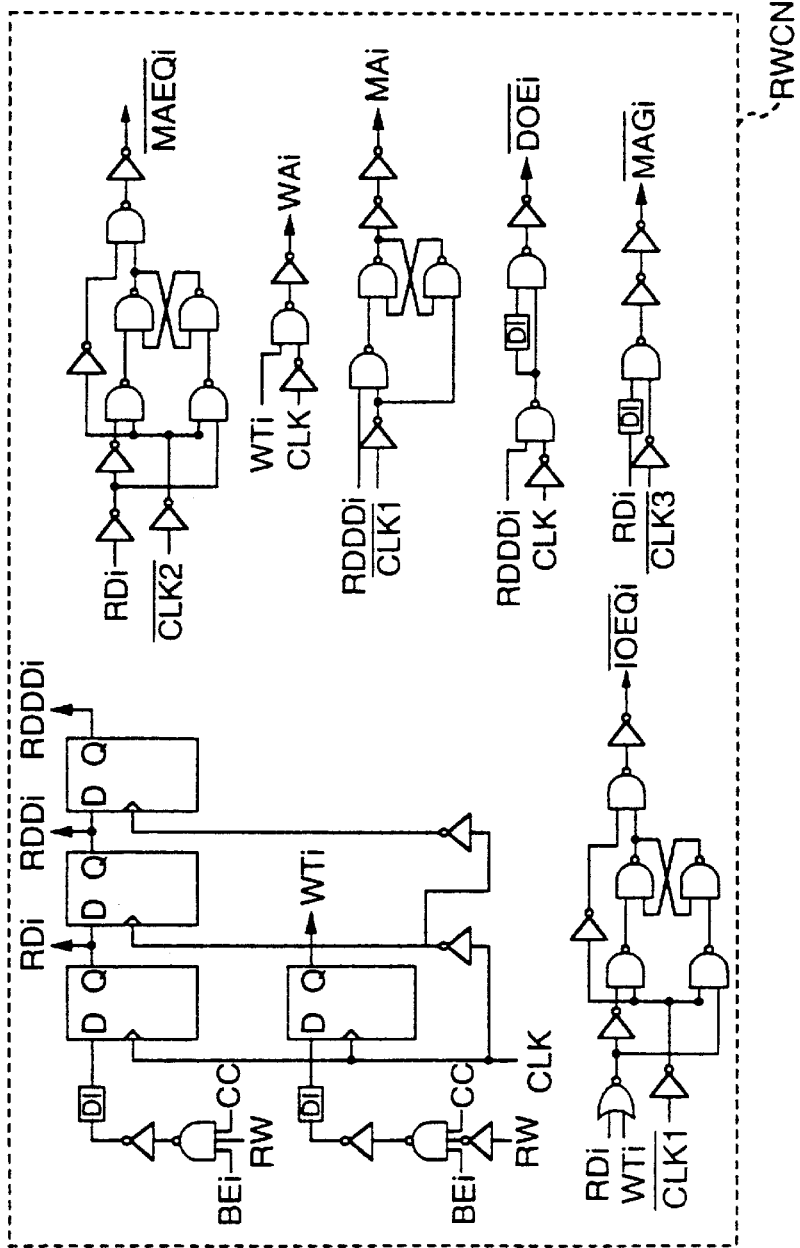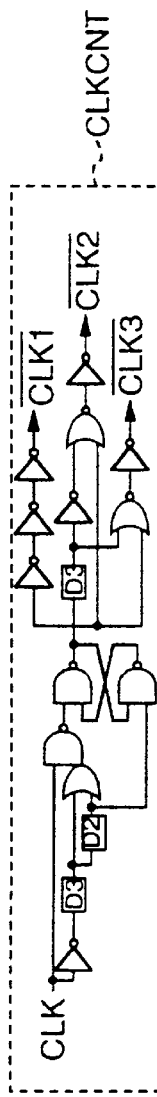

ROW COMMAND (com R)

| CLK | CR | BA | AX | AR | Command | |
|---|---|---|---|---|---|---|
| ↑ | 1 | 1 | V | V | BA | Bank active/Refresh |
| ↑ | 1 | 0 | X | V | BC | Bank closed |
| ↑ | 0 | X | X | X | NOP | No operation |

COLMN COMMAND (com R)

| CLK | CC | BE | RW | AY | AC | Command | |
|---|---|---|---|---|---|---|---|
| ↑ | 1 | 1 | 1 | V | V | RD | Read |
| ↑ | 1 | 1 | 0 | V | V | WT | Write |
| ↑ | 1 | 0 | X | X | X | NOP | |
| ↑ | 0 | X | X | X | X | | No operation |

FIG.48a

ROW OPERATION

| CR | BA | AX | AR | com. | BANK# | Present state | operation |
|----|----|----|----|------|-------|---------------|-----------|
| 1 | 1 | V | #i | BA | #i | Bank active | 1. Precharge<br>2. Sense (new AX)<br>→Bank active status |
|   |   |   |    |    | Other than #i | Bank active | No operation |
| 1 | 1 | V | #i | BA | #i | Bank closed | Sense (new AX)<br>→Bank active status |
|   |   |   |    |    | Other than #i | Bank closed | No operation |
| 1 | 0 | X | #i | BC | #i | Bank active/closed | Precharge<br>→Bank closed status |
|   |   |   |    |    | Other than #i | Bank active/closed | No operation |
| 1 | X | X | #i | BA<br>BC | #i | not-Bank-active or<br>not-Bank-closed | Inhibited |
|   |   |   |    |    | Other than #i | not-Bank-active or<br>not-Bank-closed | No operation |

FIG.48b

COLUMN OPERATION

| CC | BE | RW | AY | AC | com. | BANK# | Bank state | operation |
|----|----|----|----|----|------|-------|------------|-----------|
| 1 | 1 | 1 | V | #i | RD | #i | Bank active | Read |
|   |   |   |   |    |    | #i | not-Bank-active | Inhibited |
|   |   |   |   |    |    | Other than #i | All statuses | No operation |
| 1 | 1 | 0 | V | #i | WT | #i | Bank active | Write |
|   |   |   |   |    |    | #i | not-Bank-active | Inhibited |
|   |   |   |   |    |    | Other than #i | All statuses | No operation |
| 1 | 0 | X | X | X | NOP | All | All statuses | No operation |
| 1 | X | X | X | X | NOP | All | All statuses | No operation |

FIG.66a

| Item | Symbol | Min | Max | Unit | Remarks |
|---|---|---|---|---|---|
| AC CHARACTERISTICS | | | | (Ta = 0 to +70°C, VDD = 3.3V ± 0.3V, VSS = 0V) | |
| System clock cycle | tC | 15 | 10,000 | ns | 1 |
| CLK=1 pulse time | tCKH | 6 | | ns | 1 |
| CLK=0 pulse time | tCKL | 6 | | ns | 1 |
| Command set-up time | tCS | 3 | | ns | 1 |
| Command hold time | tCH | 1 | | ns | 1 |
| Data write time | tDW | 6 | | ns | 1 |
| write data hold time | tDH | 1 | | ns | 1 |
| Output turn-on time | tQD | | 3 | ns | 1 |
| Output turn-off time | tQH | | 4 | ns | 1 |
| Output hold time | tOH | 1 | | ns | 1 |
| Clock access time | tAC | | 10 | ns | 1,2 |
| Clock fall access time | tACF | | 4 | ns | 1,2 |
| Refresh time (Normal operation) | tREF | 16 | | ms | |
| Refresh time (Hold operation) | tREF2 | 64 | | ms | |

FIG.66b

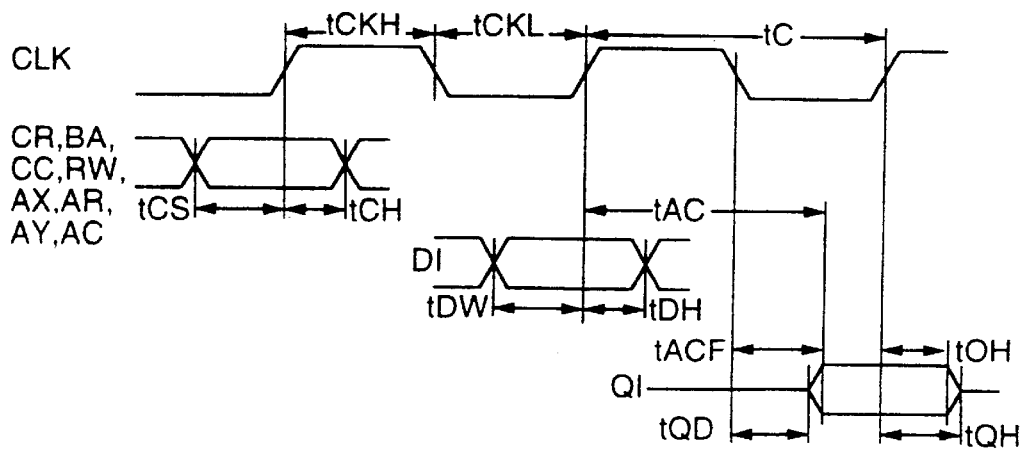

FIG.67a

OPERATING FREQUENCY MINIMUM LATENCIES

| Item | Symbol | Present status of bank | Numeric value |
|---|---|---|---|
| Row to Column command (Same bank operation) | LA | Bank active | ≥60ns/tC |
| Row to Column command (Same bank operation) | LA2 | Bank close | ≥30ns/tC |
| Column to Row command (Same bank operation) | LR | | 1 |
| BC to BA (Same bank operation) | LP | | ≥30ns/tC |
| Bank operation cycle (Same bank operation) | LC | | ≥90ns/tC |
| Row to Row command (separate bank operation) | LB | | 1 |
| Read to Read | LRR | Bank active | 1 |
| Read to Write | LRW | Bank active | 2 |
| Write to Read | LWR | Bank active | 1 |
| Write to Write | LWW | Bank active | 1 |

FIG.67b

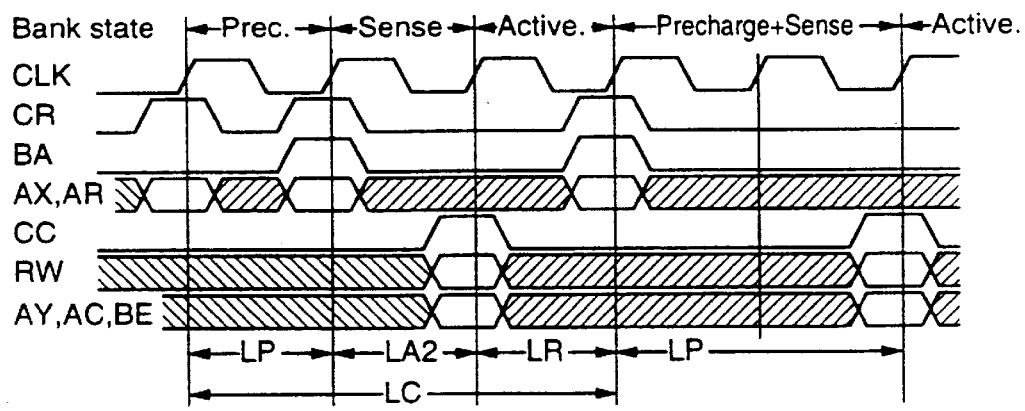

FIG.67c

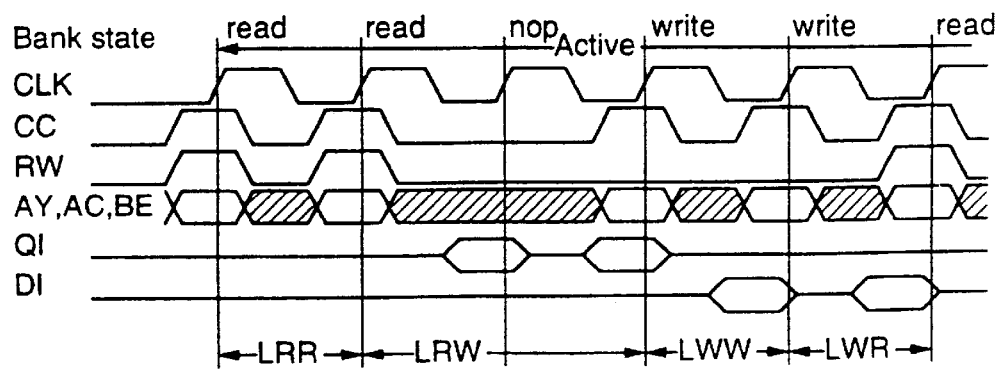

SEMICONDUCTOR IC DEVICE HAVING A MEMORY AND A LOGIC CIRCUIT IMPLEMENTED WITH A SINGLE CHIP

This is a continuation application of U.S. Ser. No. 09/413,641, filed Oct. 6, 1999, now U.S. Pat. No. 6,097,663, which is a divisional application of U.S. Ser. No. 09/188, 367, filed on Nov. 10, 1998, now U.S. Pat. No. 5,995,439, which is a continuation application of U.S. Ser. No. 08/813, 900, filed on Mar. 7, 1997, now U.S. Pat. No. 6,069,834.

BACKGROUND OF THE INVENTION

The present invention relates to a semiconductor IC (Integrated Circuit) device having a memory integrated therein, and more particularly to a technique having the effective application thereof to a semiconductor IC device in which a memory having a plurality of data transmission lines such as data input/output lines (I/O lines) and a logic circuit are integrated on the same semiconductor chip.

In recent years, the progress of LSI's (Large Scale Integrated circuits) to high integration has been made so that it is being possible to integrate a large-capacity memory and a large-scale logic circuit or operation circuit on a semiconductor chip of about 1 cm square. In such chips, a very high speed equal to or higher than 1 G byte/sec can be attained as the rate of data transfer between the memory and the logic circuit or operation circuit by making the number of I/O lines of the memory equal to or greater than several hundreds. Therefore, such chips are expected to, for example, the use thereof for image processing or the like in which high-speed data transfer for a memory is required.

A first prior art applicable to such a purpose of use includes, for example, DRAM (Dynamic Random Access Memory) macros disclosed by Toshio Sunaga, et al., "DRAM Macros for ASIC Chips", IEEE JOURNAL OF SOLID-STATE CIRCUIT, Vol. 30, No. 9, September 1995, pp. 1006–1014. This reference has disclosed an LSI chip which includes the combination of a logic and a DRAM macro of 288K-bit (32K×9 bits) capacity having 9 (nine) I/O lines fabricated by 0.8 $\mu$m CMOS technique, and an LSI chip which includes the combination of a logic and a DRAM macro of 1.25M-bit (64K×18 bits) capacity having 18 (eighteen) I/O lines fabricated by 0.5 $\mu$m CMOS technique.

As a second relevant prior art, U.S. Pat. No. 5,371,896 (issued Dec. 6, 1994) has showed a system in which a parallel computing system having many processors and memories coupled to each other is integrated on the same semiconductor chip. In this second prior art, a plurality of memories and a plurality of processors are integrated on the same semiconductor chip, and the memories and the processors are coupled by a network including crossbar switches. The second prior art is characterized in that an SIMD (Single Instruction Multi Data Stream) operation and an MIMD (Multi Instruction Multi Data Stream) operation can be performed in a changing-over manner, as required. At the time of SIMD operation, one of the plurality of memories is used as an instruction memory and the remaining memories are used as data memories. An instruction from the instruction memory is given to the processors in common with each other. At the time of MIMD operation, a part of the memories used as the data memories at the time of SIMD operation are used as instruction memories so that instructions from the separate instruction memories are given to the individual processors. Data transfer paths between the individual memories and the processors can be changed over to each other in various ways by the crossbar network.

SUMMARY OF THE INVENTION

Though various other semiconductor IC devices having memories integrated therein are devised in addition to the above-mentioned ones, it is being possible to integrate a high-integration memory such as DRAM (Dynamic Random Access Memory) and a logic circuit on the same semiconductor chip, as in the above-mentioned first prior art and attention is given to this technique in the fields of image processing and so forth.

The present inventors have revealed that such a semiconductor IC device involves two subjects.

A first subject concerns a design system. The conventional high-integration memories as discrete memories, especially DRAM's are standardized in specification and hence they have a relatively long widely-used service life as products if they are manufactured once. Therefore, no great importance is attached to a design system for making a prompt design. However, a semiconductor IC device having a high-integration memory such as DRAM and a logic circuit integrated on the same semiconductor chip as in the first prior art is needed, in many cases, for each specially fixed specification adapted to a specified application thereof. In general, therefore, a semiconductor maker will start in fabrication in compliance with a required specification after the acceptance of a requirement from a requester such as a user. Accordingly, the ability of prompt design is needed. In other words, the shortening of a time until the chip completion from the start of chip design (or time to customers) is required. In addition, a variety of different memory capacities or kinds of operation circuits are required in accordance with the purpose of use. In order to satisfy such requirements for the period and the variety, it is necessary to make a reform from the design system.

A second subject concerns a coupling circuit for coupling a high-integration memory such as DRAM and a logic circuit which are integrated on the same semiconductor chip. In the case where the high-integration memory such as DRAM and the logic circuit are integrated on the same semiconductor chip, the mere integration thereof is difficult to bring about a large merit as compared with a discrete chip. If the cost and the required performance are taken into consideration, it is desirable that a large-capacity memory and a large-scale logic circuit such as operation circuit are integrated on a semiconductor chip of about 1 cm square so that several-hundred or more coupling lines can be ensured between the memory and the logic circuit to attain a high data transfer rate which is equal to or higher than, for example, 1 G byte/sec. Namely, it is desired that a coupling circuit for coupling the memory and the logic circuit is a high-speed and high-integration coupling circuit with which a data transfer path between the memory and the logic circuit (or operation circuit) can be changed in various ways.

The first prior art can overcome the first subject to some degree since it is possible to make the memory capacity variable by increasing and decreasing the number of DRAM macros, as required. In the first prior art, however, the number of I/O lines changes in proportion to the number of DRAM macros. Therefore, the first prior art has a problem that it is not possible to set the number of I/O lines and the memory capacity freely. Also, all peripheral circuits necessary for read/write operation are provided in each of DRAM macros having a relatively small capacity. Therefore, the first prior art has another problem that the overhead of the circuits becomes large if a multiplicity of DRAM macros are arranged. In order to make these problems more clear, the investigation will now be made in conjunction with the case where an LSI for image processing is constructed. For simplicity, it is assumed that each DRAM macro has a storage capacity of 256K bits and 8 (eight) I/O lines and the total number of I/O lines required in the LSI is 512. Then, the required number of DRAM macros is 64. The total storage capacity of the memory in this case amounts to 16M bits.

In the case where two-dimensional data is to be processed in the field of image processing, for example, in the case where a blurred image is to be reconstructed or in the case where characters or specified patterns are to be recognized, a high-speed ability is required even when such a memory capacity as mentioned in the above is not needed. In this case, if only the speed is taken into consideration, a multiplicity of DRAM macros of the first prior art can be arranged so that they are operated in parallel. However, there results in that the storage capacity of the memory becomes too large, thereby increasing the chip size. On the other hand, in the case where three-dimensional data is to be processed, it is necessary to process a large amount of data at a high speed. It is possible to cope with this case by operating a multiplicity of DRAM macros in parallel, as mentioned above. However, there may be the case where a still greater number of I/O lines or a still larger storage capacity are required in accordance with a difference in the purpose of use such as domestic or industrial use or in accordance with the kind of data.

It is apparent from the foregoing that even in the same filed of image processing, various data transfer rates or various memory storage capacities are required in accordance with the purpose of use of a chip or the kind of data. Therefore, the mere preparation of DRAM macros with a fixed capacity as in the first prior art brings about various problems.

On the other hand, the second prior art concerns a coupling circuit for coupling memories and processors. In this second prior art, data transfer paths between the individual memories and the processors can be changed over to each other in various ways by crossbar switches. According to the second prior art, however, since the crossbar switches are used, a subject based on the above-mentioned second subject is caused. Namely, the second prior art has a subject that as the number of coupling lines is increased, the number of switches becomes enormous with an increase in scale of hardware and also an increase in delay. In the case where the data transfer paths between plural memories and plural processors independent of each other are changed over, as in the second prior art, a system used in the conventional parallel computer can be realized on the same chip, as it is, since the number of memories and processors is generally small. However, in the case where the correspondence between a group of several-hundred or more I/O lines of a memory and a group of I/O lines of a logic circuit such as operation circuit is changed over, the requirements for the degree of integration and the operating speed are severe and it is therefore difficult to use the conventional system, as it is.

Accordingly, one object of the present invention is to provide means for making a prompt design of a semiconductor device conformable to a required memory capacity or the kind of a required operation circuit. Namely, the object of the present invention is to provide a system for designing LSI chips conformable to various purposes in a short period of time and to provide a group of products based on that design system.

Another object of the present invention is to realize a memory macro which has a storage capacity capable of being made freely variable in a range from a small capacity to a large capacity and has a reduced overhead.

A further object of the present invention is to realize a memory macro which is suitable for ASIC (Application Specific Integrated Circuit) design.

A furthermore object of the present invention is to provide means for realizing, as a coupling circuit between a memory and a logic circuit, a high-speed and high-integration coupling circuit with which a data transfer path between the memory and the logic circuit (or operation circuit) can be changed in various ways.

The above and other subjects and novel features of the present invention will become apparent from the following description of the present specification and the accompanying drawings.

The term of memory core or memory macro means a circuit block including a memory cell array inclusive of a multiplicity of memory cells for storing information therein and a peripheral circuit for performing the reading and writing of data for the memory cell array. Though both the term of memory core and the term of memory macro are used in the present specification, they mean the same.

According to one aspect of the present invention, layout patterns of memory cores (MR) and a coupling circuit (TG) module set in compliance with the pitch of data transmission lines or I/O lines (MIOi) of each memory core (MR) are produced beforehand and are stored in a data base (DB). A logic library (LL) for composing a logic circuit is also produced and is stored in the data base (DB). Data such as those layout patterns, the specifications, characteristics and so forth necessary for design is stored in the data base (DB). The coupling circuit (TG) module is composed of a switch group (SWG) and a buffer group (TGBUFi) the combination of which can form a coupling circuit (TG). The switch group (SWG) is constructed by a plurality of switch groups (SWG) so that the order of inputted data can be replaced therein. With the setting of such plural switch groups (SWG), the switching control of a reduced number of stages of switches (SW) to provide a desired transfer pattern conformable to a transfer pattern (or transfer path) becomes possible, thereby enabling the high-speed change-over of transfer patterns. Since the coupling circuit (TG) module is constructed in conformity with the pitch of data transmission lines (MIOi) of the memory core (MR), as mentioned above, the coupling circuit (TG) module can be coupled to the data transmission lines (MIOi) of the memory core (MR), as it is, without requiring a change in layout pattern.

As mentioned above, the layout patterns of the memory cores (MR), the coupling circuit (TG) modules and the logic library (LL) are registered in the data base (DB) beforehand. Also, the pitch of wirings of the memory core (MR) and the pitch of wirings of the coupling circuit (TG) module are made even (or conformed to each other). Therefore, it is possible to use the memory module (MR) and the coupling circuit (TG) module so that they are coupled, as they are. Accordingly, the design of an LSI chip after a specification to be attained (for example, a specification from a user) has been definitely shown can be completed in a short period of time. Namely, this can be achieved in such a manner that a memory core (MR) having a required storage capacity and a module for producing a transfer circuit (TG) conformable to the specification are taken out of the data base (DB) and they are combined. Regarding a logic portion, a desired logic circuit (LC) can be composed from the logic library (LL) by use of a CAD (Computer Aided Design) tool for logic composition. The wiring between the memory core (MR) and the logic circuit (LC) can be performed by use of an arrangement/wiring CAD tool. Accordingly, a chip having a memory and a logic circuit integrated thereon can be designed in a short period of time.

In the coupling circuit (TG), data transferred between the memory core (MR) and the logic circuit (LC) passes through only an activated switch group (SWG). Therefore, high-speed data transfer can be realized. Further, since the number of stages of switch groups (SWG) is increased and decreased in accordance with the number of transfer patterns, there is no useless occupation area in the case where the number of transfer patterns is small.

In order to construct memories having various storage capacities in a short period of time, a memory macro (MMACRO) is constructed by the combination of functional modules such as an amplifier (AMP), a bank (BANK) inclusive of a memory cell array and a power supply (PS). Namely, there is provided a construction in which a multiplicity of data transmission lines (GBL,/GBL) extending in a bit line direction are arranged in the bank (BANK) module inclusive of the memory cell array and the data transmission lines are connected by merely arranging the modules so that they are adjacent to each other. Further, a circuit capable of activating and inactivating the data transmission lines in units of one byte is provided in the amplifier (AMP) module.

In a memory (MMACRO) having a plurality of banks (BANK), there are provided a plurality of addresses (Ri, Ci) which designate each bank. Thereby, it becomes possible to input an activation command (CR, AC, Ri) for one bank and a read or write command (CC, RW, Ci) for another bank in the same cycle so that the reading or writing over different banks can be performed in consecutive cycles.

BRIEF DESCRIPTION OF THE DRAWINGS

FIGS. 17a to 17d are diagrams showing the examples of a transfer pattern which is enabled by a transfer circuit shown in FIG. 16;

FIGS. 18a to 18d are diagrams showing examples of the application to three-dimensional computer graphics;

FIG. 20 shows the cross section of a semiconductor chip while illustrating a relationship between laid-out layers;

FIGS. 36a and 36b are diagrams showing an example of a read/write control circuit of the memory macro;

FIGS. 48a and 48b are diagrams showing the truth tables of functions of the DRAM module;

FIGS. 66a and 66b are diagrams showing the AC characteristics of the DRAM module; and FIGS. 67a to 67c are diagrams showing the operating frequency minimum latencies of the DRAM module.

DESCRIPTION OF THE PREFERRED EMBODIMENTS

In the following, the present invention will be described first in conjunction with embodiments of an overall designing method and a transfer circuit TG which is a coupling circuit for coupling a memory core MR and a logic circuit LC and thereafter in conjunction with embodiments of a memory macro MMACRO which is a specific example of the memory core MR.

[Method of Designing System LSI Using Memory Core]

Figure 1:
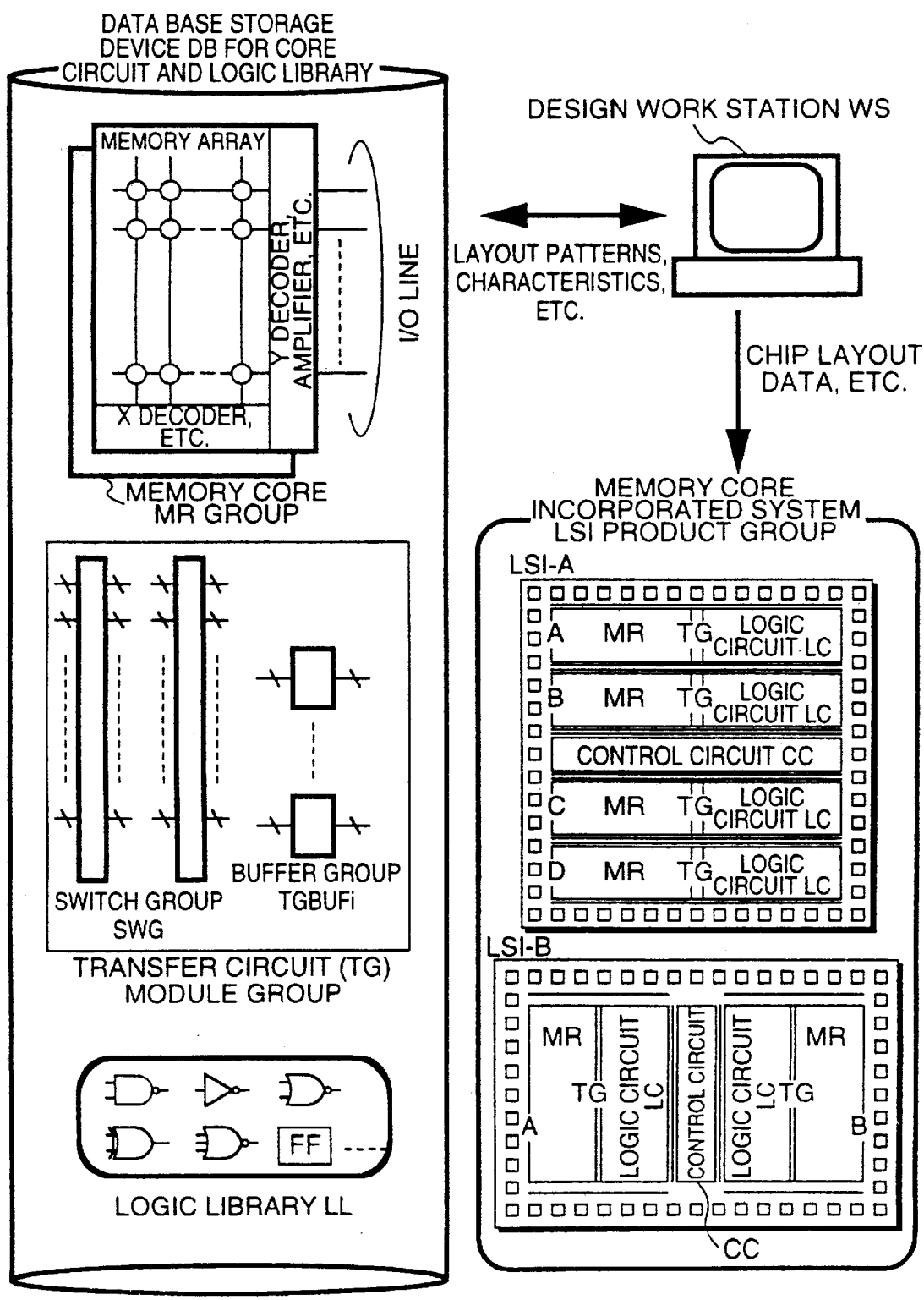
FIG. 1 is a diagram showing a multi-I/O memory core incorporated system LSI designing method according to an embodiment of the present invention.

FIG. 1 illustrates the concept of a memory core incorporated system LSI designing method according to the present invention.

The left-hand portion of FIG. 1 shows a storage device DB for data base in which the layout patterns and characteristics of a core circuit and a logic library are registered. The data base storage device DB is stored beforehand with data necessary for design including the layout patterns, specifications and characteristics of a plurality of memory cores MR which have different storage capacities and each of which has a multiplicity of data transmission lines, a group of modules for transfer circuit (or coupling circuit) TG which are set in conformity with the pitch of data transmission lines (or I/O lines) of the memory cores MR, respectively, and a logic library LL which includes basic gates for composing a logic circuit LC.

The transfer circuit TG module is composed of a switch group SWG and a buffer group TGBUFi. The switch group SWG and the buffer group TGBUFi can be combined so as to compose a transfer circuit TG. Though the details will be mentioned later on, a transfer circuit TG having various transfer patterns can be composed by connecting a plurality of switch groups SWG. Since the transfer circuit TG module is produced in conformity with the pitch of data transmission lines (or I/O lines) of the memory core MR, the transfer circuit TG module can be coupled to the data transmission lines (or I/O line) of the memory core MR, as it is, without requiring a change in layout pattern.

When the specification of an LSI chip is given, the design is made while necessary data is transferred from the data base storage device DB to a work station WS for design. Since the pitch of wirings of the memory core MR and the pitch of wirings of the transfer circuit TG module are made even (or conformed to each other), it is possible to use the memory core MR and the transfer circuit TG module so that they are coupled, as they are. Namely, this can be achieved in such a manner that a memory core MR having a required storage capacity and a module for producing a transfer circuit TG conformable to the specification are taken out of the data base DB and they are combined. Regarding a logic portion, a desired logic circuit LC can be easily composed from the logic library LL by use of a CAD tool for logic composition. Finally, the memory core MR and the logic circuit LC are arranged in accordance with a floor plan of the chip and the wiring therebetween is performed by use of an arrangement/wiring CAD tool, thereby completing layout data of the chip. Thus, a group of system LSI products having memory cores incorporated therein can be designed in a short period of time.

In the shown example, the logic is composed using the logic library LL. However, if circumstances require, a part of the chip may be configured into a gate array to compose a logic. In this case, there is a merit that the fabrication of a chip having a common memory core MR and different logics is facilitated.

Two examples of a chip obtained by the above-mentioned design are shown in the right-hand lower portion of FIG. 1. A semiconductor chip LSI-A is such that four blocks A, B, C and D each having a transfer circuit TG arranged between a memory core MR arranged on the left side of the figure and a logic circuit LC arranged on the right side of the figure to couple the memory core MR and the logic circuit LC by the transfer circuit TG are provided so that a control circuit CC for controlling the whole of the chip is arranged at the center of the chip. On the other hand, a semiconductor chip LSI-B is such that two blocks A and B each having a memory core MR and a logic circuit LC coupled by a transfer circuit TG are provided so that a control circuit CC for controlling the whole of the chip is arranged at the center of the chip.

In the present embodiment, a chip having a plurality of blocks integrated thereon, as shown by way of example in FIG. 1, can be easily designed though it is of course that a chip using one memory core MR can also be realized. In this case, the memory cores MR or logic circuits LC in the respective blocks may be different or they may be the same. The former is suitable for the case where different processings are performed in parallel on the same chip. On the other hand, the latter is suitable for the case where the identical processings are performed in parallel. In particular, the latter is suitable for the case where a processing (such as graphics, nature image processing, neutral network or the like), in which a parallel operation is possible, is performed.

In both the semiconductor chips LSI-A and LSI-B, the logic circuit LC making the transfer of data for the memory core MR is arranged in proximity to the memory core MR. Therefore, the influence of a delay caused by wirings is reduced so that high-speed data transfer can be realized. Also, since the distances from the control circuit CC to the respective blocks are equal to each other in the case of the semiconductor chip LSI-B and have a small difference therebetween even in the case of the semiconductor chip LSI-A, there is a merit that the skew of a control signal can be made small.

In the semiconductor chip LSI-B, the logic circuit LC is arranged in proximity to the control circuit CC. However, in the case where it is necessary to shorten the wiring of a control signal for the memory core MR in order to reduce a delay caused by wirings, the block may be inverted with respect to the control circuit CC so that the memory core MR is arranged in proximity to the control circuit CC.

In the semiconductor chip LSI-A, there may be considered the case where the difference in the distance from the control circuit CC between the blocks A and B or the blocks D and C causes a problem. In such a case, an arrangement as in the semiconductor chip LSI-B can be employed, that is, two blocks can be arranged on each of the right and left sides of the control circuit CC.

The above arrangement may involve the case where a difference between the shorter and longer sides of the chip becomes too large when the block has a laterally elongated configuration. In such a case, there can be employed a construction in which the arrangement in the semiconductor chip LSI-A shown in FIG. 1 is kept but the input terminals of control signals are concentrated on one of opposite faces of each block with the blocks A and B (and the blocks D and C) being arranged in an inverted relation so that the input terminals of control signals are placed on the faces at which the blocks adjoin. Thereby, it is possible to reduce the skew of the control signal. In the following, detailed explanation will be made of the transfer circuit TG shown in FIG. 1.

Multi-I/O Memory Core Incorporated LSI

Figure 2:
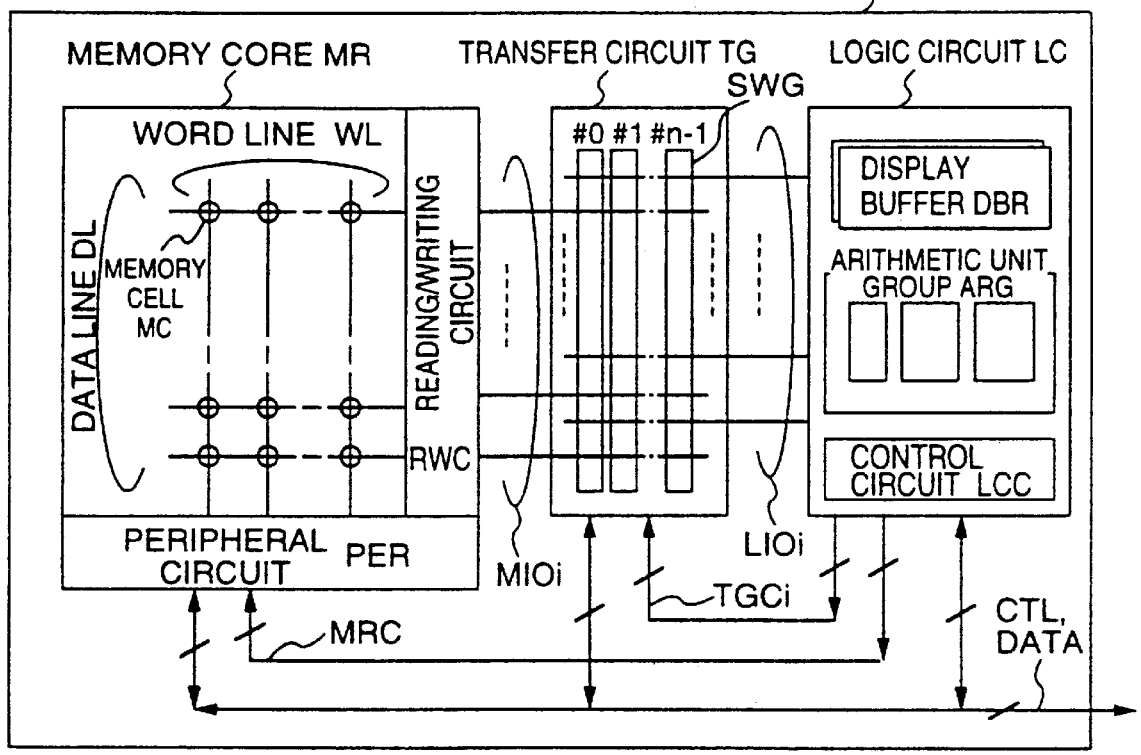
FIG. 2 is a diagram showing a multi-I/O memory core incorporated LSI according to an embodiment of the present invention.

FIG. 2 shows an example of a multi-I/O memory incorporated LSI according to the present invention. A semiconductor chip SIC shown in FIG. 2 includes a memory core MR having a plurality of I/O lines MIOi, a logic circuit LC having a plurality of I/O lines LIOi, a transfer circuit TG for controlling a data transfer pattern between the memory core MR and the logic circuit LC, and so forth. These components are integrated on a single semiconductor substrate made of monocrystalline silicon or the like.

The contents of the logic circuit LC may be composed in accordance with the purpose by use of the logic library LL. Herein, there is shown an example which is suitable for an image or graphics. It is assumed that the memory core MR stores pixel data. The logic circuit LC is composed of an arithmetic unit group ARG for performing an operation for the pixel data stored in the memory core MR, a display buffer DBR for reading the contents of the memory core MR at a fixed speed to display them on a display screen, and a control circuit LCC for controlling the arithmetic unit group ARG, the display buffer DBR and the memory core MR.

The memory core MR has a plurality of data lines DL, a plurality of word lines WL, and memory cells MC formed at the points of intersection thereof. The memory cell MC can use a DRAM cell which includes one transistor and one capacitor, a SRAM (Static Random Access Memory) cell which includes four or six transistors, a non-volatile flash memory cell which includes one transistor, or the like. Though the memory core MR considered therein is of a RAM type or a read/write type in which the writing and reading are possible, as mentioned above, the present invention is effective even for the case where a read only type or so-called ROM type is used. The writing/reading of data for the memory more MR is controlled by a reading/writing circuit RWC so that the reading/writing of data for a plurality of memory cells MC selected by a peripheral circuit PER can be performed in parallel from a plurality of I/O lines MIOi. Buses for a memory core control signal MRC, a control signal CTL, an address signal DATA and so forth from the logic circuit LC are connected to the peripheral circuit PER. The memory core MR is inputted and/or outputted with a control signal, an address signal and an I/O signal in synchronism with a clock signal which is a reference signal of the logic circuit LC.

The logic circuit LC performs an operation for data read from the memory core MR through the transfer circuit TG or data inputted from the exterior of the semiconductor chip SIC. The result of operation is written into the memory core MR through the transfer circuit TG again or is outputted to the exterior of the semiconductor chip SIC.

The transfer circuit TG is composed of plural stages of switch groups SWG. A connection relationship (hereinafter referred to as transfer pattern) between the plurality of I/O lines MIOi of the memory core MR and the plurality of I/O lines LIOi of the logic circuit LC can be changed through a switching control of the switch groups SWG by a control signal TGCi.

The transfer circuit TG has a construction in which bi-directional or double-directional data transfer is possible, that is, a construction in which a data signal from the memory core MR can be supplied to the logic circuit LC and, in contrast with this, a data signal from the logic circuit LC can be supplied to the memory core MR.

Figure 3:
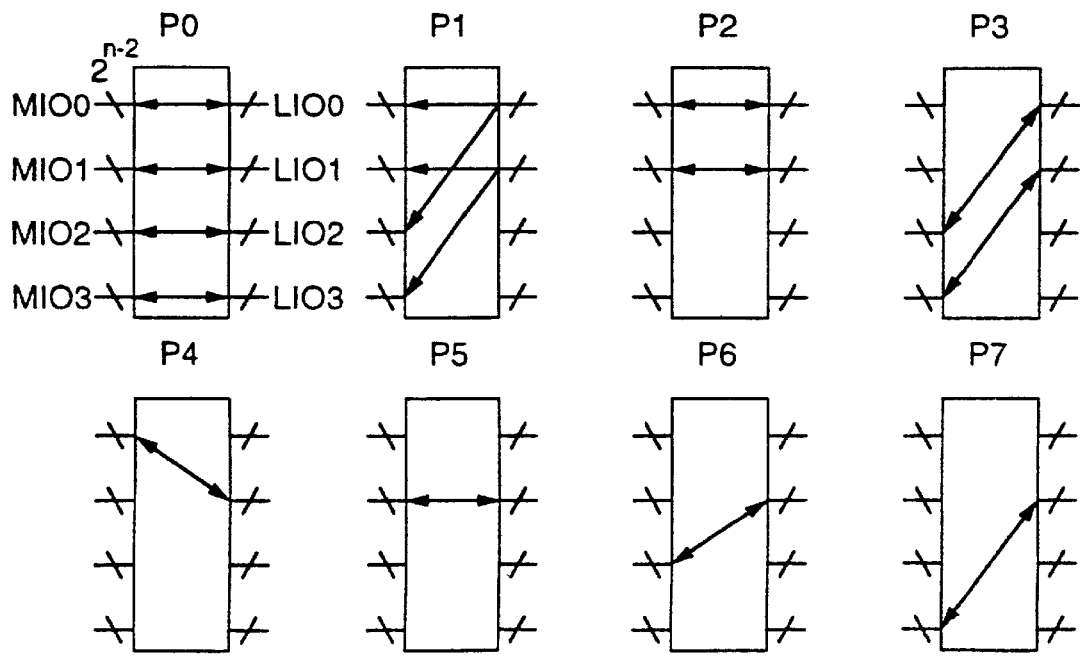
FIG. 3 is a diagram showing transfer patterns of a transfer circuit shown in FIG. 2.

FIG. 3 shows the case where eight patterns of P0 to P7 are realized as the examples of a transfer pattern. The shown example is such that for $2^n$ I/O lines MIOi and LIOi, the correspondence between MIO0, 1, 2 and 3 and LIO0, 1, 2 and 3 in units of a fourth (or $2^{n-2}$) thereof is changed. That is, the shown example corresponds to the case where i is from 0 to 3. Thus, it is not necessary that the unit of transfer is $2^n$ lines. Also, it is of course that the present invention is applicable even if all the units of transfer are not equal. In FIG. 3, the direction of an arrow shows the flow of data. The transfer pattern P1 is used for only the writing of data into the memory and the remaining patterns (P0, P2–P7) are used for both the reading and the writing.

The transfer pattern P0 is a pattern by which data is transferred, as it is, without being interchanged. The transfer pattern P1 is a pattern by which data inputted to (LIO0, 1) is transferred to (MIO0, 1) and (MIO2, 3) and is then written into the memory. In the case of this pattern P1, different I/O lines of the memory core MR are turned on unlike the cases of the other patterns. Namely, the I/O line LIO0 is coupled to the I/O lines MIO0 and MIO2 and the I/O line LIO1 is coupled to the I/O lines MIO1 and MIO3. Accordingly, there is the case where different data collide with each other at the time of reading. Therefore, this pattern P1 is used only at the time of writing. This pattern is effective for the initialization of the contents of the memory at a high speed and so forth, as will be mentioned later on.

The transfer patterns P2 and P3 form transfer paths between (LIO0, 1) and (MIO0, 1) and between (LIO0, 1) and (MIO2, 3), respectively. The transfer patterns P4, P5, P6 and P7 form transfer paths between (LIO1) and (MIO0), between (LIO1) and (MIO1), between (LIO1) and (MIO2) and between (LIO1) and (MIO3), respectively.

The eight transfer patterns (P0–P7) can be freely changed over to each other by the control signal TGCi. Each transfer pattern can be realized by turning on one switch group SWG in the transfer circuit TG. For example, the transfer pattern P0 can be realized by the turn-on of a switch group SWG#0 shown in FIG. 2. A specific construction of the transfer circuit TG will be mentioned later on.

In the present embodiment, the memory core MR, the transfer circuit TG and the logic circuit LC are formed on the same semiconductor chip. Therefore, it is possible to perform the wiring of several-ten to several-hundred I/O lines easily.

Next, the operation of the multi-I/O memory core incorporated LSI shown in FIG. 2 will be explained.

First, a read operation will be explained. When one word line WL is selected by the peripheral circuit PER in the memory core MR, data from a group of memory cells MC on the selected word line WL is read to the data lines DL and the data is read in parallel to a plurality of I/O lines MIOi through the reading/writing circuit RWC. When one of switch groups SWG in the transfer circuit TG is activated by a control signal TGCi, a transfer pattern between a plurality of I/O lines MIOi of the memory core MR and a plurality of I/O lines LIOi of the logic circuit LC is determined so that the data is transferred from the I/O lines MIOi to the I/O lines LIOi and is then inputted to the logic circuit LC.

A write operation is the same as the read operation except that the flow of data is reversed. Namely, data outputted from the logic circuit LC to a plurality of I/O lines LIOi is transferred from the I/O lines LIOi to I/O lines MIOi in accordance with a transfer pattern determined by a control signal TGCi and is transmitted to the data lines DL through the reading/writing circuit RWC in the memory array MR. Further, the data is written in parallel into memory cells MC on a selected word line WL.

In performing the reading or the writing continuously or performing the reading and the writing alternately, the operation can be performed while a word line WL and a transfer pattern to be selected are changed for each cycle. Accordingly, it is possible to perform the parallel reading or writing for memory cells MC corresponding to different addresses for each cycle in accordance with a request from the logic circuit LC.

According to the present embodiment, the transfer of data between the memory core MR and the logic circuit LC is made through one stage of switch group SWG. Therefore, it is possible to realize the data transfer at a very high speed. Also, the memory core MR and the logic circuit are arranged so that the I/O lines MIOi and the I/O lines LIOi run in the same direction. Therefore, it is possible to arrange the transfer circuit TG between the memory core MR and the logic circuit LC. The number of stages of switch groups SWG in the transfer circuit TG is determined in accordance with transfer patterns. Therefore, in the case where the number of transfer patterns is small, it is possible to make the dimension of the transfer circuit in a data line direction (or in a lateral direction in FIG. 2) small. Accordingly, if the transfer circuit TG and the logic circuit LC are laid out so that they fall within the dimension of the memory core MR in a word line WL direction (or in a longitudinal direction in FIG. 2), it is possible to make the area of the whole without taking up an excess area.

The peripheral circuit PER may include only an X decoder for selecting a word line WL as mentioned above or may further include a Y decoder for selecting a part of data lines to connect them to I/O lines MIOi. According to the present embodiment, a multiplicity of I/O lines MIOi can be provided. Usually, therefore, the Y decoder may be provided with a simple construction which is capable of selecting, for example, 128 ones of 1024 data lines.

First Specific Example of Transfer Circuit

Figure 4:
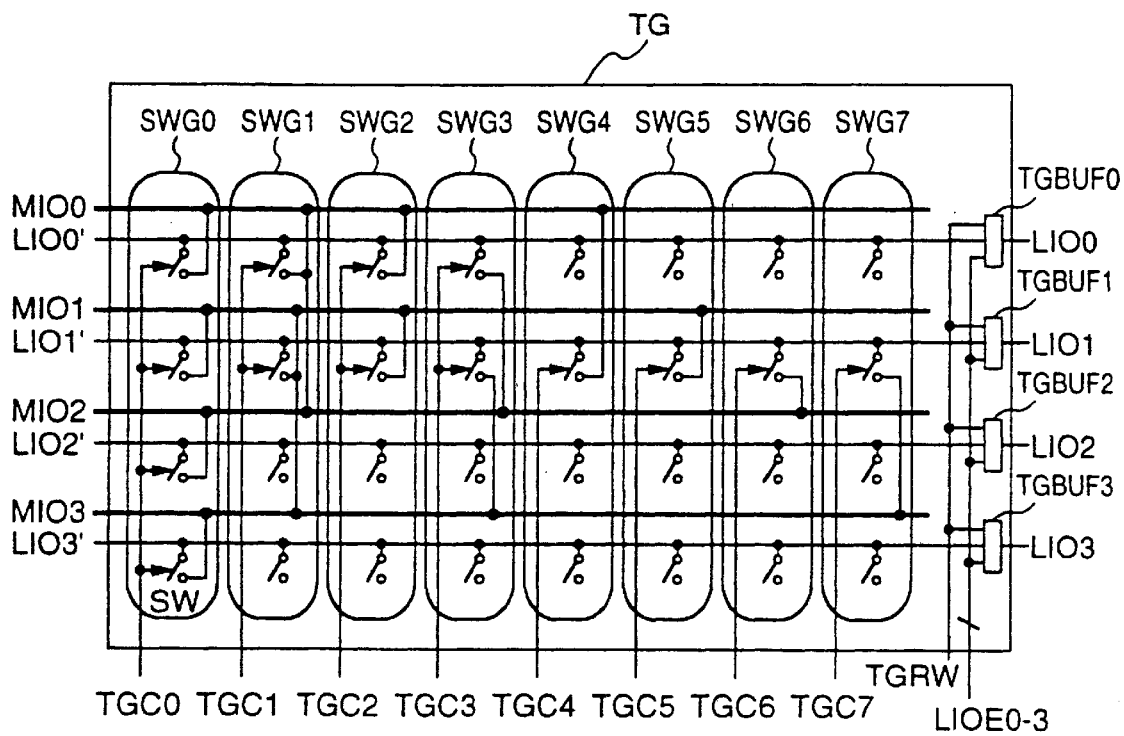
FIG. 4 is a diagram showing a first specific example of a transfer circuit for realizing the transfer patterns shown in FIG. 3.

Next, a specific circuit example of the transfer circuit TG will be explained using FIG. 4. FIG. 4 shows an embodiment of the transfer circuit TG for realizing the transfer patterns shown in FIG. 2.

In FIG. 4, reference symbols MIO0, MIO1, MIO2 and MIO3 denote the I/O lines of the memory core MR, and symbols LIO0, LIO1, LIO2 and LIO3 denote the I/O lines of the logic circuit LC. Also, symbols SWG0, SWG1, --- and SWG7 denote switch groups, and symbols TGBUF0, TGBUF1, TGBUF2 and TGBUF3 denote buffer circuits.

Symbols TGC0, TGC1, --- and TGC7 denote switch control signals for making the turn-on/off of the switch groups SWG0, SWG1, --- and SWG7, respectively. Switches SW in the switch group SWG are constructed by transistors as exemplified in FIGS. 9a to 9c which will be explained in detail later on. A relationship between the switching condition of each switch SW and the level of the switch control signal TGCi can be determined in accordance with the configuration of a circuit forming the switch SW. Therefore, it is not necessary to regard this relationship as being fixed. However, it is herein assumed that a switch SW is turned on if a control signal TGCi applied to a control input of the switch SW takes a high potential and the switch SW is turned off if the control signal takes a low potential. According to this, it is assumed that for example, if the control signal TGC3 takes a high potential and each of the other control signals takes a low potential, two switches SW in the switch group SWG3 indicated by arrow are turned on and the other switches SW in the same switch group SWG3 and switches SW in the other switch groups are turned off. Therefore, when only the control signal TGC3 takes a high potential, the transfer pattern P3 shown in FIG. 3 is formed so that a transfer path is formed between the I/O lines MIO2 and MIO3 of the memory core MR and the I/O lines LIO0 and LIO1 of the logic circuit LC. Similarly, the other transfer pattern can also be realized by making one of the control signals TGCi take a high potential.

Figure 5:
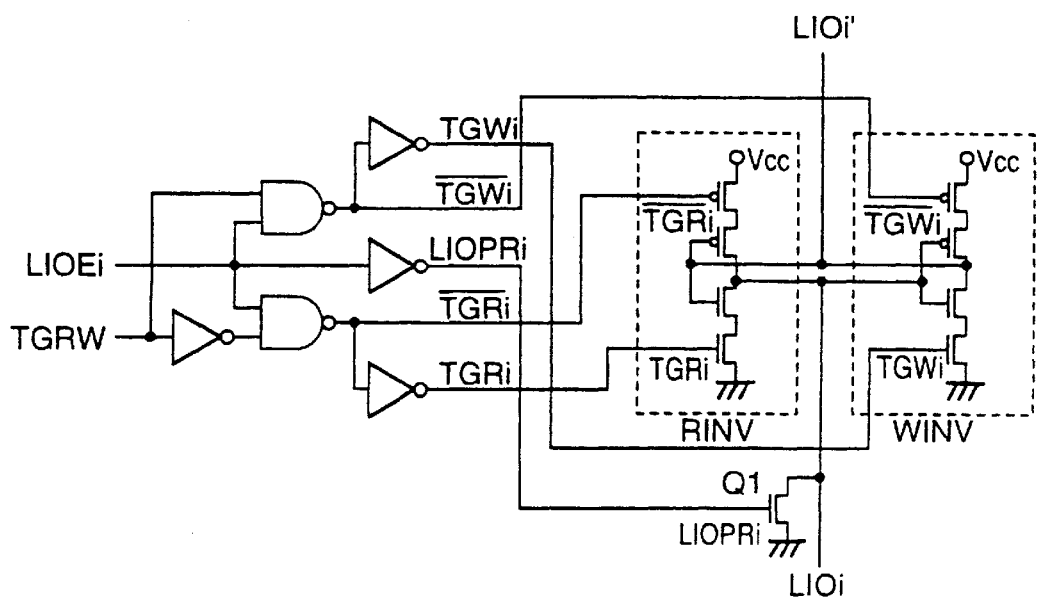
FIG. 5 is a diagram showing a specific example of a buffer circuit TGBUFi of the transfer circuit.

The buffer circuits TGBUF0, TGBUF1, TGBUF2 and TGBUF3 have the function of preventing signals from being delayed due to parasitic capacitances which exist on the I/O lines MIOi and the I/O lines LIOi. An example of the construction of the buffer circuit TGBUFi is shown in FIG. 5. Thus, the construction and operation of the buffer circuit TGCi will now be explained using FIG. 5.

The buffer circuit TGBUFi is a bidirectional buffer for changing over the flow of data in accordance with the read/write operation for the memory core MR as well as a circuit having a function of latching the potential of an I/O line LIOi of the logic circuit LC which is not used when a transfer pattern is formed.

In the above-explained examples shown in FIG. 3, each of the transfer patterns excepting the transfer pattern P0 does not use a part of the I/O lines LIOi of the logic circuit LC. If the potential of the unused I/O line LIOi is not determinative or assumes a so-called floating condition, there is a possibility that it takes an intermediate potential due to the leakage of charges. In that case, an excess current such as a through current will steadily flow through a CMOS (Complement Metal Oxide Semiconductor) transistor (not shown) on the logic circuit LC side which receives the intermediate floating potential of the unused I/O line LIOi. In order to avoid this, an unused one of the I/O lines LIOi of the logic circuit LC is forced or clamped into a predetermined potential.

Namely, the logic circuit LC receives an enable signal LIOEi (see FIG. 5) and the operation of the circuit is controlled by the enable signal LIOEi.

With the circuit construction shown in FIG. 5, for example, when an enable signal LIOEi as a control input of the buffer circuit TGBUFi assumes a low potential, it is apparent from the logic construction shown in FIG. 5 that signals TGWi and TGRi take low levels and signals $\overline{\text{TGWi}}$ and $\overline{\text{TGRi}}$ take high levels so that clocked inverter circuits RINV and WINV are turned off. At this time, a signal LIOPRi takes a high level so that a MOS transistor Q1 receiving the signal LIOPRi at its gate is turned on, thereby clamping an I/O line LIOi into a low level.

For an I/O line LIOi to be used, on the other hand, the enable signal LIOEi assumes a high potential. The changeover of the data direction is performed as follows.

Namely, when the memory core MR is in a read operation, a signal TGRW assumes a low potential. In this case, when the enable signal LIOEi assumes the high potential, only the clocked inverter RINV for reading is activated so that data is transferred from an I/O line LIOi' to an I/O line LIOi. On the other hand, when the memory core MR is in a write operation, the signal TGRW assumes a high potential. In this case, when the enable signal LIOEi assumes the high potential, only the clocked inverter WINV for writing is activated so that data is transferred from the I/O line LIOi to the I/O line LIOi' and is then transferred through the switch SW to the I/O line MIOi of the memory core MR.

With the use of the embodiment shown in FIGS. 4 and 5 as explained above, a high-speed operation can be realized since the number of stages of switches SW through which data to be transferred pass is 1. Also, since the number of stages of switches SW is equal to the number of transfer patterns, an useless layout area is not necessary and high integration is possible. Further, since a buffer circuit TGBUFi of an unused one of the I/O lines LIOi of the logic circuit LC is stopped and the potential of the unused I/O line is prevented from taking a floating condition, wasteful power consumption is eliminated and it is possible to prevent an excess current from flowing to the gate of the logic circuit LC. Accordingly, it is possible to freely set a transfer pattern which does not use a part of the I/O lines.

In FIG. 4, the switch group SWG includes switches SW to which no control signal TGCi is not inputted, that is, switches SW which are not necessary as far as the circuit operation is concerned. This is based on the following reasons.

Namely, as shown in FIG. 4, the switch groups SWG forming the transfer circuit TG have a common configuration, irrespective of the transfer patterns, except wirings and contacts necessary for the connection between the switches SW and the control signals TGCi corresponding thereto and the connection between the switches SW and the I/O lines MIOi. Accordingly, if the common portion excepting the wirings and contacts necessary for the connection between the switches SW and the control signals TGCi and the connection between the switches SW and the I/O lines MIOi is prepared as a layout library beforehand, the layout design of a chip is facilitated. This is one reason why unnecessary switches SW are provided. Also, even in the case where the change of a transfer pattern is needed so that a new switch is required in accordance with the change of the transfer pattern, a need to newly add transistors corresponding to that switch into a library is eliminated if all switches SW in the switch group SWG are prepared as a library beforehand. This is another reason why unnecessary switches SW are provided. At this time, since there are no transistors to be newly added, it becomes unnecessary to modify photolitho-graphic masks for semiconductor IC fabrication for additional transistors. Therefore, it is possible to reduce the number of masks to be modified. Especially, in the case of a memory/logic mixed chip as in the present invention, it should be considered that there may be a need to change the capacity of the memory or the construction of the logic in accordance with the purpose of use. If several kinds of memory cores MR and basic patterns of the switch groups SWG for the transfer circuit TG are prepared as libraries beforehand from such a view-point of the purpose of use, it is possible to design masks of an LSI chip promptly by selecting necessary ones from the libraries, composing a logic portion by use of a basic library for logic, and performing the arrangement and wiring.

A transistor such as MOS transistor forming the switch SW connected to the I/O line MIOi and the I/O line LIOi has a junction capacitance such as its drain junction capacitance or source junction capacitance. Such a junction capacitance is one kind of parasitic capacitance which limits the operating speed of the circuit. Therefore, as the number of switches SW is increased, the parasitic capacitances of the I/O line MIOi and the I/O line LIOi are increased so that the delay of a signal to be transmitted through the I/O line MIOi and the I/O line LIOi becomes larger. In the case where the signal delay caused by the great increase of the number of stages of switch groups SWG provides a problem, unnecessary switches SW may be omitted.

Second Specific Example of Transfer Circuit

Figures 6, 7:
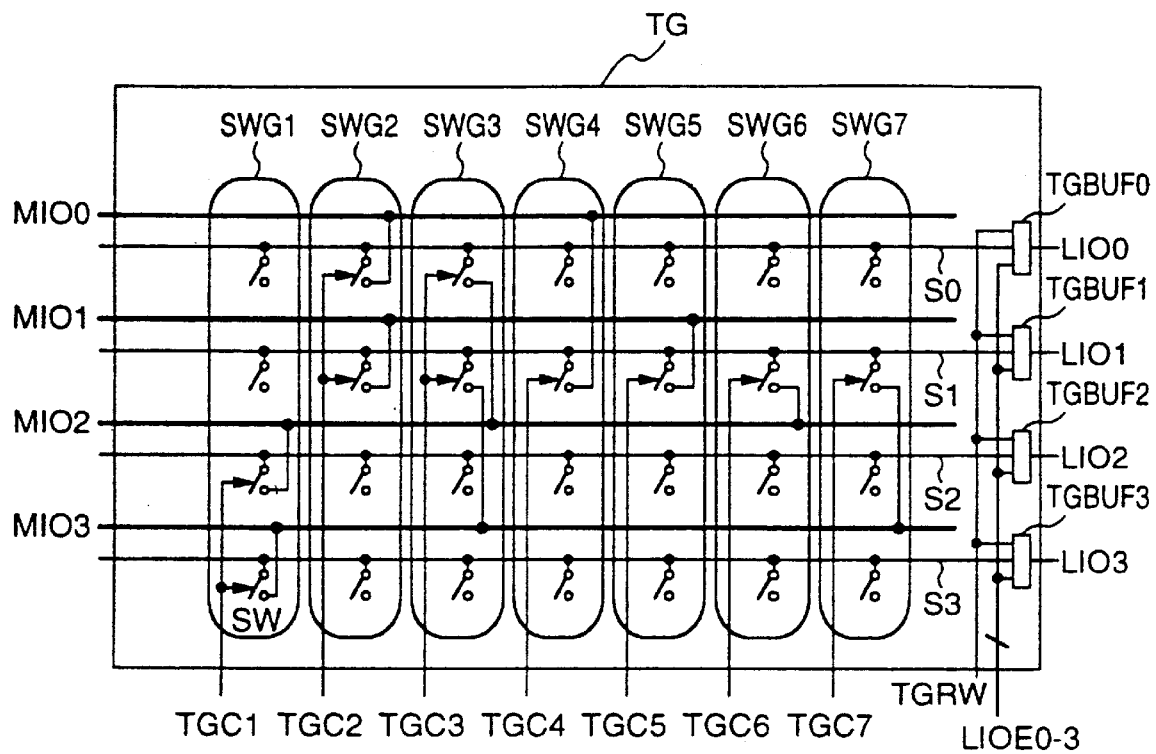
FIG. 6 is a diagram showing a second specific example of the transfer circuit for realizing the transfer patterns shown in FIG. 3.
FIG. 7 is a diagram showing the manner of setting of control signals for the transfer circuit shown in FIG. 6.

FIG. 6 shows a second specific example of the transfer circuit TG in which the transfer circuit TG shown in FIG. 2 is realized by switch groups SWG the number of stages of which is 7 or less than that in FIG. 4. In the transfer circuit TG of FIG. 4 corresponding to the transfer patterns shown in FIG. 3, one switch group SWG corresponds to one transfer pattern. However, the transfer patterns P0, P1 and P2 shown in FIG. 3 are common to each other in that MIO0 and MIO1 of the I/O lines of the memory core MR are connected to LIO0 and LIO1 of the I/O lines of the logic circuit LC. Also, the patterns P1 and P3 are common to each other in that MIO2 and MIO3 of the I/O lines of the memory core MR are connected to LIO0 and LIO1 of the I/O lines of the logic circuit LC. In the embodiment of FIG. 6 with attention directed to those points, the switch group SWG0 is removed and the switch groups SWG1 and SWG2 are changed.

FIG. 7 shows the manner of setting of control signals TGCi, TGRW and LIOEi for realizing the transfer patterns P0 to P7 by the transfer circuit TG having the construction shown in FIG. 6. In FIG. 7, "1" represents a high potential and "0" represents a low potential. Since the transfer pattern P1 enables only the write operation for the above-mentioned reason, the control signal TGRW for the transfer pattern P1 is set only to "1". The setting of the control signals TGCi for realizing the transfer patterns P0 and P1 is different from that in the embodiment shown in FIG. 4.

As shown in FIG. 7, the transfer pattern P0 can be realized by making two control signals TGC1 and TGC2 take high potentials. The control signal TGC1 makes the connection of MIO2 and LIO2 of the I/O lines and the connection of MIO3 and LIO3 thereof, and the control signal TGC2 makes the connection of MIO0 and LIO0 of the I/O lines and the connection of LIO0 and MIO1 thereof.

The transfer pattern P1 can be realized by making two control signals TGC2 and TGC3 take high potentials. The control signal TGC2 makes the connection of MIO0 and LIO0 of the I/O lines and the connection of LIO0 and MIO1 thereof, and the control signal TGC3 makes the connection of MIO2 and LIO0 of the I/O lines and the connection of MIO3 and LIO1 thereof. In the present embodiment, the number of stages of switch groups SWG can be thus reduced. Though the transfer pattern P0 or P1 is realized by activating two switch groups SWG, a second feature of the present embodiment lies in that data passes through one switch SW stage. The present embodiment differs in this point from the conventional omega network or the like in which data passes through a plurality of stages. According to the present embodiment as mentioned above, a higher integration density can be attained without injuring the high-speed ability.

Third Specific Example of Transfer Circuit

Figure 8:
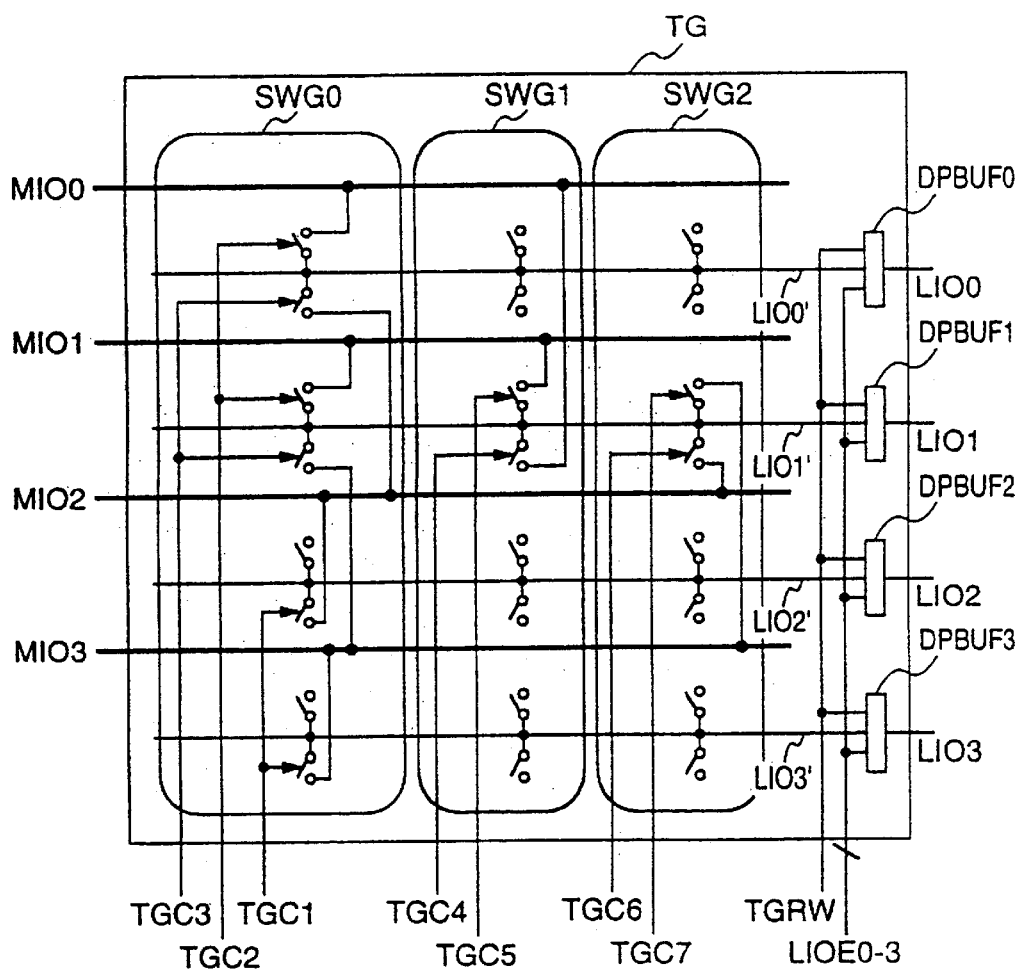
FIG. 8 is a diagram showing a third specific example of the transfer circuit for realizing the transfer patterns shown in FIG. 3.

FIG. 8 shows an embodiment in which the number of stages of switch groups SWG is reduced further than that in the embodiment of FIG. 6 by connecting switches SW in parallel. In the present embodiment, the number of stages of switch groups SWG can be reduced to 3. The manner of setting of control signals is the same as that in the embodiment shown in FIG. 7. In the embodiment shown in FIG. 8, each switch group SWG has switches SW arranged on opposite sides of an I/O line LIOi.

Figure 9A:
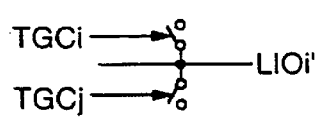
FIGS. 9a to 9c are diagrams showing the circuit construction of the transfer circuit shown in FIG. 8 and an example of the layout thereof.
Figure 9B:
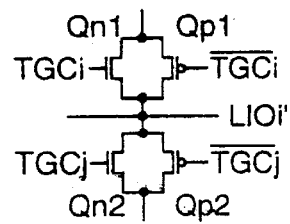
Figure 9C:
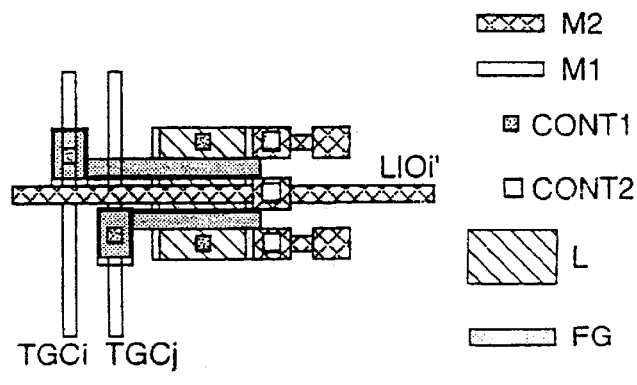

Examples of the circuit construction and the layout of two switches SW represented by reference symbols in FIG. 9a are shown in FIGS. 9b and 9c, respectively. As shown in FIG. 9b, one switch SW includes an N-channel MOS transistor (hereinafter referred to as N-MOS) Qn1 and a P-channel MOS transistor (hereinafter referred to as P-MOS) Qp1 connected in parallel. The other switch SW includes an N-MOS Qn2 and a P-MOS Qp2 connected in parallel. The gates of the N-MOS's Qn1 and Qn2 are inputted with control signals TGCi and TGCj, respectively. The gates of the P-MOS's Qp1 and Qp2 are inputted with control signals TGCiB and TGCjB having phases inverse to those of the control signals TGCi and TGCj, respectively.

FIG. 9c shows an example of the layout of the N-MOS portion of the switch SW. Reference symbol M1 denotes a first wiring layer, symbol M2 a second wiring layer, symbol FG a gate electrode layer, symbol L a diffused layer, symbol CONT1 a contact of the first wiring layer M1 and the diffused layer L with each other, and symbol CONT2 a contact of the first wiring layer M1 and the second wiring layer M2 with each other. As shown in FIG. 9c, the diffused layer L as the lower most layer, the gate electrode layer FG, the first wiring layer M1 and the second wiring layer M2 are arranged in this order. In the present embodiment, the diffused layers L of the respective MOS's forming two switches can be provided in common at an I/O line LIOi'. Therefore, it is possible for the two switches SW to fall within a narrow pitch of I/O lines. Though there is shown the example in which the number of switches SW connected in parallel is 2, it is of course that in the case where the pitch of I/O lines is wide, three or more switches can be connected in parallel to further reduce the number of stages of switch groups.

Reduction of Power Consumption by Memory Reading/Writing Circuit Control Signal

In the embodiments shown in FIGS. 4, 6 and 8, the buffer circuit TGBUFi of the transfer circuit TG is controlled by the enable signal so that wasteful power consumption is reduced and the gate potential of the logic circuit is prevented from taking a floating condition.

Figures 10, 11:
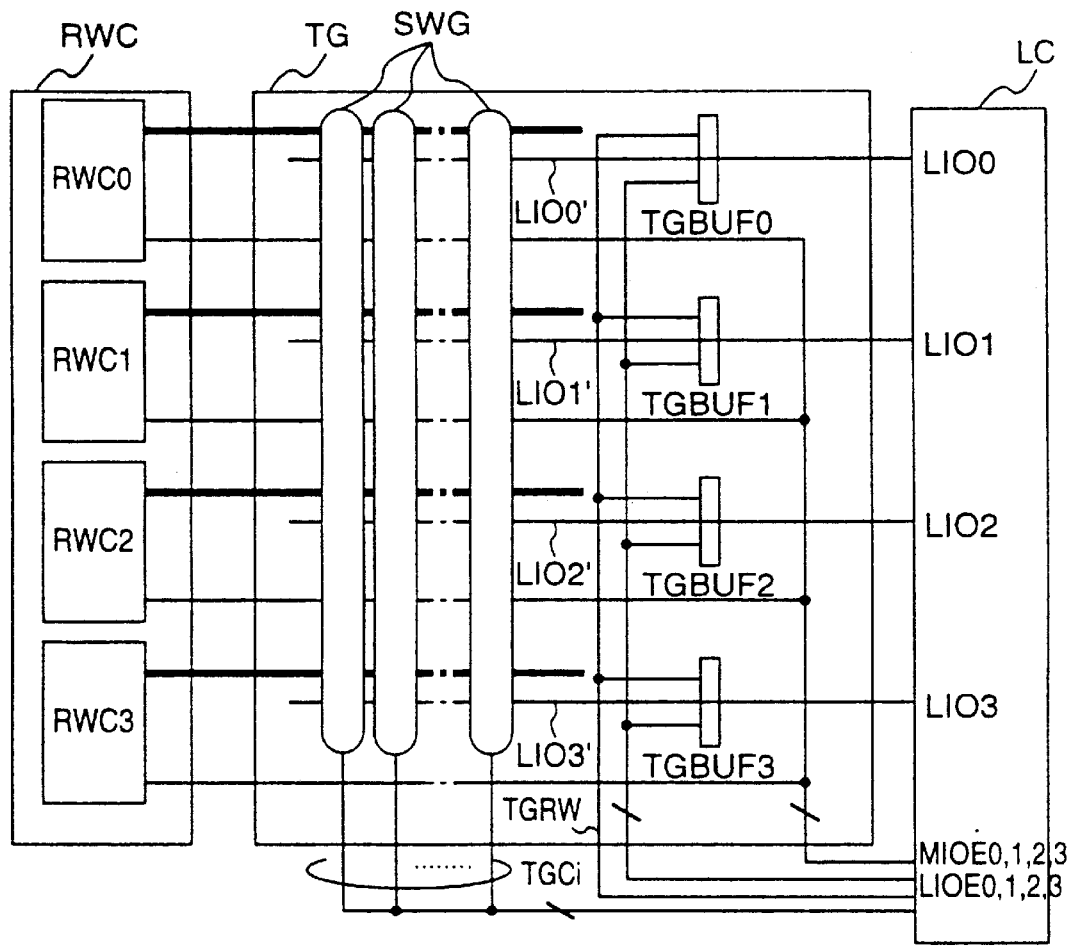
FIG. 10 is a diagram showing an example in which the reduction of power consumption is implemented by a memory read/write control signal.
FIG. 11 is a diagram showing the manner of setting of control signals for the transfer circuit shown in FIG. 10.

FIG. 10 shows an embodiment in which a further control is performed, that is, the reading/writing circuit RWC for the memory core MR is controlled in accordance with transfer patterns so that wasteful power consumption at the time of reading caused by driving unused I/O lines MIOi of the memory core MR is reduced and erroneous data is prevented from being written from the unused I/O lines MIOi into the memory core MR at the time of writing.

In the transfer patterns P2 to P7 shown in FIG. 3, only a part of the I/O lines MIOi of the memory core MR is used. In the embodiment shown in FIG. 10, therefore, control signals for controlling the reading/writing circuit RWC for the memory core MR are provided so that a reading/writing circuit RWCi having charge of an I/O line MIOi of the memory core MR is stopped by the control signal. In FIG. 10, RWC0, RWC1, RWC2 and RWC3 are reading/writing circuits RWCi for I/O lines MIO0, MIO1, MIO2 and MIO3 of the memory core MR, respectively, which form the reading/writing circuit RWC for the memory core MR as a whole. Reference symbols MIOE0, MIOE1, MIOE2 and MIOE3 denote enable signals for controlling the reading/writing circuits RWC0, RWC1, RWC2 and RWC3, respectively.

The manner of setting of the enable signals MIOE0, MIOE1, MIOE2 and MIOE3 for controlling the reading/writing circuits RWCi and enable signals LIOEi for the buffer circuits TGBUFi of the logic circuit LC is shown in FIG. 11 for each transfer pattern. In FIG. 11, "1" of the enable signal represents a high potential or an activating condition and "0" thereof represents a low potential or a stopping condition. In the case where the enable signals MIOE0, MIOE1, MIOE2 and MIOE3 are generated from the logic circuit LC adjacent to the memory core MR, the layout with a high density can be attained if the wiring for the enable signals is made so that it passes through the transfer circuit TG, as shown in FIG. 10.

According to the present embodiment, the control of the reading/writing circuit RWC for the memory core MR in accordance with transfer patterns makes it possible to reduce wasteful power consumption at the time of reading caused by driving unused I/O lines MIOi of the memory core MR and further makes it possible to prevent erroneous data from being written from the unused I/O lines MIOi into the memory core MR at the time of writing.

Implementation for Common Use of Memory Reading/Writing Circuit and Buffer Control Signals In the embodiment shown in FIG. 10, the enable signals MIOEi for controlling the reading/writing circuit RWC and the enable signals LIOEi for the buffer circuits TGBUFi of the logic circuit LC are provided independently of each other. Namely, it is necessary to set the signals MIOEi and the signals LIOEi in different ways in accordance with transfer patterns, as shown in FIG. 11. However, if the number of I/O lines and the number of transfer patterns are increased, the independent setting of the enable signals MIOEi and LIOEi is complicated.

Figure 12:
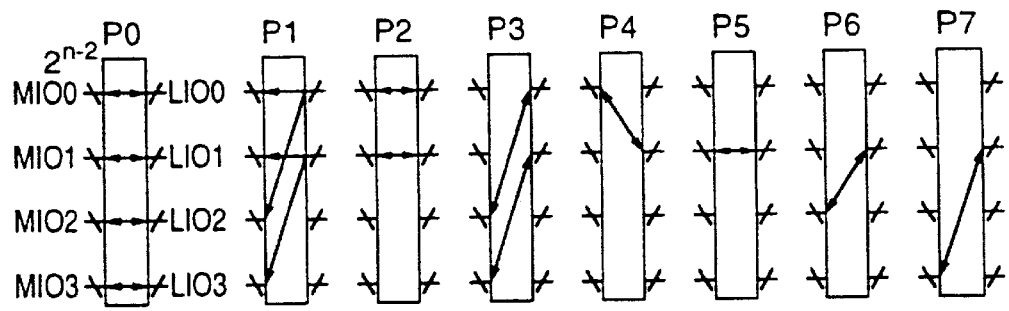
FIG. 12 is a diagram showing data transfer patterns which are the same as those shown in FIG. 3.
Figure 13:
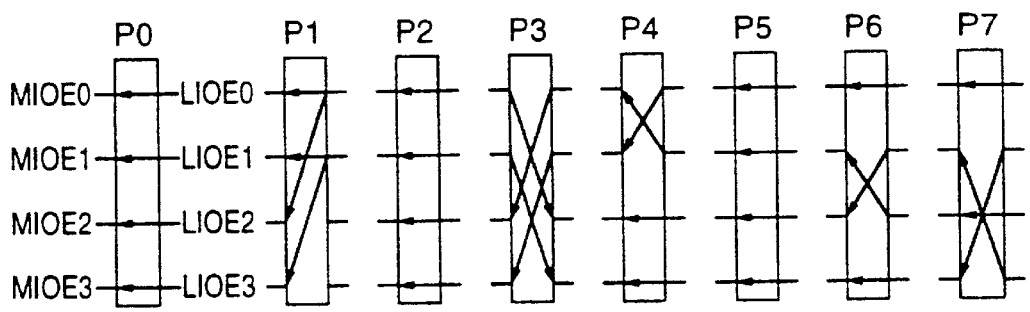
FIG. 13 is a diagram showing transfer patterns of buffer control signals.
Figure 14:
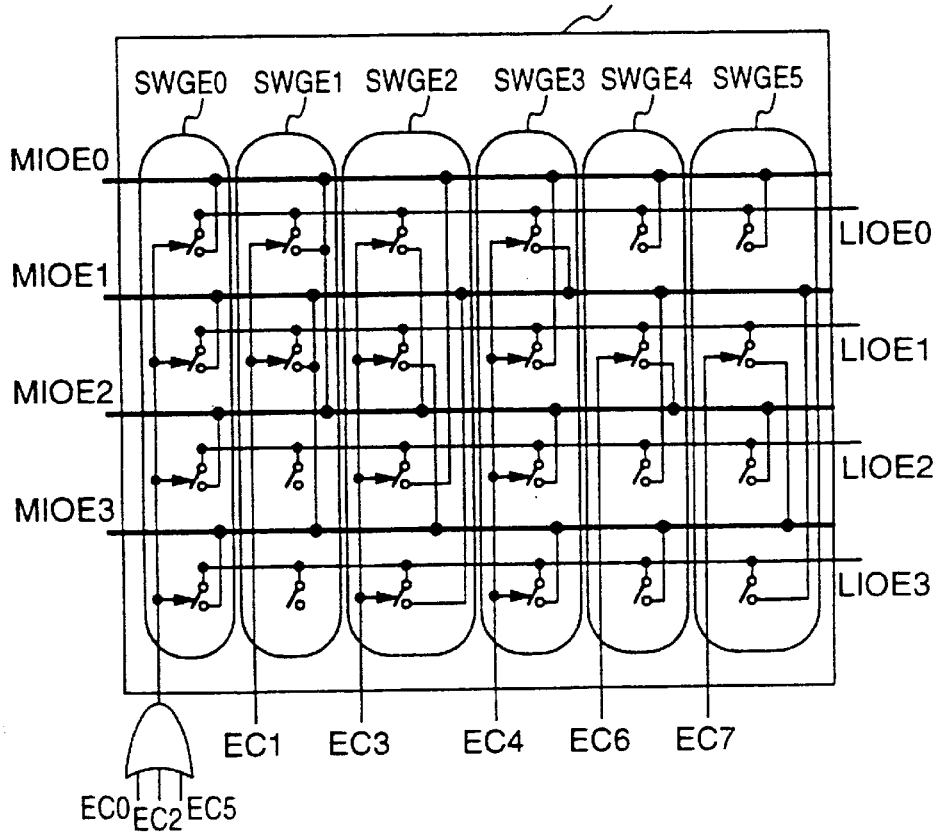
FIG. 14 is a diagram showing an example of a control signal transfer circuit.

FIG. 14 shows an embodiment in which a transfer circuit CTG for the enable signals LIOEi of the buffer circuits TGBUFi of the logic circuit LC is provided so that the enable signals MIOEi of the reading/writing circuit RWC are automatically generated from the enable signals LIOEi. The data transfer patterns shown in FIG. 3 is shown in FIG. 12 again. FIG. 13 shows the transfer patterns of control signals LIOEi of the buffer circuits TGBUFi corresponding to the data transfer patterns shown in FIG. 12.

If the control signals LIOEi of the buffer circuits TGBUFi are transferred to the memory core MR side in accordance with the transfer pattern shown in FIG. 13, the signals can be used as enable signals MIOEi of the reading/writing circuit RWC for the memory core MR, as they are.

Here, it should be noted that control signals having charge of I/O lines MIOi and I/O lines LIOi which are not used by data also need to be transferred for stopping the reading/writing circuit RWC for the memory core MR. Namely, even in the case where data uses only a part of I/O lines MIOi and I/O lines LIOi as in the transfer patterns P1 to P7, all the control signals LIOEi are transferred, as shown in FIG. 13.

Figures 15, 16:
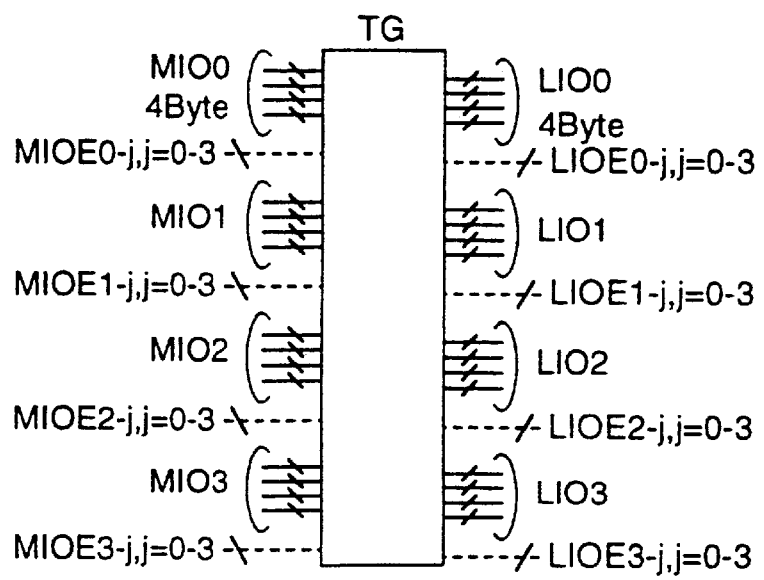
FIG. 15 is a diagram showing a control signal setting manner in the control signal transfer circuit shown in FIG. 14.
FIG. 16 is a diagram showing an example of enable signals which can be set more finely than the transfer unit of data.

The transfer circuit CTG (see FIG. 14) for the control signals LIOEi of the buffer circuits TGBUFi includes switch groups SWGEi as in the data transfer circuit TG. With this transfer circuit CTG, the transfer patterns shown in FIG. 13 can be realized by setting control signals ECi in accordance with the transfer patterns, as shown in FIG. 15.

It is seen from the transfer patterns shown in FIG. 13 that P0, P2 and P5 have the same configuration. Thus, a unified switch group SWGE0 is provided concerning the control signals EC0, EC2 and EC5 so that it is inputted with the OR logic of the control signals EC0, EC2 and EC5. Thereby, the number of stages of switch groups SWGE can be reduced to attain high integration. Since the principle of operation is the same as that of the data transfer circuit TG having already been explained, the explanation thereof will be omitted.

With the provision of the transfer circuit CTG for the control signals LIOEi of the buffer circuits TGBUFi in addition to the data transfer circuit TG as shown in FIG. 4, the present embodiment eliminates a need to set the enable signals MIOEi of the reading/writing circuit RWC and the enable signals LIOEi of the buffer circuits TGBUFi independently of each other. Therefore, even if the number of I/O lines or the number of transfer patterns is increased, it is possible to prevent the setting of enable signals from being complicated.

Enable Signal Capable of Finely Setting Transfer Unit of Data

In the foregoing embodiments, the enable signal MIOEi of the reading/writing circuit RWC and the enable signal LIOEi of the buffer circuit TGBUFi are provided or set for I/O lines together subjected to data transfer at the time of data transfer ($2^{n-2}$ lines in FIG. 3). However, a further variety of transfer patterns can be realized by making the setting of the enable signal fine.

FIGS. 16 and 17 show examples of an enable signal which can be set finely as compared with the transfer unit of data. In this embodiment, the unit of I/O lines together subjected to data transfer for the transfer pattern shown in FIG. 3 is 4 bytes and the enable signal is set in units of 1 byte. Thereby, the eight kinds of transfer patterns shown in FIG. 3 can be realized between 4 bytes of an I/O line MIOi of the memory core MR and 4 bytes of an I/O line LIOi of the logic circuit LC as shown in FIG. 16. Four enable signals LIOEi-j and four enable signals MIOEi-j are provided for a 4-byte I/O line LIOi group and a 4-byte I/O line MIOi group, respectively. Namely, j is 0 to 3. For example, four enable signals LIOE0-0, LIOE0-1, LIOE0-2 and LIOE0-3 are provided for an I/O line LIO0. LIOE0-0 is the enable signal for the first byte of LIO0, LIOE0-1 is the enable signal for the second byte of LIO0, LIOE0-2 is the enable signal for the third byte of LIO0, and LIOE0-3 is the enable signal for the fourth byte of LIO0.

FIGS. 17a to 17d show examples of transfer patterns capable of being formed by the transfer circuit TG having the construction shown in FIG. 16 and the manner of setting of enable signals for those patterns. The enable signals MIOEi-j may be produced by transferring the enable signals LIOEi-j or may be set independently of the enable signals LIOEi-j. FIG. 17a shows the case where all the enable signals LIOEi-j and the enable signals MIOEi-j are "1" in a state in which a basic transfer pattern determined by the transfer circuit TG is P0. A transfer pattern formed in this case is the same as the pattern shown until now. Namely, the I/O lines LIOi and the I/O lines MIOi are all coupled. On the other hand, if the enable signals LIOEi-j and the enable signals MIOEi-j take "0" and "1" two bytes by two bytes with P0 being taken as a basic pattern, as shown in FIG. 17b, another transfer pattern can be formed. Namely, each I/O line LIOi and each I/O line MIOi are coupled by only 2 bytes. Also, FIG. 17c corresponds to a basic pattern P3. On the other hand, FIG. 17d corresponds to the case where the setting of the enable signals LIOEi-j and the enable signals MIOEi-j is changed with the basic pattern P3 unchanged. Namely, each of the coupling of the I/O line LIO0 and the I/O line MIO2 and the coupling of the I/O line LIO1 and the I/O line MIO3 is made by only 2 bytes.

Though only one example is herein shown for each of two basic patterns, various transfer patterns other than the shown example different from the basic pattern can be formed by changing the enable signals. In the case, as in the use for an image or the like, where the attribute of data is different for each byte, there may be a need to transfer only a specified byte. In such a case, the present embodiment is useful.

FIGS. 18a to 18d show embodiments in which the application is made to data transfer in an LSI performing a three-dimensional computer graphics (hereinafter referred to as 3D-CG) drawing processing.

The transfer circuit TG is represented by a box form in FIG. 18a. The transfer circuit TG is provided between the memory core MR and the logic circuit LC in a manner similar to that in the foregoing embodiment. Since the basic transfer pattern of the transfer circuit TG is fundamentally similar to that in FIG. 3, the transfer pattern symbol Pi shown in FIG. 3 is used for the following explanation. RGB-A and RGB-B are data indicating the colors of pixels A and B, and Z-A and Z-B are data indicating the depth coordinates of the pixels A and B. Though there is no special limitation, each data has a 16-bit length.

FIGS. 18b, 18c and 18d show transfer patterns for "Z compare", "alpha blend" and "screen clear", respectively.

In 3D-CG, a specified processing called "Z compare" is frequently performed. As well known, this processing is a processing in which when a pixel is to be newly written into the memory, the comparison of the Z value of the new pixel with the Z value of a pixel at the same position is made and the writing is performed if the former is smaller than the latter whereas the writing is not performed if the former is greater than the latter. In the case where such a processing is performed for the pixel A, a Z value Z-Aold having already been stored in the memory core MR is first read with P5 being taken as a transfer pattern (see FIG. 18b). Subsequently, the Z value Z-Aold is compared with the Z value Zin of the new pixel by the logic circuit LC. If Zin is smaller than Z-Aold, the writing of the RGB value and Z value of the new pixel is performed. At this time, if the transfer pattern is changed to P2, it is possible to write the RGB value and the Z value in parallel. In the case of the pixel B, transfer patterns P7 and P3 can be used. Namely, in this case, the use of the transfer patterns P7 and P3 results in that the same I/O lines as the I/O lines LIOi on the logic circuit LC side used for the pixel A are used for the Z value and RGB data for the pixel B. In the case where the RGB value and the Z value are different in the number of bits such that the RGB value has 3 bytes and the Z value has 2 bytes, there may be used a method in which a basic transfer pattern of the transfer circuit TG is taken in units of 3 bytes and the Z value is handled in a masked manner by providing an enable signal for each byte as shown in FIG. 16.

3D-CG further includes a processing for representing the feeling of transparency. This processing is called "alpha processing". This processing may be performed as shown in FIG. 18c. As well known, the alpha processing is a processing in which when a pixel is to be newly written into the memory, data of a pixel at the same position is read so that the read pixel data and data of the new pixel are added after the weighting thereof by a desired coefficient α and the determined pixel data is written at the same position of the memory core MR. In the case where such a processing is performed for the pixel A, data RGB-Aold having already been stored in the memory core MR is read with P4 being taken as a transfer pattern (see FIG. 18c). Subsequently, the read data RGB-Aold and data RGBin of the new pixel are subjected to the weighting thereof by the coefficient α and addition in the logic circuit LC. The determined RGB data is written. At this time, P4 can be used as the transfer pattern, as it is. In the case of the pixel B, a transfer pattern P6 can be used since the transfer of data for the logic circuit LC is made through the same I/O line as the I/O line used for the pixel A. In this case, if the logic circuit LC includes only one arithmetic circuit for performing the operation of weighted addition, the "alpha blend" processing can be performed for each of R, G and B one byte by one byte by providing an enable signal for each byte.

Further, a processing called "screen clear" can also be performed at a high speed. In this processing, data in the memory core MR is initialized. Usually, the writing of the minimum value or the maximum value is performed in regard to RGB while the writing of the maximum value providing the maximum depth is performed in regard to Z value. In the embodiment shown in FIG. 18d, there are I/O lines corresponding to two pixels. Therefore, if a transfer pattern P1 is used, the two pixels can be written simultaneously, thereby making it possible to perform the clearing process at a high speed. Further, if a transfer pattern P0 and enable signals are used though it is not shown in FIGS. 18a to 18c, high-speed image display on the screen can also be performed. As has been mentioned in the above, it is possible to perform the 3D-CG drawing processing at a high speed by using the transfer circuit TG of the present embodiment.

Example in which Allotment of I/O Lines is Made for Each Byte

Up to here, the I/O lines MIOi and LIOi have been shown in a form allotted for each unit of transfer, for simplification of explanation. If this allotment is made in the actual layout, data is transferred across many I/O lines, especially when the unit of transfer is large. Accordingly, there may be the case where bad influences such as a delay caused by wirings, the induction of noises and so forth are produced.

Figure 19A:
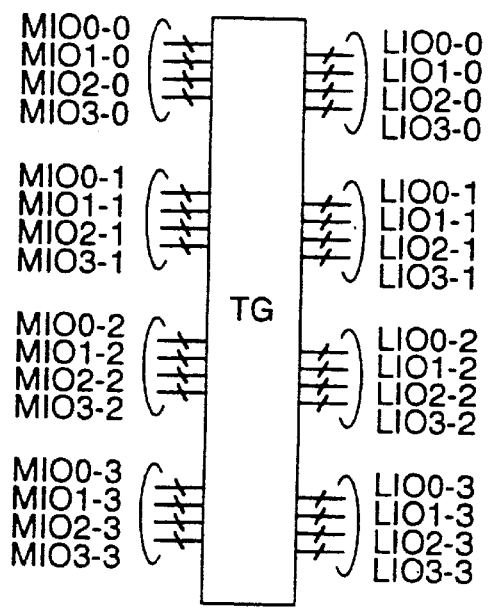
FIGS. 19a and 19b are diagrams showing examples in which the addressing of I/O lines is changed for each byte.
Figure 19B:
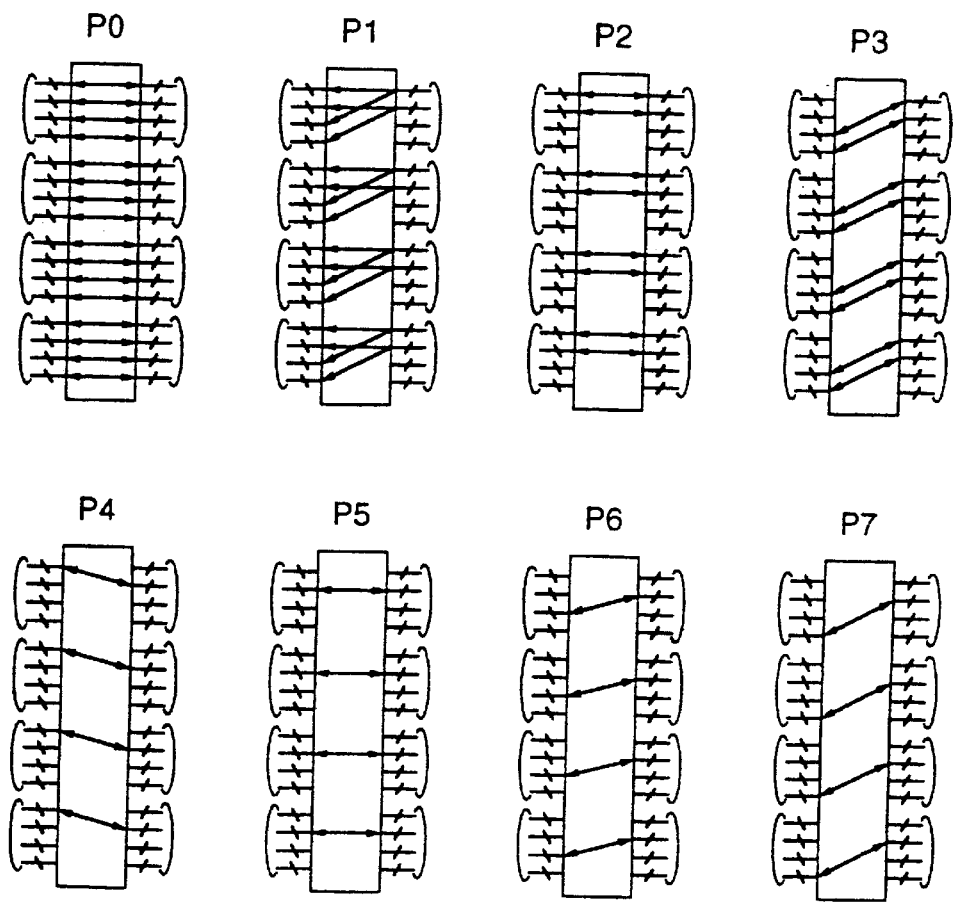

FIGS. 19a and 19b show an embodiment in which the allotment of I/O lines is made for each byte. FIG. 19a shows a method of making the nesting one byte by one byte when the unit of transfer is 4 bytes. FIG. 19b shows transfer patterns equivalent to the transfer patterns shown in FIG. 3. With such a construction, it is possible to reduce the movement of data. For example, in the case of the transfer pattern 3, the construction shown in FIG. 3 requires the transfer of data across I/O lines corresponding to 8 bytes whereas only 2 bytes suffice in the construction of the present embodiment shown in FIG. 19b. Though the interchange for each byte is made in the shown example, the interchange for each bit may be used. In this case, it is possible to further reduce the movement of data. When the present embodiment is used, it is of course that I/O ports of the logic circuit LC need to be designed correspondingly. However, it is possible to avoid bad influences such as a delay caused by wirings, the induction of noises and so forth and it is also possible to reduce an increase in area caused by an increase in wirings.

Example of Specific Layout Pattern of Switch Group SWG

The specific construction of the switch group SWG according to the embodiment will now be explained using FIGS. 20 to 26. Though FIGS. 20 to 26 are shown in conjunction with an example in which the number of I/O lines of each of the memory core MR and the logic circuit LC is 4, the present invention is not limited to this example. Namely, it is in common with the foregoing embodiments that the present invention is also applicable to the case where the number of I/O lines of the memory core MR and the number of I/O lines of the logic circuit LC are different from each other. In practice, a multiplicity of (for example, 128) I/O lines are provided.

FIG. 20 shows the cross section of a semiconductor chip while illustrating a relationship between laid-out layers. Though there is no special limitation, the shown structure takes a CMOS structure having a so-called three-layer metal wiring construction. Since the CMOS structure with the three-layer metal wiring construction itself is not directly relevant to the present invention, the detailed explanation thereof will not be made but the outline thereof is as follows.

Namely, a P-type well (PWEL layer) and an N-type well (NWEL layer) are formed in a semiconductor substrate 200 which is made of, for example, monocrystalline silicon. Field insulator films 202 are formed, by a selective oxidation technique, on a surface of the semiconductor substrate 200 excepting surface portions where active regions are to be provided. A gate insulator film 204 is formed on the surface of the active region. A gate electrode layer FG made of polysilicon or polycide is selectively formed on the gate insulator film 204. Further, N-type drain and source regions 206 and P-type drain and source regions 208 are formed through selective impurity implantation with the field insulator films 202 and the gate electrode layers FG being used as an ion implantation mask. Thereby, an N-MOS and a P-MOS are formed in the P-type well PWEL and the N-type well NWEL, respectively. The cross section shown in FIG. 20 corresponds to a so-called logic section such as the transfer circuit TG, the logic circuit LC and so forth. Though not shown, a memory core MR section is constructed such that a second N-type well is formed in the lower portions of the P-type well PWEL and the N-type well NWEL so that the memory core MR section and the logic section are isolated from each other.

A plurality of wiring layers M1, M2 and M3 are formed on the surface of the semiconductor substrate 200 by the repetition of the formation of an inter-layer insulator film made of an insulator mainly containing silicon oxide, the formation of contact holes in the inter-layer insulator film and so forth by a selective etching technique, and the formation of a wiring layer made of aluminum Al.

For avoiding the complexity of illustration and facilitating the understanding, the inter-layer films existing between the wiring layers forming different level layers are not shown in FIG. 20.

In FIG. 20, reference symbols M1 to M3 denote the wiring layers made of metal such as aluminum. The third wiring layer M3 lies at the uppermost portion, the second wiring layer M2 lies below the third wiring layer M3, and the first wiring layer M1 lies below the second wiring layer M2. Symbol FG denotes the gate electrode layer of the MOS transistor. Symbols CONT1, CONT2 and CONT3 denote contact layers for electrically connecting the wiring layers M1, M2 and M3, the gate electrode layers FG or the diffused layers 206 and 208 of the transistors, the wells PWEL and NWEL, and so forth. The contact layer CONT1 is provided for connecting the first wiring layer M1 to the diffused layer 206 or 208 of the transistor, the gate electrode layer FG, or the well PWEL or NWEL. The contact layer CONT2 is a layer for connecting the first wiring layer M1 and the second wiring layer M2. The contact layer CONT3 is a layer for connecting the second wiring layer M2 and the third wiring layer M3. Though these contact layers are shown in the figure so that they are layers different from the wiring layers M1, M2 and M3, it is apparent from the foregoing that the contact layers are wiring layers formed in the contact holes formed in the inter-layer insulator films.

Figure 21:
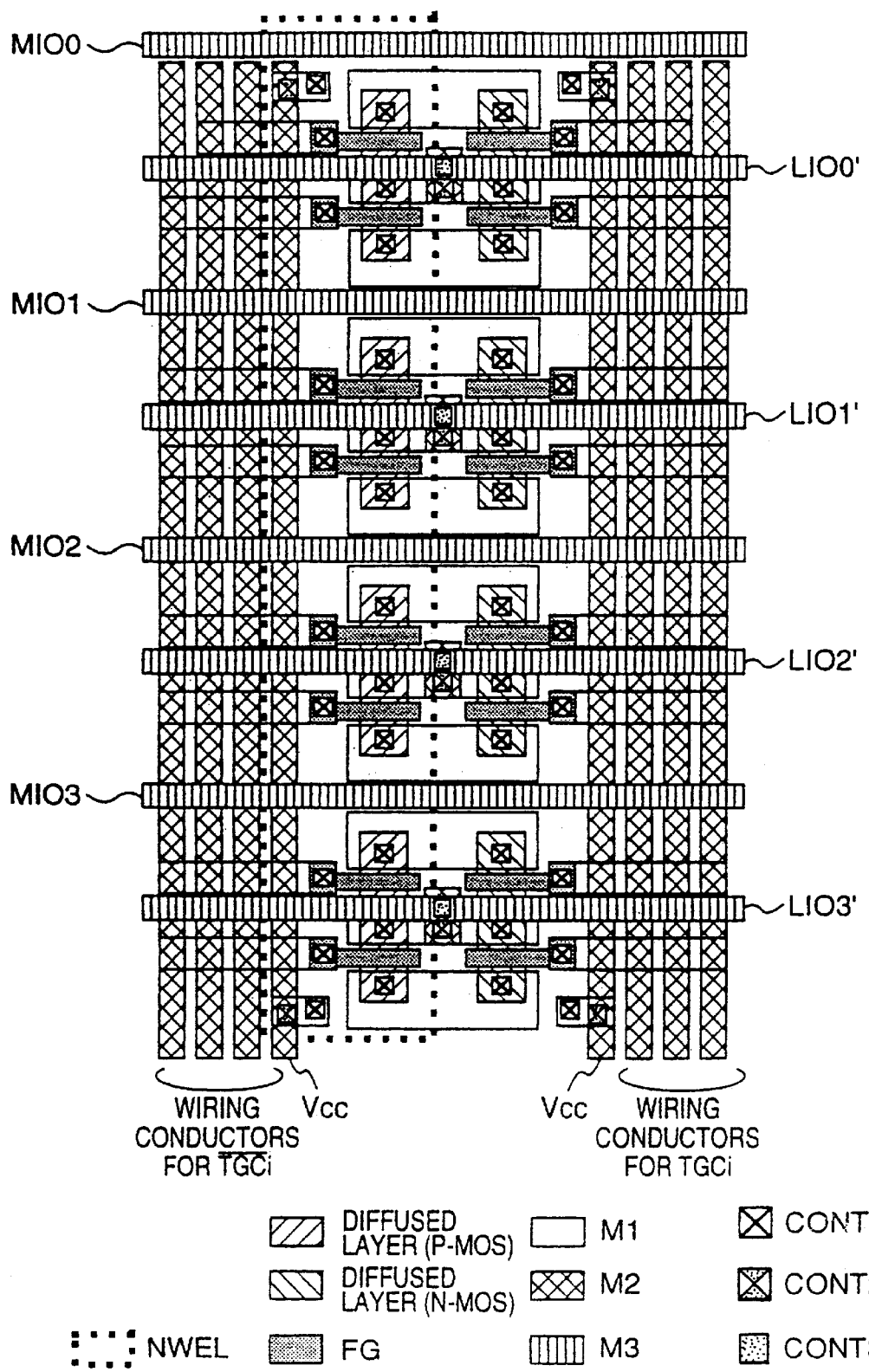
FIG. 21 is a diagram showing an example of the layout of a switch group SWG.
Figure 22:
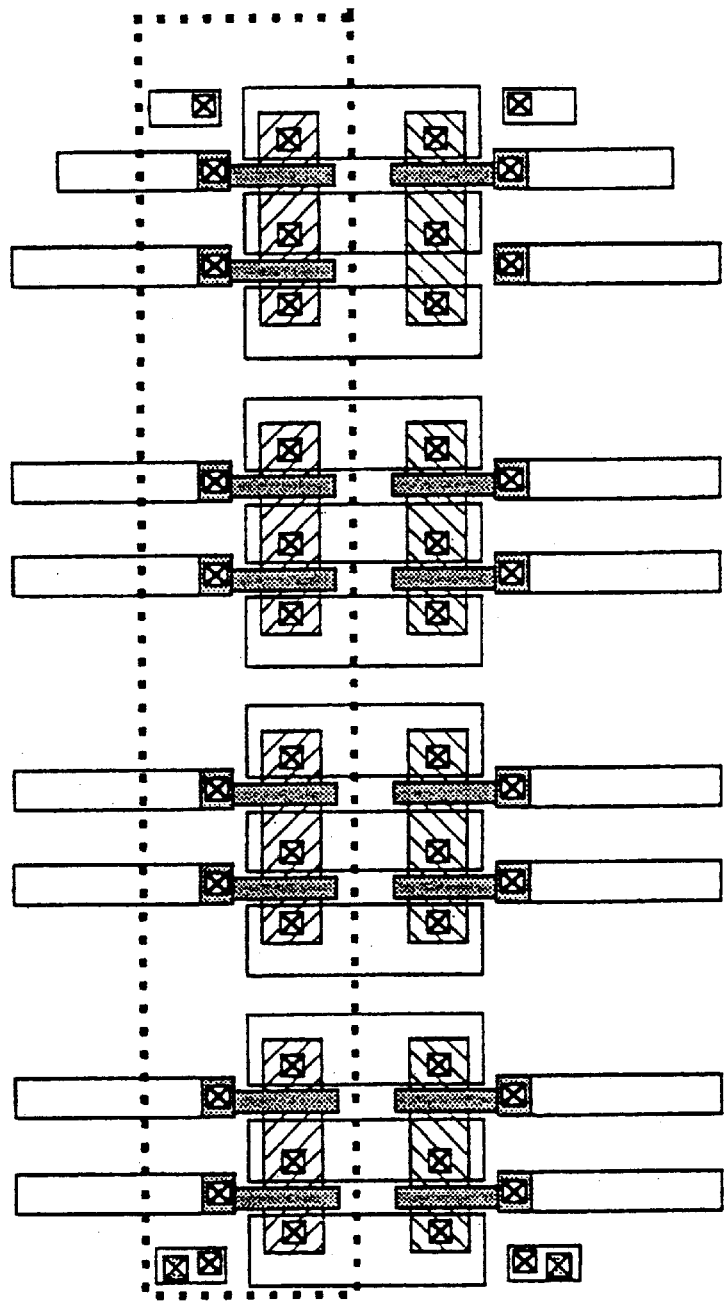
FIG. 22 is a diagram showing the layout of the switch group of FIG. 21 up to a first wiring layer M1.
Figure 23:
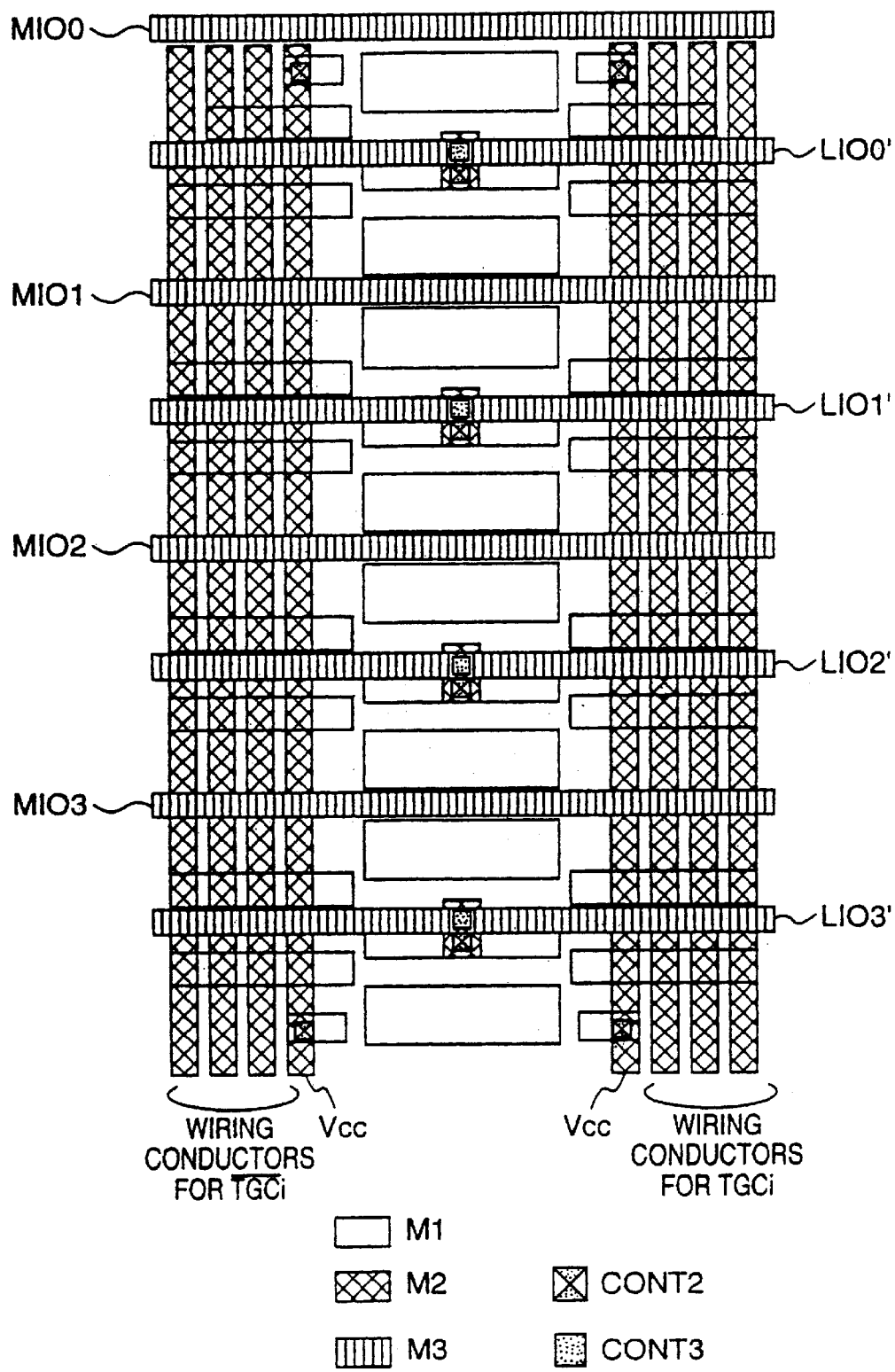
FIG. 23 is a diagram showing the layout of the switch group of FIG. 21 from the first wiring layer M1 to a third wiring layer M3.

As has been explained in conjunction with the embodiment shown in FIG. 4, the layout design of a chip becomes easy if a common portion in the switch group SWG which does not depend upon a transfer pattern is prepared beforehand. FIG. 21 shows an embodiment of the layout of the common portion. For facilitating the understanding of the construction shown in FIG. 21, a layout up to the M1 layer is shown in FIG. 22 and a layout from M1 to M3 is shown in FIG. 23. Also, an equivalent circuit corresponding to the layout is shown in FIG, 24.

Figure 24:
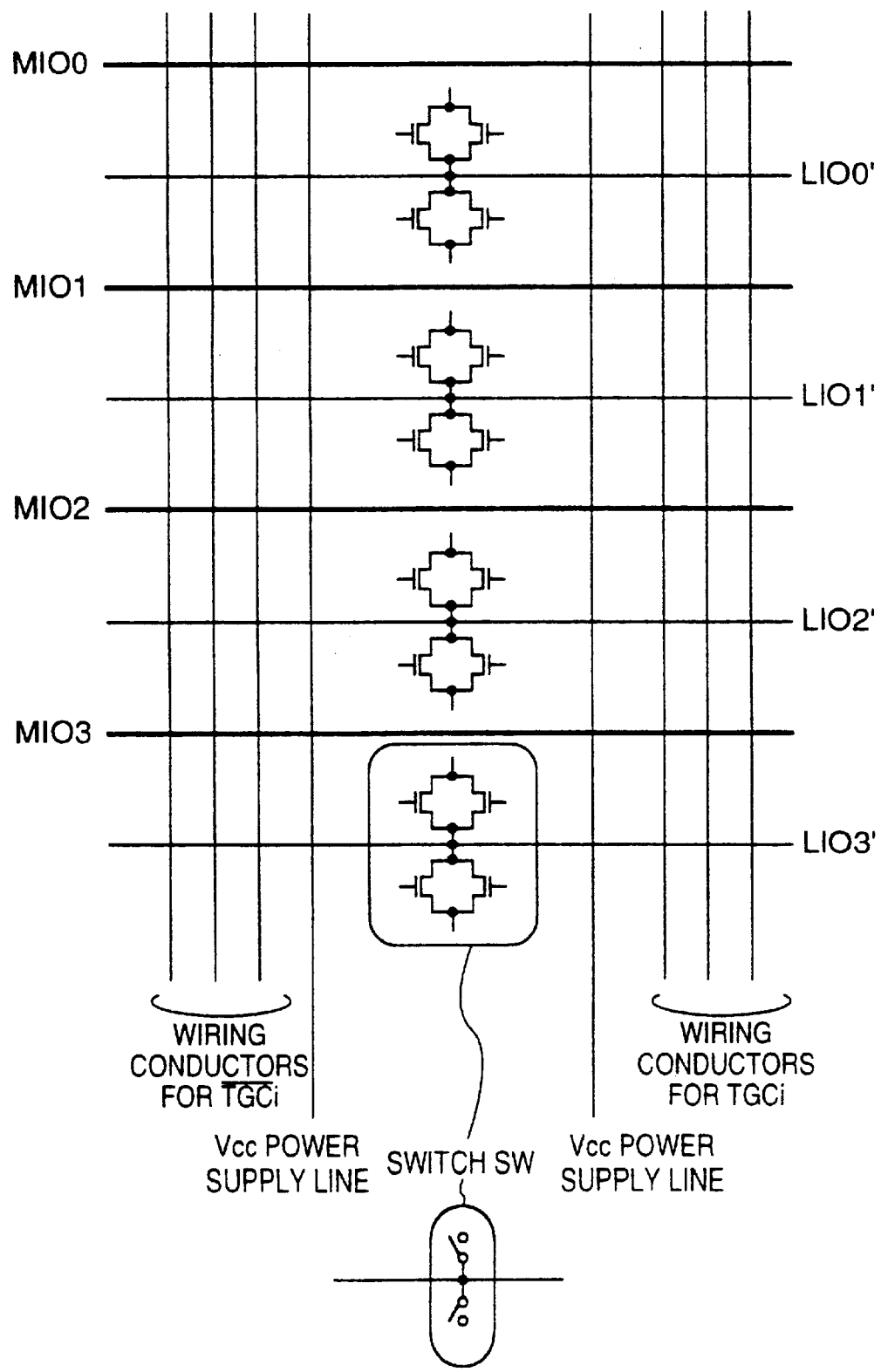
FIG. 24 is a diagram showing an equivalent circuit corresponding to the layout of the switch group shown in FIG. 21.

As shown in FIG. 24, the switch SW in the present embodiment is composed of a group of four transistors in which two switches each including N-MOS and P-MOS transfer gates are connected. Each transistor is connected to the third wiring layer M3 which is the I/O line (LIO0'–LIO3') of the logic circuit LC. The second wiring layer M2 for the control signals TGCi and $\overline{TGCi}$ and the third wiring layer M3 for the I/O line MIOi of the memory core MR remain unwired since locations destined for the connection thereof are different depending upon transfer patterns. The second wiring layer is also used for power supply lines Vcc and Vss for fixing the potentials of the wells PWEL and NWEL and the gate electrodes of transistors which form unused switches SW.

In the present embodiment, the second wiring layers M2 forming the control signals TGCi and $\overline{TGCi}$ are laid out orthogonally to the I/O lines LIOi and MIOi. Thereby, the following merit is produced. Namely, it is preferable that the third wiring layers M3 in the switch group SWG for the I/O lines MIOi of the memory core MR are laid out in conformity with the wiring pitch of the I/O lines MIOi of the memory core MR in order to facilitate the connection to the I/O lines MIOi of the memory core MR. On the other hand, a need to increase each of the number of control signals $\overline{TGCi}$ and the number of control signals TGCiB to be greater than 3 illustrated in the shown embodiment may be generated, as transfer patterns require. In the case where the control signals TGCi and $\overline{TGCi}$ are laid out orthogonally to the I/O lines LIOi and MIOi, as in the present embodiment, the pitch of the I/O lines LIOi and MIOi is independent of the pitch of the control signal lines. Accordingly, there is produced a merit that even if the number of control signals is changed, it is not necessary to change the pitch of the third wiring layers M3 in the switch group SWG for the I/O lines MIOi of the memory core MR.

Figure 25:
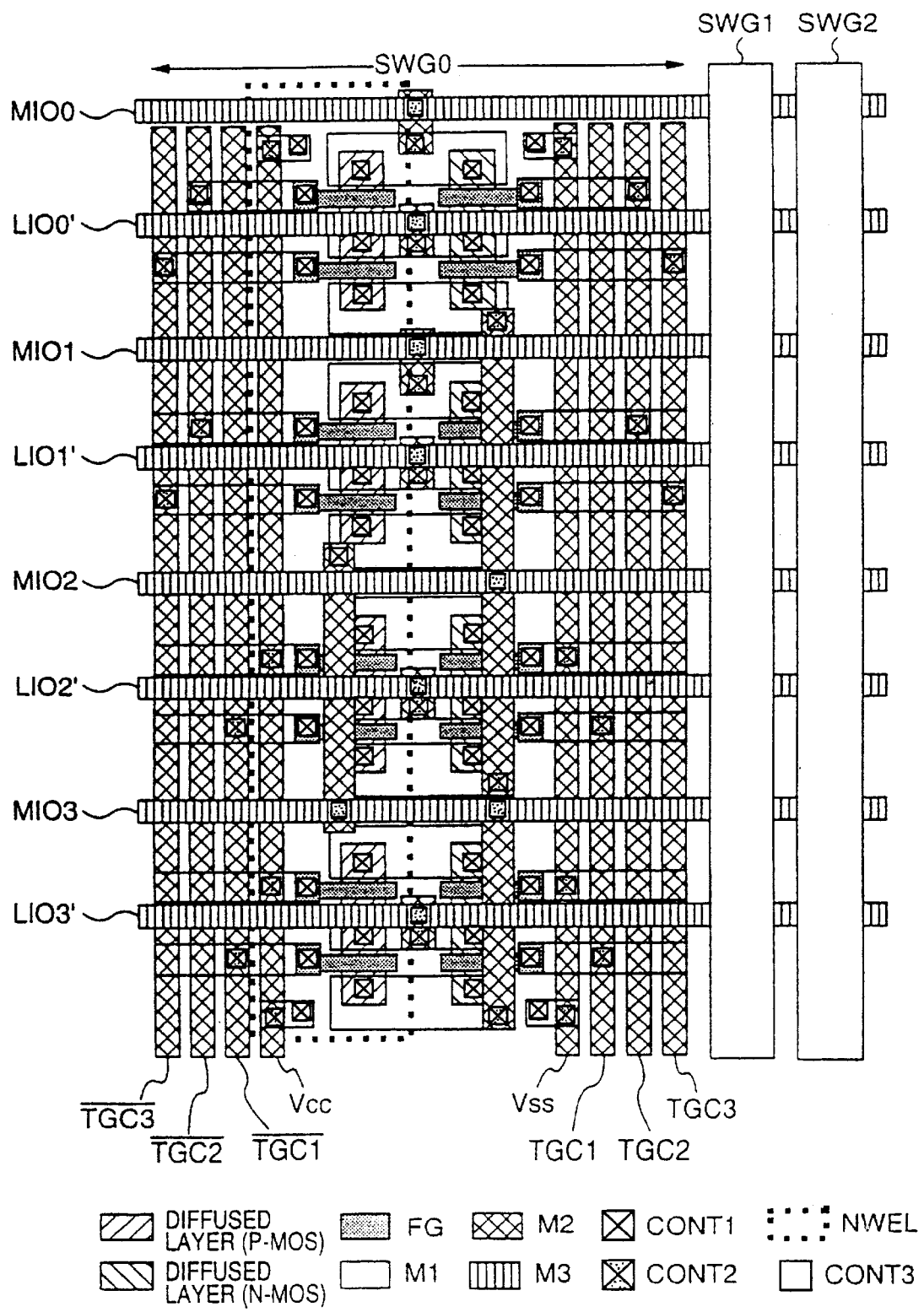
FIG. 25 is a diagram showing an example of the layout of the transfer circuit shown in FIG. 8.
Figure 26:
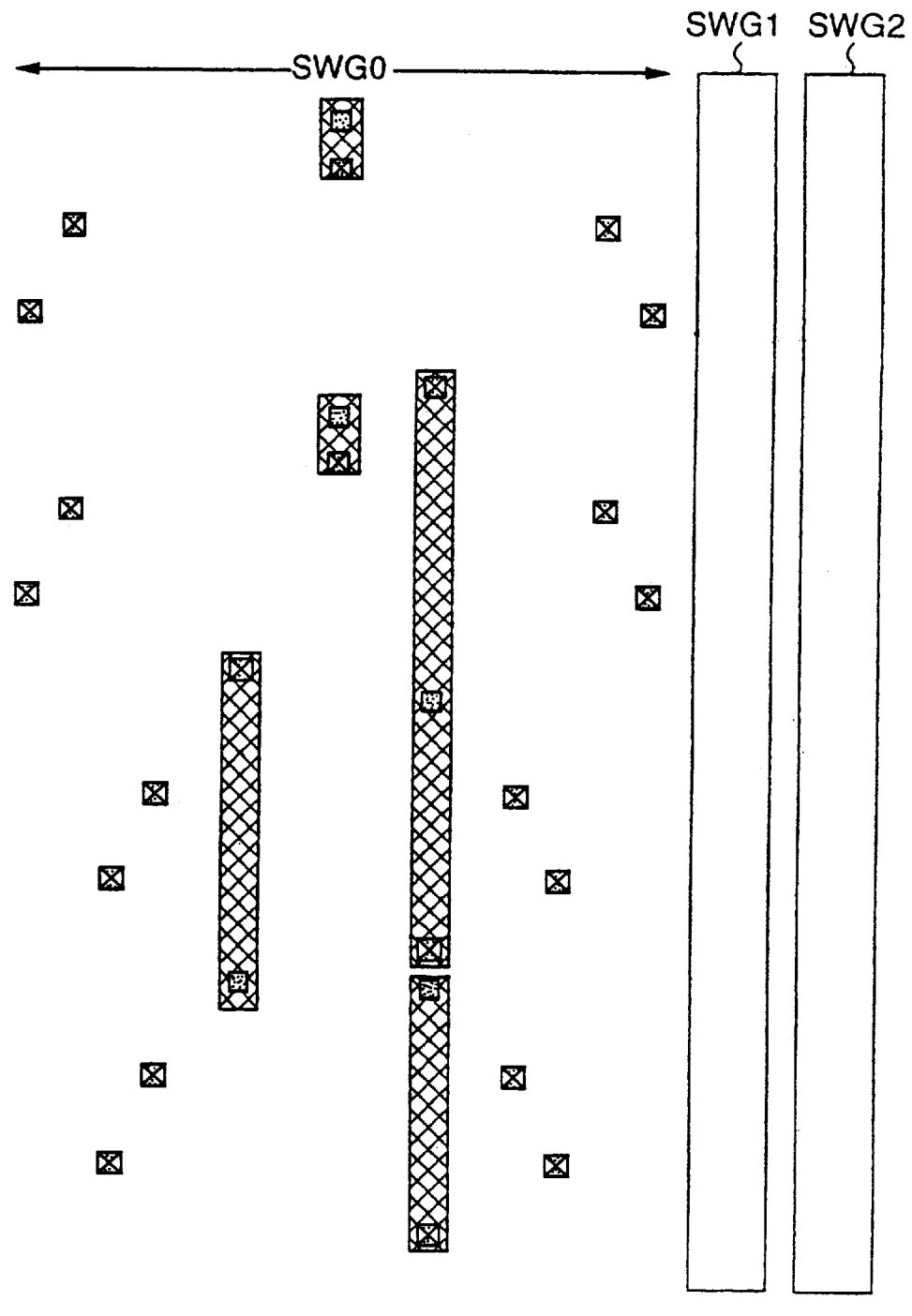
FIG. 26 is a diagram showing the layout of added layers in the layout of the transfer circuit shown in FIG. 8.

Next, a method for forming the switch group SWG of the transfer circuit TG by use of the above-mentioned common portion will be explained. FIG. 25 shows a method for forming the switch group SWG of FIG. 8 by use of the construction shown in FIG. 21. Though only the SWG0 portion is shown in FIG. 25, the other SWG portions can be constructed similarly. For clarification, the layout of layers added to the common portion of FIG. 21 is shown in FIG. 26. In FIG. 26, there are added the contact layers CONT2 for transferring the control signals TGCi and $\overline{TGCi}$ to the gate electrodes of transistors which form the switches SW, and the second wiring layers M2 and contact layers CONT2 and CONT3 for transferring the I/O lines MIOi of the memory core MR to the source electrodes or drain electrodes of transistors which form the switches SW. Thus, various transfer circuits TG can be constructed by merely arranging some laid-out layers in addition to the embodiment of FIG. 21 in accordance with a transfer pattern to be realized. If a common portion is prepared as a layout library beforehand, it is possible to make the layout design of the transfer circuit TG very easy.

Figure 27:
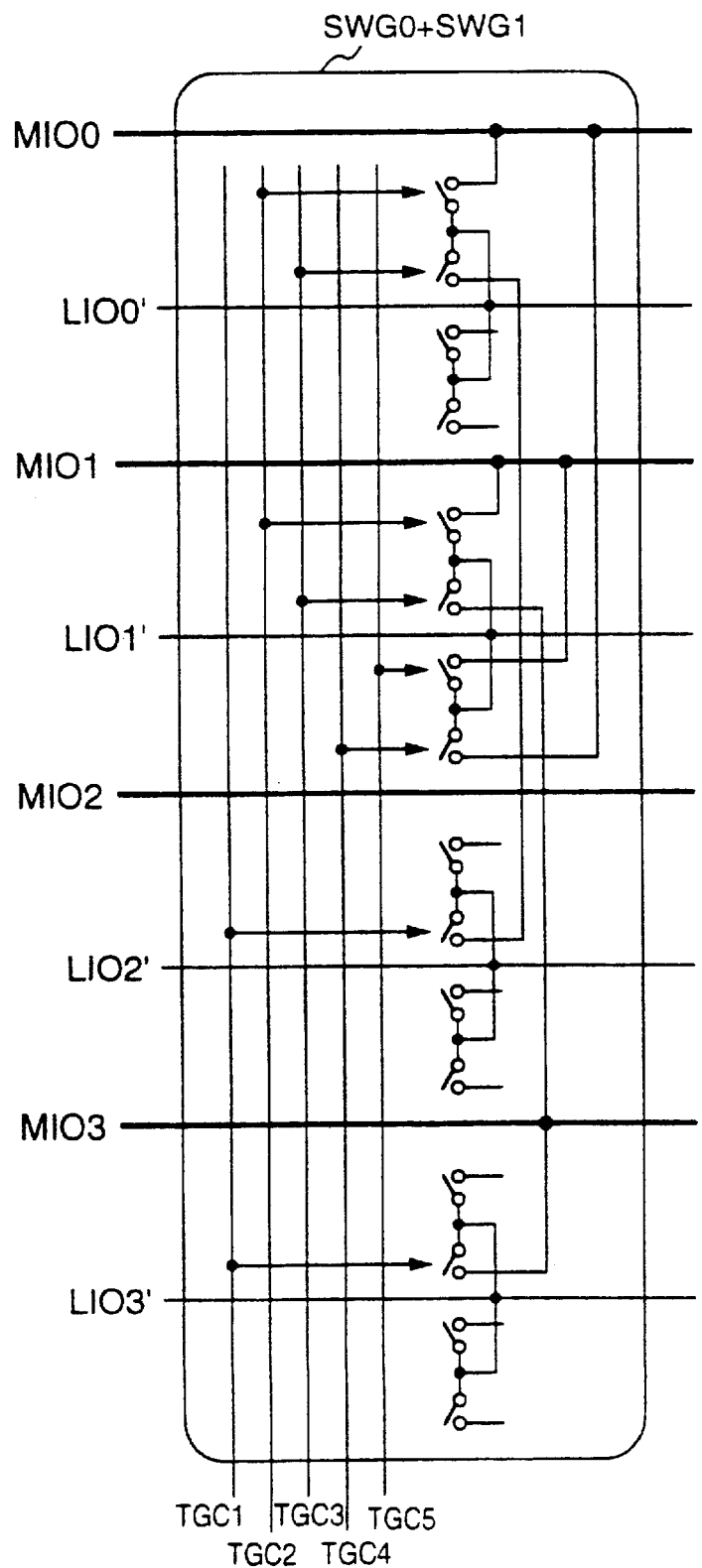
FIG. 27 is a diagram showing an example in which the number of stages of switch groups is reduced by connecting switches in parallel.

The above embodiment has been shown in conjunction with the example in which two switches SW are arranged in parallel within the pitch of I/O lines MOIi of the memory core MR. However, in the case where the pitch of I/O lines MIOi is wide, it is possible to arrange still more switches SW within the pitch of I/O lines MIOi, thereby reducing the number of stages of switch groups SWG. FIG. 27 shows an example in which four switches are arranged within the pitch of I/O lines MIOi so that the switch groups SWG0 and SWG1 shown in FIG. 8 are realized by one stage. Thus, the number of stages of switch groups SWG can be reduced by arranging many switches SW within the pitch of I/O lines MIOi. Therefore, in the case where the pitch of I/O lines MIOi is wider, the chip size can be further reduced. It is of course that even in the case where many switches are arranged within the pitch of I/O lines MIOi, the layout design of the transfer circuit TG can be made very easy if a common portion of the layout is registered as a library beforehand.

Example in which Arrangement of Transfer Pattern TG is Changed

Though the foregoing embodiments have a construction in which the transfer circuit TG is arranged between the reading/writing circuit RWC for the memory core MR and the logic circuit LC, the present invention is not limited to such a construction. Namely, the present invention is applicable even to the case where the transfer circuit TG is arranged in the front stage of the reading/writing circuit RWC for the memory core MR.

Figure 28A:
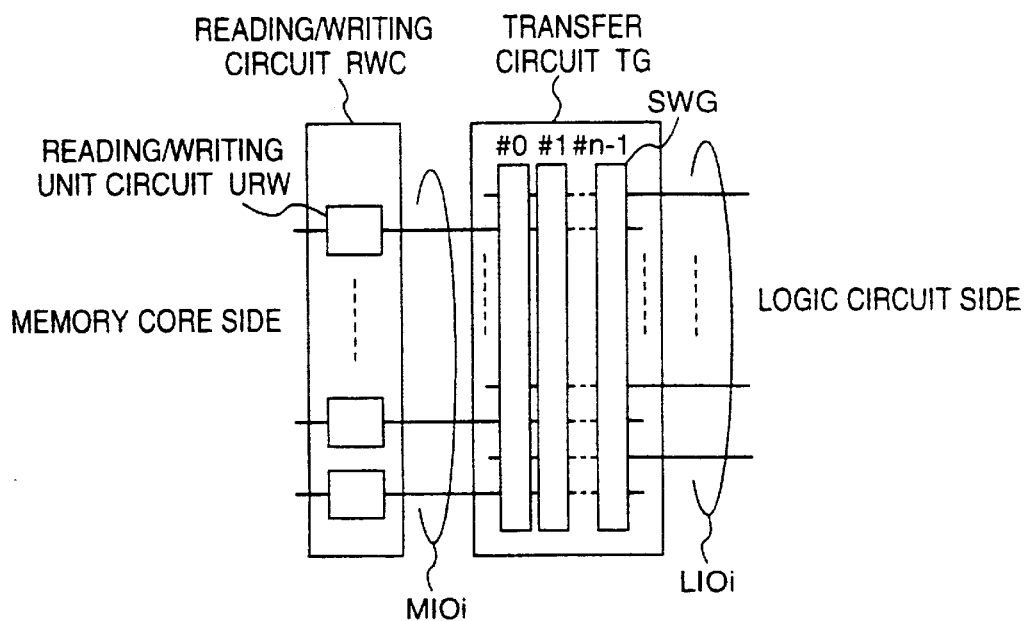
FIGS. 28a and 28b are diagrams showing embodiments which are different in positional relationship between a transfer circuit and a reading/writing circuit.
Figure 28B:
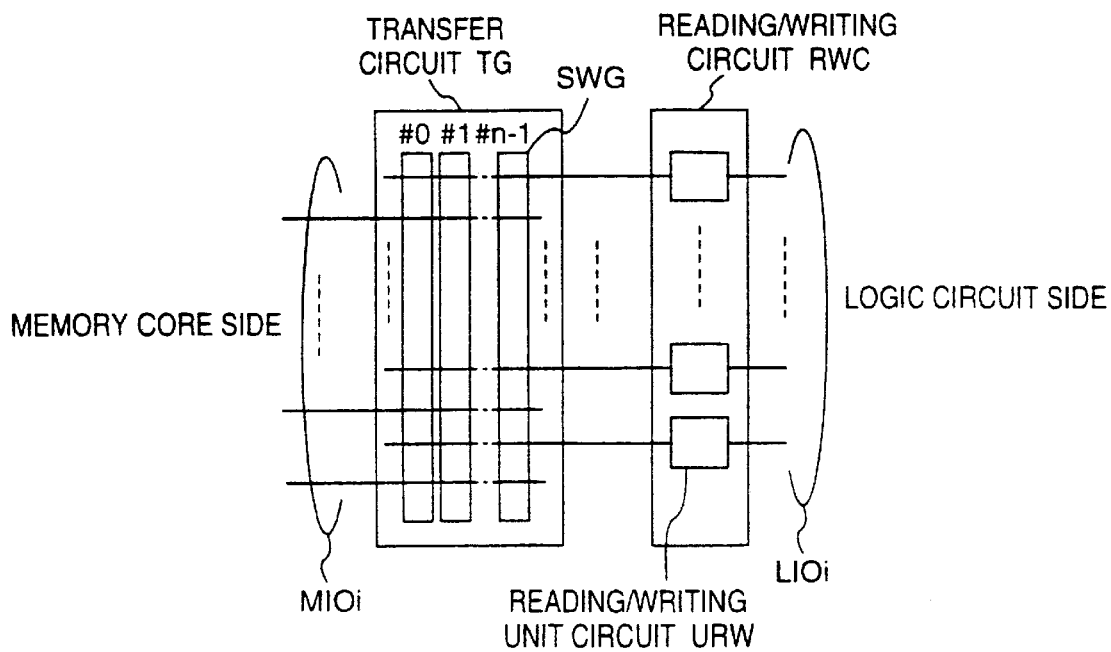

FIG. 28a shows the case where the transfer circuit TG is arranged in the rear stage of the reading/writing circuit RWC for the memory core MR, and FIG. 28b shows the case where TG is arranged in the front stage of RWC.

Such a construction as shown in FIG. 28a can be considered as being suitable for the case where the construction of the transfer circuit TG is complicated so that the wiring capacity in the transfer circuit TG is large. Namely, in the case where the wiring capacity in the transfer circuit TG is large, the direct driving of the transfer circuit TG by a raw signal read from the memory core MR brings about an increase in delay time. However, with the embodiment shown in FIG. 28a, the signal is amplified by a reading/writing unit circuit URW and the transfer circuit TG is driven by the amplified signal. Therefore, it is possible to suppress the increase in delay time.

On the other hand, such a construction as shown in FIG. 28b can be considered as being suitable for the case where the construction of the transfer circuit TG is simple so that the wiring capacity in the transfer circuit TG is small or in the case where the number of I/O lines LIOi of the logic circuit LC is smaller than the number of the I/O lines MIOi of the memory core MR. Namely, with the construction shown in FIG. 28b, there is no fear of the deterioration of the operating speed since the wiring capacity is small. Also, it is possible to reduce the number of reading/writing unit circuits URW in accordance with the smaller number of I/O lines LIOi of the logic circuit LC.

The operation and data transfer pattern of the transfer circuit TG as explained in the above are controlled by the switch group control signal TGCi and the buffer group control signal LIOEi. On the other hand, the memory core MR is also inputted with the control signal MRC for control of the reading/writing. In general, there is an anti-coincidence between a time from the input of the control signal TGCi to the transfer circuit TG until the transfer pattern or operation is determined and a time from the input of the control signal MRC until the reading or writing of data becomes possible. Accordingly, the control circuit LCC shown in FIG. 2 needs to generate the control signal TGCi and the control signal MRC to the transfer circuit TG and the memory core MR with the above difference in time being taken into consideration. A designer may design the control circuit LCC with the time difference taken into consideration each time an individual chip is designed. However, there may be the case where such a consideration is troublesome. In this case, if a latency adjusting circuit for making the synchronization of the control signals TGCi and MRC with each other is prepared in the data base beforehand as a module for the transfer circuit TG or the memory core MR, it is convenient since the addition of the latency adjusting circuit suffices in designing a chip. For example, provided that the control signal TGCi and the control signal MRC are simultaneously inputted to the transfer circuit TG and the memory core MR and a time (or latency) from the determination of a transfer pattern of the transfer circuit TG until the reading or writing of data for the memory core MR becomes possible is 2 clocks, it is only required that an adjusting circuit for delaying the control signal TGCi by 2 clocks should be prepared as a module for the transfer circuit TG beforehand. In this case, when a control signal of the transfer circuit TG and a control signal of the memory core MR are simultaneously generated from the control circuit LCC, it is possible to make the synchronization of both the control signals with each other since the control signal of the transfer circuit TG is delayed by 2 clocks. As will be mentioned in the following embodiment, there may be the case where the latency of a memory macro MMACRO as an embodiment of the memory core MR at the time of reading is different from that at the time of writing. In this case, the delay of the adjusting circuit may be changed over by a read/write change-over signal. In general, a circuit for generating a delay in accordance with clocks can be constructed easily. Therefore, the detailed explanation of the construction of the delay generating circuit will be omitted.

Up to here, the embodiments of the present invention have been explained taking the transfer circuit as the main subject. Next, embodiments of the memory core MR will be mentioned in detail. In FIG. 1, it is assumed that the memory core MR stored in the data base storage device DB includes a plurality of memory cores each of which has a multiplicity of I/O lines and which have different storage capacities. However, it is possible to make the design of a memory/logic mixed chip more flexible by modularizing the memory core MR, as will be mentioned hereinbelow. Embodiments thereof will now be explained. In the following, a memory macro MMACRO as an embodiment of the memory core MR will be explained successively for respective items.

Memory Macro

<1. Construction of Memory Macro and Example of Application of Memory Macro>

Figure 29:
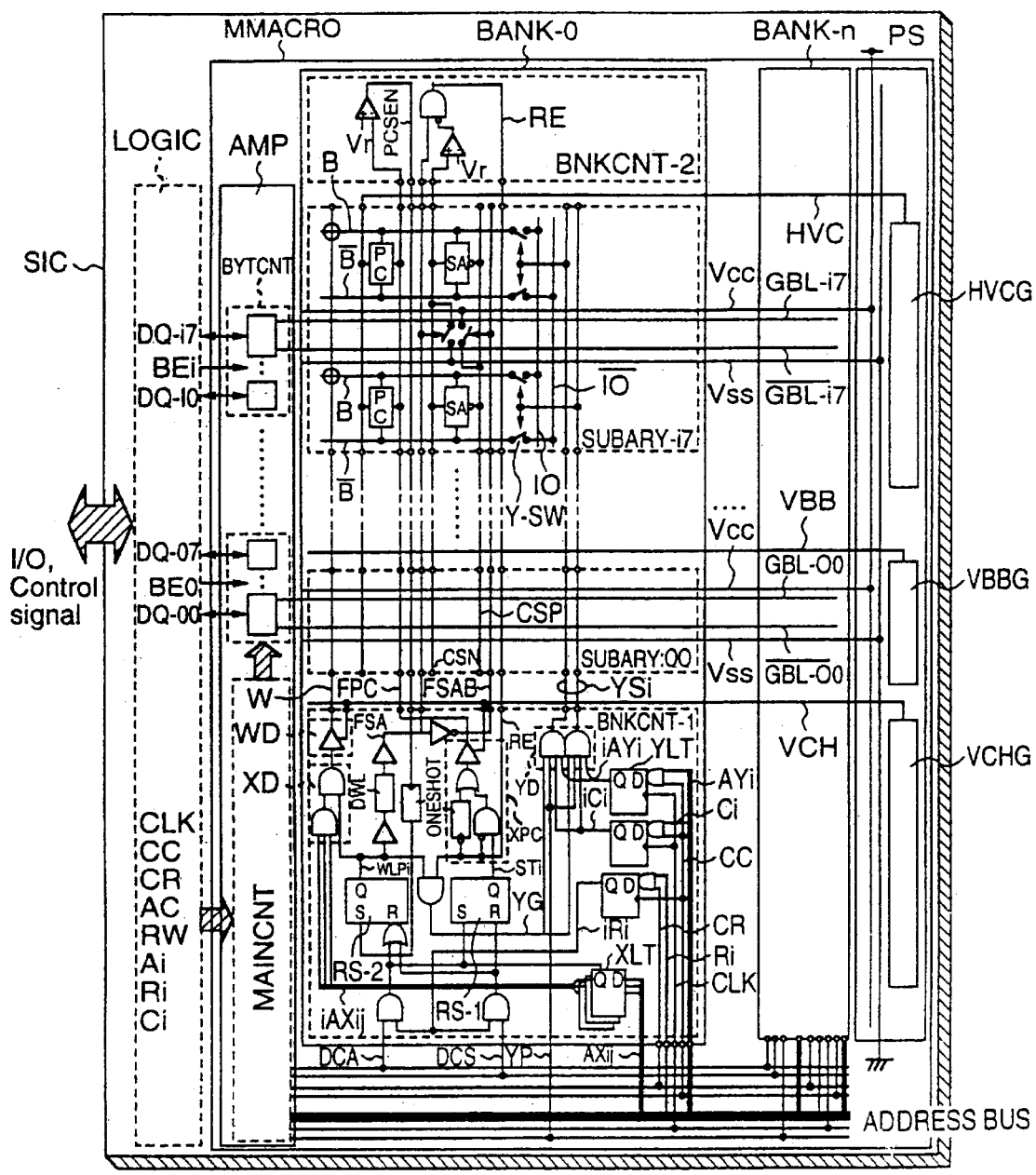
FIG. 29 is a diagram showing the construction of a memory macro and an example of the application thereof to an image processing LSI.

FIG. 29 shows the construction of a memory macro MMACRO and an example of the application of the memory macro MMACRO to an image processing LSI. A semiconductor integrated circuit SIC includes a logic circuit block LOGIC and a memory macro MMACRO formed on one semiconductor substrate made of monocrystalline silicon. Though there is no special limitation, the semiconductor integrated circuit SIC is resin-molded (or sealed in a plastic package). The arrangement and wiring of modules and circuits shown in FIG. 29 generally correspond to the arrangement (or layout) on the semiconductor chip. The logic circuit block LOGIC corresponds to the logic circuits LC, the transfer circuits TG and the control circuit CC of LSI-A or LSI-B shown in FIG. 1.

<1.1 Construction of Memory Macro>

The feature of the memory macro MMACRO lies in that the memory macro MMACRO is constructed by plural kinds of modules which have different functions. The memory macro MMACRO is composed of three kinds of modules including a plurality of bank modules BANK (BANK-0 to BANK-n) arranged in the lateral direction of FIG. 29, an amplifier module AMP provided in common to the plurality of bank modules, and a power supply module PS provided in common to the plurality of bank modules.

The bank module BANK includes a plurality of submemory cell arrays SUBARY (SUBARY-00 to SUBARY-i7) which are arranged in the longitudinal direction of FIG. 29, and a bank control circuit BNKCNT-1 and a bank control circuit BNKCNT-2 each of which is provided in common to the plurality of submemory cell arrays.

Though there is no special limitation, the submemory cell array SUBARY is a so-called dynamic memory which uses a so-called dynamic memory cell including an information storing capacitor and an address selecting MOS transistor as a memory cell. The submemory cell array SUBARY is composed of a plurality of pairs of bit lines B, $\overline{B}$, a plurality of word lines W (only one thereof being shown in FIG. 29 for avoiding the complication of illustration and facilitating the understanding), a plurality of memory cells (represented by circle symbol in FIG. 29), a bit line precharge circuit PC for turning the potential of the bit line to a predetermined level before the reading of data from the memory cell, a sense amplifier SA for amplifying a signal from the memory cell, a Y selecting circuit (or Y switch Y-SW) for selecting one of the plural pairs of bit lines B and $\overline{B}$, and global bit lines GBL and $\overline{GBL}$ for connecting the selected bit lines B and $\overline{B}$ to the amplifier module AMP. Though there is no special limitation, the submemory cell array SUBARY takes a construction having a one-to-one correspondence to the unit of division of I/O lines in the bank module BANK. There may be the case where a structure including the plurality of pairs of bit lines B and $\overline{B}$, the plurality of word lines W and the plurality of memory cells is usually termed memory cell array. In the present application, the proper use of terms will be made, as required.

The bank control circuit BNKCNT-1 includes an X decoder (or row decoder) XD for selecting a word line W, a Y decoder (or column decoder) YD for selecting a pair of bit lines B and $\overline{B}$, and so forth. The bank control circuit BNKCNT-1 receives an bank address and control signals (as will be mentioned later on) to automatically generate signals necessary for a series of memory cell read operations including bit line precharge, word line selection, sense amplifier activation, and so forth. One word line W is selected by the X decoder XD, and (8×i) pairs among (n×8×i) pairs of bit lines B and /B intersecting the selected word line W are selected by a column address selection signal YSi which is an output signal of the Y decoder YD. (Though the case of n=2 is shown in FIG. 29 in connection with the size of the drawing, n is 8 in the present embodiment.) The selected pair of bit lines B and $\overline{B}$ make the transfer of data for the amplifier module AMP through the global bit lines GBL and $\overline{GBL}$ arranged in parallel to the bit lines B and $\overline{B}$.

The bank control circuit BNKCNT-2 includes a sensor group for detecting whether or not a sense amplifier control signal reaches a certain level.

The amplifier module AMP is composed of a main control circuit MAINCNT for supplying control signals, address signals and so forth to the bank modules BANK in synchronism with a clock signal, and a byte control circuit BYTCNT for controlling the reading/writing of data for the bank module group (BANK-0 to BANK-n). (8×i) data input/output lines DQ (DQ00, ---, DQ07, ---, DQi0, ---, DQi7) from the exterior of the memory macro MMACRO are inputted through the amplifier module AMP to the memory cells. A byte control signal BEi is a signal for opening and closing the data input/output lines DQ in units of one byte. The data input/output lines DQ correspond to the data transmission lines (or I/O lines) shown in FIG. 1 and the I/O lines MIOi shown in FIG. 2.

The power supply module PS is a module for generating various voltages of a VHC generating circuit VCHG for generating a word line voltage VCH (higher than a power supply voltage VCC) necessary for a word line driving circuit WD and supplied to the bank module BANK, a bit line precharge voltage generating circuit HVCG for generating a voltage HVC (equal to one half of the power supply voltage VCC) necessary for bit line precharge, an in-array substrate voltage generating circuit VBBG for generating an in-array substrate voltage (or back bias voltage) VBB (lower than a power supply voltage VSS (or a ground potential)), and so forth. In the case where it is desired to make an operating voltage lower than an external voltage for the purposes of the reduction of current consumption and the improvement in reliability of the device, a step-down circuit can be incorporated in the power supply module PS.

Control signals and address signals necessary for the bank modules BANK are common to each bank module BANK and are extended as one kind of bus in the bit line direction along the lower side of the bank module BANK. Accordingly, these control signals and address signals may be included in the bank modules BANK. Namely, each bank module BANK can take a cell structure, inclusive of the control signals and address signals, which is the same in terms of distinction on design.

However, a row-related bank address Ri and column-related bank address Ci are signals peculiar to each bank module BANK and are therefore required by the number of bank modules BANK. In order that each bank module BANK takes the same cell inclusive of the wirings of the row-related bank address Ri and the column-related bank address Ci, a simple method can use a construction in which the wirings of the row-related bank address Ri and the column-related bank address Ci are inputted from the lower side or upper side of the memory macro MMACRO shown in FIG. 29.

Figure 44A:
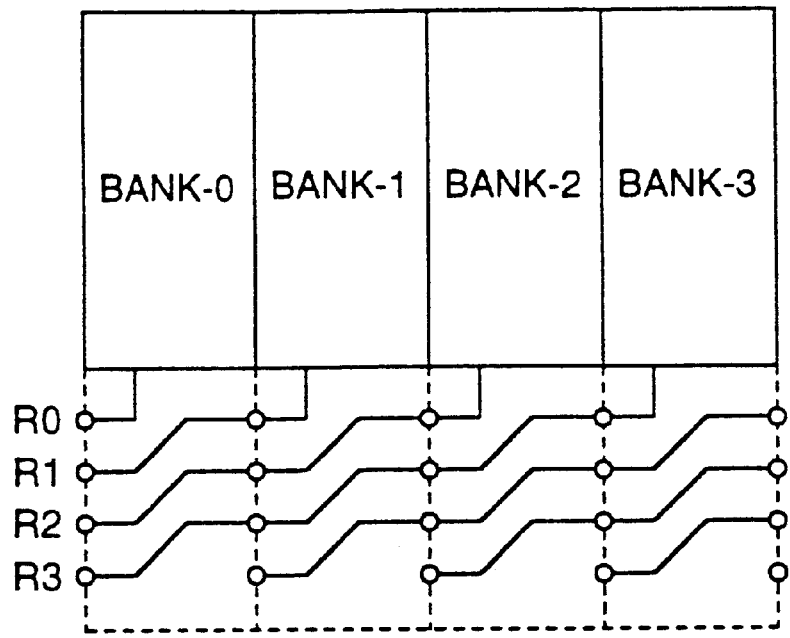
FIGS. 44a and 44b are diagrams showing examples of the wiring layout of bank addresses of the memory macro.
Figure 44B:
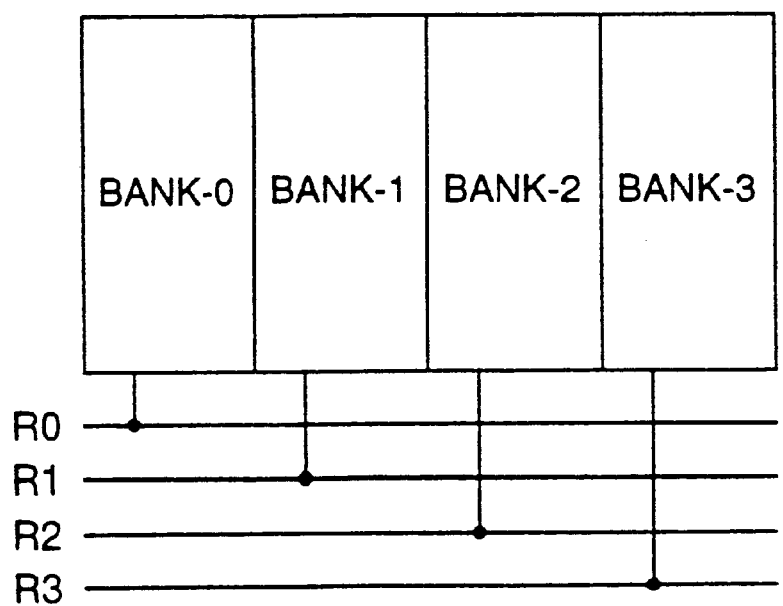

On the other hand, in order to facilitate an interface for the logic circuit block LOGIC, all signal lines for control signals, address signals and data input/output lines DQ to the memory macro MMACRO may be concentrated on one side (the left side in FIG. 29) of the cell. Accordingly, in order to input the wirings of row-system bank addresses Ri and column-system bank addresses Ci from the left side of the memory macro MMACRO shown in FIG. 29, the wirings may be laid out, as shown in FIG. 44a. In the case where there is no need to provide the same cell inclusive of wirings, the wirings may be laid out, as shown in FIG. 44b.

The height of the cell of each of the bank module BANK, the amplifier module AMP and the power supply module PS or the width thereof in the longitudinal direction in FIG. 29 is made the same, and the global bit lines GBL and $\overline{GBL}$, power supply lines Vcc and Vss, and so forth are arranged at the same pitch.

Thereby, a desired memory macro module can be completed by merely arranging the bank modules BANK by a required number in the bit line direction in accordance with a storage capacity required by the system and arranging the amplifier module AMP and the power supply module PS on the left and right sides of the bank module group, respectively.

Though there is no special limitation, the bank module BANK in the embodiment of the present invention has a construction in which 256 word lines (eight X addresses) are provided, (8×8×i) pairs of bit lines intersect one word line, and one eighth of the bit line pairs (three Y addresses) are selected by the Y decoder so that (8×i) pairs of global bit lines are inputted and outputted with data. Here, i is, for example, 16. Corresponding to this, one bank module BANK is constructed such that it has a 256K(K=1024)-bit capacity and data is inputted and outputted with a 128-bit width. Namely, there is obtained a memory macro module the capacity of which is variable in units of 256K bits.

According to this, for example, a 1M(M=1048576)-bit memory macro is constructed by four bank modules and a 2M-bit memory macro is constructed by eight bank modules. Namely, there is constructed a memory macro the capacity of which is increased not by every four times such as 256K bits, 1M bits, 4M bits, 16M bits and so forth as in the conventional general purpose dynamic RAM (DRAM) but as required by applications.

<1.2 Operation Modes of Memory Macro>

Figure 30:
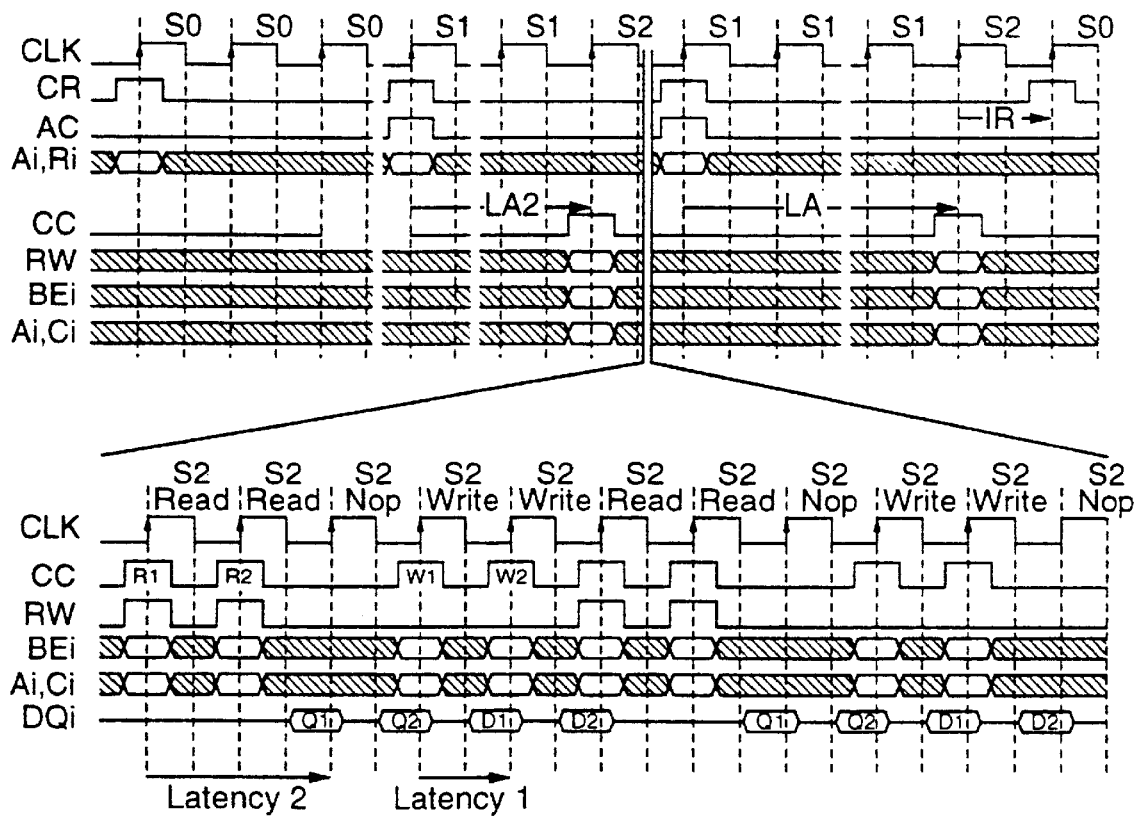
FIG. 30 is a diagram showing a relationship between external control signals of the memory macro and operation modes thereof.

A relationship between the external signals and the operation modes of the memory macro MMACRO is shown in FIG. 30. The memory macro MMACRO is inputted/outputted with data, inputted with an address and inputted with control signals in synchronism with a clock signal CLK. Here, Ai is an address signal. The address signal Ai includes an X address AXij inputted to the X decoder XD and a Y address AYi inputted to the Y decoder YD. Accordingly, the memory macro MMACRO takes not an address multiplex system as in the conventional general purpose DRAM in which an X-related or row-related address signal and a Y-related or column-related address signal are multiplexed, but an address non-multiplex system.

A row-system bank address Ri and a column-system bank address Ci for selecting a bank module BANK are signals peculiar to each bank module BANK in accordance with the variability of the number of bank modules. A distinction between row-system and column-system command signals in the same bank module BANK is made by the row-system bank address Ri and the column-system bank address Ci. There are four control signals CR, CC, RW and AC. DQij is an I/O signal for input/output. A byte control signal BEi is a signal for controlling the data input/output lines independently for each byte. With the byte control signal BEi, the amount of data read or written in parallel can be increased and decreased in a range from 1 byte to i bytes at the maximum.

The activation (bank active) and closing (bank close) of the bank module BANK are made by taking in CR, AC and the address signal Ai by virtue of the rising edge of the clock signal CLK. The bank module BANK is made active when CR="H" (high level) and AC="H" and is closed when CR="H" and AC="L" (low level). At this time, it is with regard to only the row system which the address signal Ai is taken in. A bank module BANK is selected by such a row-system bank address Ri and a word line W is selected by the address signal Ai. A timing or status S0 shown in FIG. 30 indicates a close status of the bank module BANK. A status S1 indicates an active status of the bank module BANK. Also, a status S2 indicates a read or write status.

Reference symbol LA2 shown in FIG. 30 indicates the number of clocks from the input of a bank module BANK active command until the input of a read or write command becomes possible. Symbol LA represents the number of clocks from the change of an X address in the same activated bank module BANK until the input of a read or write command becomes possible. Symbol LR represents the number of clocks from the input of a read or write command until the input of a bank module BANK close command becomes possible.

The lower portion of FIG. 30 shows a timing chart concerning the column-system control signals and the operation modes. Herein, CC, BEi, RW and a column-system address signal (or the remaining portion of the above-mentioned address signal Ai and a column-system bank address Ci) are taken in by virtue of the rising edge of the clock signal CLK to control the reading/writing. In the present embodiment, the number of clocks from the reception of a read command until the output of data (or a read latency) is 2, and a latency from the reception of a write command until the input of writing data (or a write latency) is 1. When the continuous (or consecutive) reading or the continuous writing or making a change from the writing to the reading is thereafter performed, the column-system control signal can be inputted with no wait or without passing through a no-operation status (Nop status). However, when a change from the reading to the writing is to be made, it is required that the state should be turned to a no-operation status once. It is not always that the above-mentioned latency is optimum. The latency can be properly changed in accordance with the construction of the system.

Up to here, attention has been directed to only the same bank in order to simplify the explanation. In the same bank, it is required that the read/write operation should be performed with a wait of a certain fixed time taken after the activation of the bank. However, if attention is directed to a plurality of banks, it is possible to perform the bank activation and the read/write operation simultaneously. For example, if an active command (CR, AC, Ri) is inputted to the i-th bank and a read/write command (CC, Cj) is inputted at the same time to the j-th bank having already been activated, it is possible to perform the activation of the i-th bank and the reading/writing from or into the j-th bank simultaneously. With this construction, a data waiting time of the logic section is reduced, thereby making it possible to perform a data processing at a high speed. Also, it is possible to activate all banks and to thereafter input a read/write command to any bank. With this construction, data extending over a plurality of different banks can be outputted in consecutive cycles, thereby making it possible to a more complicated operation at a high speed.

Figure 45:
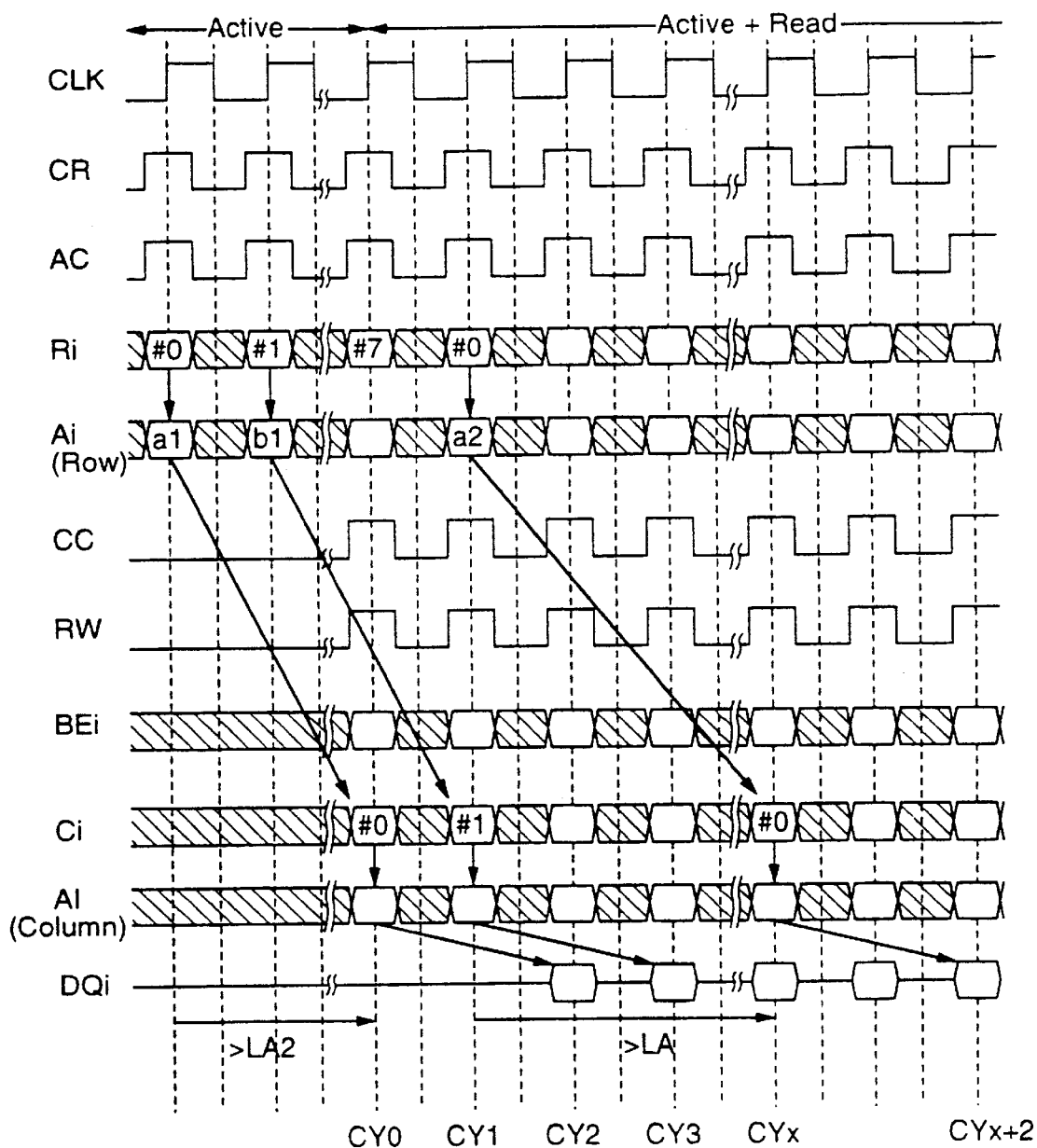
FIG. 45 shows a timing chart in the case where data of different bank modules of the memory macro are consecutively read.

As an example of the above-mentioned operation using a plurality of banks in the same memory macro MMACRO, FIG. 45 shows a timing chart in the case where data of different banks are consecutively read. Though the explanation made herein concerns the case where there are eight bank modules in the same memory macro MMACRO, the similar holds for the case where the number of bank modules is not 8. Also, the explanation will be made in conjunction with a read operation. However, even in the case of a write operation or in the case where the read and write operations are mixed, a timing chart can be produced readily on the basis of the contents of the foregoing explanation.

In eight cycles at the beginning in FIG. 45, bank active commands are inputted so that eight banks (#0 to #7) are activated in order. This corresponds to a portion represented by "Active" in FIG. 45. Namely, commands (CR, AC) and a row-system address Ai for selecting a word line are inputted while a row-system bank address Ri is changed over.

Starting from a cycle CY0 after the lapse of a time equal to or longer than an interval LA2 from the activation of the bank #0, read commands are inputted so that the reading is performed in the order of the banks #0, #1, --- , #7. This corresponds to a portion represented by "Active+Read" in FIG. 45. Namely, commands (CC, RW, BEi) and a column-system address Ai for selecting a data line are inputted while a column-system bank address Ci is changed over. In the shown example, it is assumed that LA2 is smaller than 7 clocks. In the cycle CY0, therefore, it becomes possible to input a bank active command to the bank #7 while inputting a read command to the bank #0 at the same time.

Subsequently, in order from a cycle CY2 after the lapse of a read latency or 2 cycles from the cycle CY0, data of different banks are outputted in the consecutive cycles. Now directing attention to a cycle CY1, it is seen that a read command is inputted to the bank #1 while a bank active command is inputted to the bank #0 again so that the row-related address Ai is changed over from a1 to a2. Thus, it is possible to input a read command to one bank while changing over the row-related address Ai of another bank for which the input of a read command has already been completed.

Subsequently, when a read command is inputted to the bank #0 in a cycle CYx after the lapse of a time equal to or longer than an interval LA from the input of the bank active command, data of the bank #0 corresponding to the row-related address a2 is outputted in a cycle CYx 2. By simultaneously and consecutively performing the bank activation and the read operation as mentioned above, it is possible to read data of a plurality of banks for the consecutive cycles while changing over the row-related and column-related addresses and the byte control signal. The reason why the bank activation and the read operation or the write operation are thus performed simultaneously, is that row-related addresses and column-related address of the bank address is provided in a multiple fashion. Thereby, it becomes possible to allow a row-system bank address Ri to designate a bank address to be activated while allowing a column-system bank address Ci at the same time to designate a bank address to be accessed.

As apparent from the above-mentioned operation, the present embodiment makes it possible to access data of different row-related addresses without interruption if banks are different. Accordingly, if pixel information is stored in the memory macro MMACRO, it becomes possible to perform the reading or writing for a screen area such as rectangle or triangle or a "screen clear" processing (or the writing of a fixed value) at a high speed. Therefore, the present embodiment is very effective for various image filtration processings, the search of motion vector, the drawing of line or curve, or a drawing processing in computer graphics.

<1.3 Sense Amplifier and Bit Line Precharge Circuit>

Figure 31:
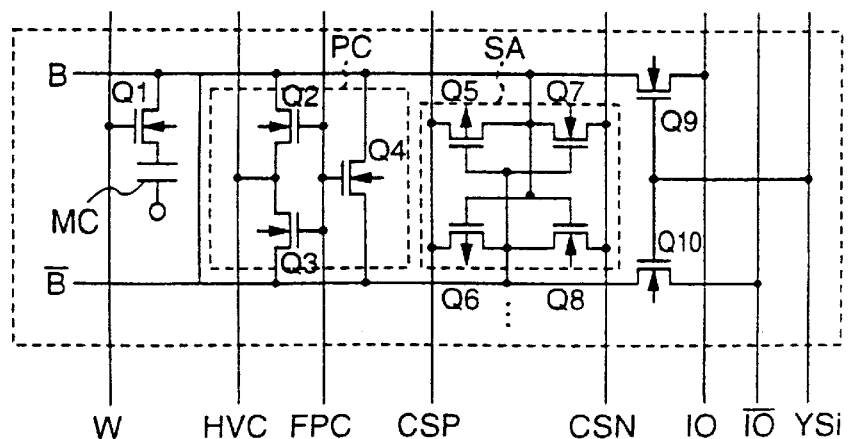
FIG. 31 is a diagram showing an example of a sense amplifier and a precharge circuit in the memory macro.

FIG. 31 shows a circuit example of the sense amplifier SA and the precharge circuit PC in a portion of the bank module BANK corresponding to one pair of bit lines. Reference symbols Q1, Q2, Q3, Q4, Q7, Q8, Q9 and Q10 denote N-channel MOS (N-MOS) transistors. Symbols Q5 and Q6 denote P-channel MOS (P-MOS) transistors. In the present example, a memory cell includes a dynamic memory cell composed of one transistor (Q1) and one capacitor (MC), as mentioned above. Herewith, there are used a bit line precharge circuit PC and a CMOS cross-coupled dynamic sense amplifier SA. In the bit line precharge circuit PC, when a bit line precharge signal FPC assumes a high level, the N-MOS transistors Q2 and Q3 are turned on so that bit lines B and $\overline{B}$ are precharged by a voltage HVC. Also, the N-MOS transistor Q4 is turned on so that the bit lines B and $\overline{B}$ are equalized. The CMOS cross-coupled dynamic sense amplifier SA operates when a P-channel sense amplifier common driving line CSP assumes a high level and an N-channel sense amplifier common driving line CSN assumes a low level. Namely, an inverter circuit is formed by the P-MOS transistor Q5 and the N-MOS transistor Q7 and an inverter circuit is formed by the P-MOS transistor Q6 and the N-MOS transistor Q8. The N-MOS transistors Q9 and Q10 form a column switch so that when a column address selection signal YSi assumes a high level, the bit lines B and $\overline{B}$ are connected to the input/output lines IO and IOB of a submemory array. A read/write operation is the same as that in an ordinary general purpose DRAM.

<1.4 Bank Control Circuit>

Figure 32:
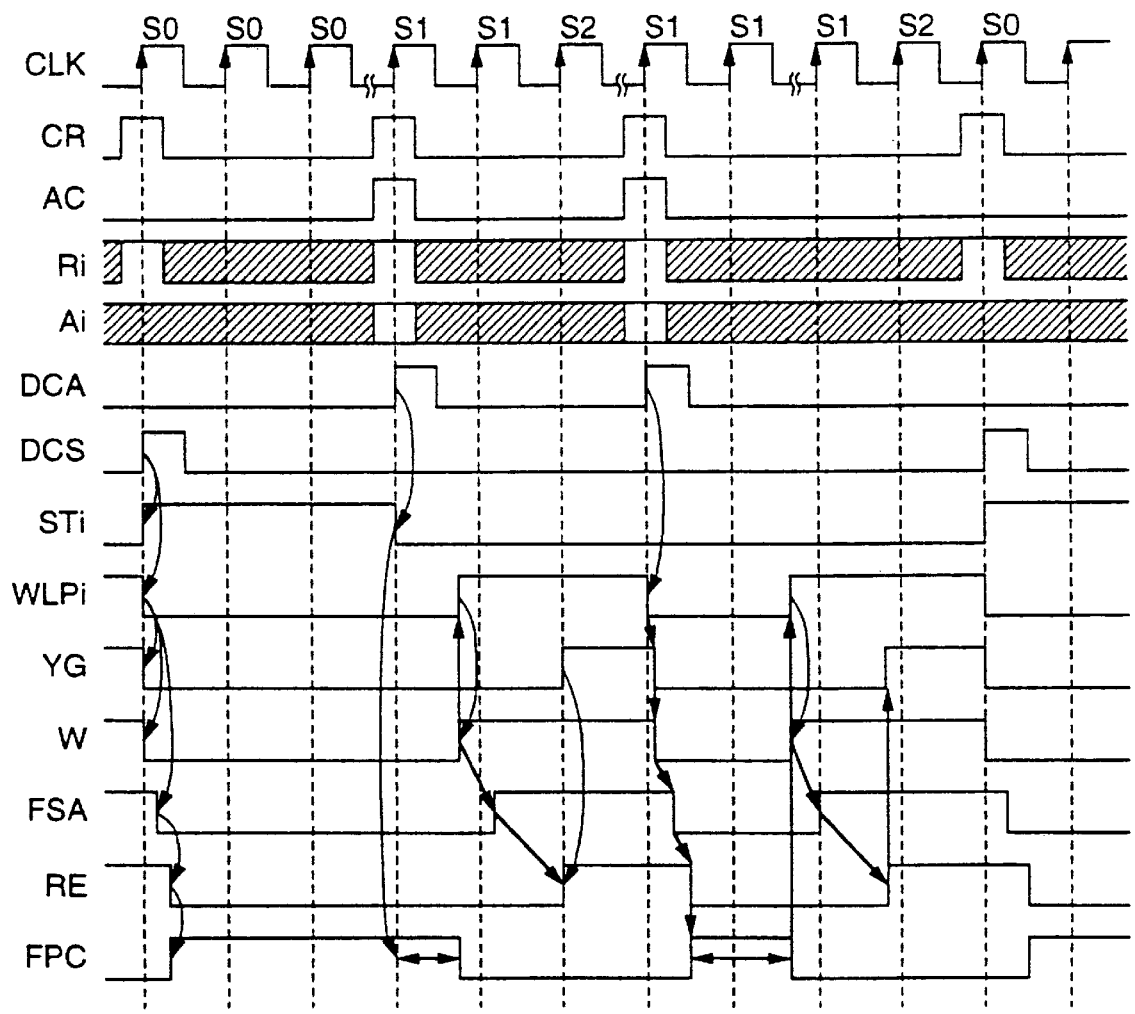
FIG. 32 shows a timing chart of the operation of a bank control circuit of the memory macro.

FIG. 32 shows the operation waveforms of the bank control circuit BNKCNT-1 in the embodiment shown in FIG. 29. The feature of the bank control circuit BNKCNT-1 lies in that it receives a row-system bank address Ri and control signals CR and AC to automatically generate signals necessary for a series of memory cell read operations including bit line precharge, word line selection, sense amplifier activation, and so forth. Namely, the control is performed in an eventdriven fashion. In the following, the operation will be explained.

(1) In Case of Bank Module BANK Close

First, consider the case of the closing of a bank module BANK when CR="H", AC="L" and Ri="H". When a clock signal CLK rises under the condition of CR="H" and AC="L", a bank close flag DCS rises in the main control circuit MAINCNT. The bank close flag DCS is inputted to each bank module BANK. At this time, a row-related bank selection signal iRi rises in a bank module BANK having the row-related bank address Ri="H". Since a logical product of the row-related bank selection signal iRi and the bank close flag DCS is inputted to a set terminal S of a set/reset flip-flop RS-1, an output STi of the set/reset flip-flop RS-1 of the bank module BANK having the row-related bank address Ri="H" is turned to "H".

On the other hand, since the result of logical product is inputted to a reset terminal R of another set/reset flip-flop RS-2 through a logical sum circuit, an output WLPi thereof is turned to "L". With the turn of WLPi to "L", an output of the X decoder XD and a gate signal YG of the Y decoder YD in the bank control signal BNKCNT-1 are first turned to "L" and an output of the word line driver WD (or a word line W) is subsequently turned to "L", thereby disconnecting memory cells from bit lines B and $\overline{B}$.

Next, an N-channel sense amplifier activating signal FSA is turned to "L" and a P-channel sense amplifier activating signal FSAB is turned to "H", so that the operation of the sense amplifier SA is stopped. A dummy word line DWL is a delay element having the same delay time as that of the word line W. The provision of the dummy word line DWL makes it possible to stop the sense amplifier SA after the level of the word line W becomes sufficiently low. This is because the signal level of the bit lines B and $\overline{B}$ and hence the level of rewriting to the memory cell are prevented from being lowered due to the stop of the sense amplifier SA.

Subsequently, a level sense circuit provided in the bank control circuit BNKCNT-2 at the upper portion of the bank module BANK detects "L" of the N-channel sense amplifier activating signal FSA to provide an output RE which is turned to "L". This signal RE is inputted to a precharge signal generating circuit XPC in the bank control circuit BNKCNT-1 provided at the lower portion of the bank module BANK so that a bit line precharge signal FPC as an output of the circuit XPC is turned to "H". The bit line precharge signal FPC is inputted to the precharge circuit PC provided for the bit lines B and $\overline{B}$ so that the bit lines B and $\overline{B}$ take a precharge status. A series of states up to here are called S0.

(2) In Case where Bank Module BANK Turns from Status S0 to Active Status

Next, consider the case where the bank module BANK turns from the status S0 to an active status in which CR="H", AC="H" and Ri="E". When the clock signal CLK rises under the condition of CR="H" and AC="H", a bank active flag DCA rises in the main control circuit MAINCNT. The bank active flag DCA is inputted to each bank module BANK. At this time, a row-related bank selection signal iRi rises in a bank module BANK having the row-related bank address Ri="H". Since a logical product of the row-related bank selection signal iRi and the bank active flag DCA is inputted to a reset terminal R of the set/reset flip-flop RS-1, the output STi of the set/reset flip-flop RS-1 of the bank module BANK having the row-related bank address Ri="H" is turned to "L".

The logical product of the row-related bank selection signal iRi and the bank active flag DCA is also inputted to an X address latch circuit XLT. The X address latch circuit XLT takes in an X address AXij in a period of time when the logical product is "H" and latches it when the logical product is "L". The output STi of the set/reset flip-flop RS-1 is inputted to the precharge signal generating circuit XPC to turn its output or bit line precharge signal FPC to "L". The bit line precharge signal FPC reaches the level sense circuit in the bank control circuit BNKCNT-2 while releasing the precharge of the bit lines B and B̄. When the level of the bit line precharge signal FPC becomes lower than a certain fixed value, an output PCSEN of the level sense circuit is turned to "H". The signal PCSEN is converted by a one-shot pulse generating circuit ONESHOT in the bank control circuit BNKCNT-1 into a narrow pulse having a width of several nanoseconds and is thereafter inputted to an S input terminal of the set/reset flip-flop RS-2. As a result, the output WLPi of the set/reset flip-flop RS-2 is turned to "E". With the turn of WLPi to "H", the output of the X decoder XD selected by the X address AXij is first turned to "H" and the output of the word line driver WD connected to the X decoder XD (or the word line W) is subsequently turned to "E", thereby connecting memory cells to the bit lines B and B̄.

Next, the N-channel sense amplifier activating signal FSA is turned to "H" and the P-channel sense amplifier activating signal FSAB is turned to "L", so that the sense amplifier SA starts its operation. With the provision of the dummy word line DWL, it is possible to operate the sense amplifier SA after the level of the word line W becomes sufficiently high so that a sufficient signal appears onto the bit lines B and B̄. This is because the sense amplifier SA is prevented from erroneously operating or from operating while the signal is small. Subsequently, the level sense circuit provided in the bank control circuit BNKCNT-2 at the upper portion of the bank module BANK detects "L" of the N-channel sense amplifier activating signal FSA (or the common driving line CSN of the sense amplifier SA on the N-MOS transistor side). As a result, the output RE of the level sense circuit is turned to "H". The signal RE is subjected to logical product with WLPi by a logical product circuit in the bank control circuit BNKCNT-1 provided at the lower portion of the bank module BANK so that an output YG of the logical product circuit is turned to "H". This output YG enables the Y decoder circuit YD. A series of states up to here are called S1. After the above operation, the bank module BANK turns to a status in which the reading and writing are possible. This status is called S2.

(3) In Case where Bank Module BANK Turns from Status S1 to Active Status

Next, consider the case where the bank module BANK turns from the status S1 to an active status in which CR="H", AC="H" and Ri="H". When the clock signal CLK rises under the condition of CR="H" and AC="H", the bank active flag DCA rises in the main control circuit MAINCNT. The bank active flag DCA is inputted to each bank module BANK. At this time, a row-related bank selection signal iRi rises in a bank module BANK having the row-related bank address Ri="H". Though a logical product of the row-related bank selection signal iRi and the bank active flag DCA is inputted to the reset terminal R of the set/reset flip-flop RS-1, the output STi of the set/reset flip-flop RS-1 remains unchanged since it has already been turned to "L" in the preceding cycle. The logical product of the row-related bank selection signal iRi and the bank active flag DCA is also inputted to the X address latch circuit XLT. The X address latch circuit XLT takes in an X address AXij in a period of time when the logical product is "H" and latches it when the logical product is "L".

The output of the logical product circuit is also inputted to the R terminal of RS-2 through a logical sum circuit to turn WLPi to "L". With the turn of WLPi to "L", it is in a sequence similar to that in S0 which the voltages of the word line W and the N-channel sense amplifier activating signal FSA are turned to "L" and RE is turned to "L". With the turn of RE to "L", a one-shot pulse generating circuit ONESHOT in the precharge signal generating circuit XPC generates a pulse having a width on the order of ten and several nanoseconds. This pulse is inputted to a driving circuit of the precharge signal generating circuit XPC so that a bit line precharge signal FPC of "H" is outputted with the width of the inputted pulse. This signal FPC reaches the level sense circuit in the bank control circuit BNKCNT-2 while precharging bit lines B and B̄. When the level of the bit line precharge signal FPC becomes lower than a certain fixed value, an output PCSEN of the level sense circuit is turned to "H". This signal is converted by the one-shot pulse generating circuit ONESHOT in the bank control circuit BNKCNT-1 into a pulse having a narrow width and is thereafter inputted to the S input terminal of the set/reset flip-flop RS-2. As a result, the output WLPi of the set/reset flip-flop RS-2 is turned to "H". With the turn of WLPi to "H", the output of the X decoder XD selected by the X address AXij is first turned to "H" and the output of the word line driver WD connected to the X decoder XD (or the word line W) is subsequently turned to "H", thereby connecting memory cells to the bit lines B and B̄.

Next, the N-channel sense amplifier activating signal FSA is turned to "H" and the P-channel sense amplifier activating signal FSAB is turned to "L", so that the sense amplifier SA starts its operation. The subsequent operation is the same as that in the above-mentioned status S1. Namely, the level sense circuit provided in the bank control circuit BNKCNT-2 at the upper portion of the bank module BANK detects "L" of the N-channel sense amplifier activating signal FSA (or the common driving line CSN of the sense amplifier on the N-MOS transistor side). As a result, the output RE of the level sense circuit is turned to "H". The signal RE is subjected to logical product with WLPi by the logical product circuit in the bank control circuit BNKCNT-1 provided at the lower portion of the bank module BANK so that the output YG of the logical product circuit is turned to "H". This output YG enables the Y decoder circuit YD. After the above operation, the bank module BANK turns to a state S2 in which the reading and writing are possible.

<1.5 Byte Control Circuit>

Figure 33:
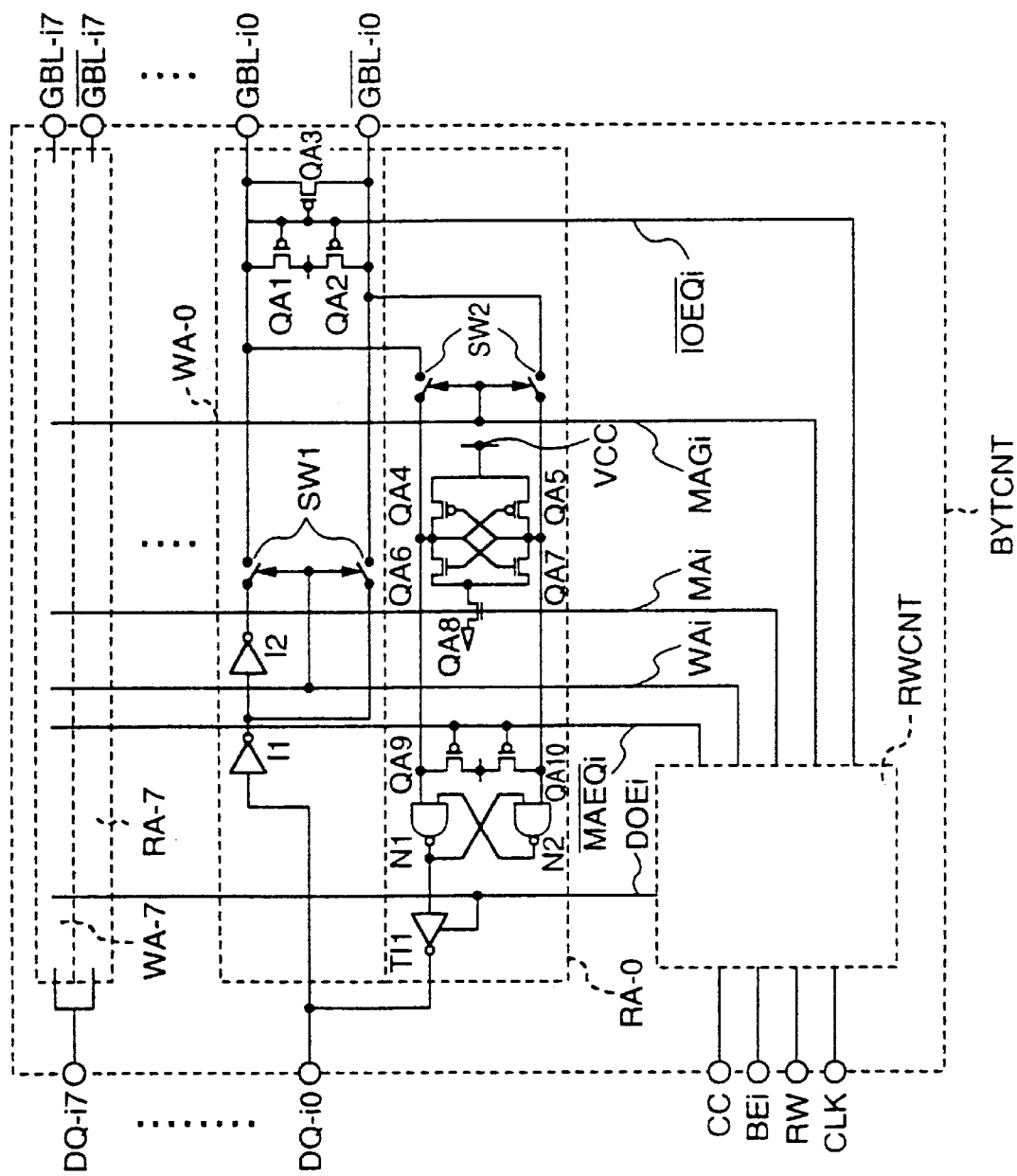
FIG. 33 is a diagram showing an example of a byte control circuit of the memory macro.

Next, the operation of the column system will be explained. FIG. 33 shows an example of the byte control circuit BYTCNT. The amplifier module AMP shown in FIG. 29 has i byte control circuits BYTCNT therein.

In FIG. 33, reference symbols WA-0 to WA-7 denote writing circuits and symbols RA-0 to RA-7 denote reading circuits (or main amplifiers). Eight such writing circuits WA and eight such reading circuits RA are arranged in the byte control circuit BYTCNT. Writing data inputted from DQ-i0 is transmitted to global bit lines GBL-i0 and $\overline{\text{GBL}}$-i0 through inverters I1 and I2 and a switch SW1 which act as an input buffer. Since the global bit lines GBL-i0 and $\overline{\text{GBL}}$-i0 are connected to divisional input/output lines IO and $\overline{\text{IO}}$ in each bank module BANK, as shown in FIG. 29, the data is transmitted to the input/output lines IO and IOB and is then transmitted to bit lines B and $\overline{\text{B}}$ through a Y switch Y-SW and further to a memory cell. The switch SW1 is provided for bringing the global bit lines GBL-i0 and $\overline{\text{GBL}}$-i0 into a high impedance status at the time of reading. Namely, the switch SW1 disconnects the global bit lines GBL-i0 and $\overline{\text{GBL}}$-i0 from the inverters I1 and I2 at the time of reading. The switch SW1 is controlled by a write enable signal WAi.

Data read from the memory cell is transmitted from the input/output lines IO and IOB in each bank module BANK to a main amplifier through the global bit lines GBL-i0 and $\overline{\text{GBL}}$-i0 and a switch SW2. The main amplifier includes MOS transistors QA4 to QA8. The main amplifier is a drain input type dynamic amplifier. An input node of the main amplifier is precharged to VCC before a signal is read from the global bit lines GBL-i0 and $\overline{\text{GBL}}$-i0. When the signal is transmitted, a voltage difference appears between two input terminals of the main amplifier and a main amplifier enable signal MAi activates the main amplifier which in turn amplifies the voltage difference. The switch SW2 connects the global bit lines GBL-i0 and $\overline{\text{GBL}}$-i0 and the main amplifier till a point of time immediately before the main amplifier operates, and the switch SW2 disconnects them when the main amplifier is operating. This is made in order to reduce a load capacitance at the time of amplification by the main amplifier, thereby enabling a high-speed operation. The switch SW2 is controlled by a read enable signal MAGi. The signal amplified by the main amplifier is inputted to a latch circuit of NAND gates N1 and N2 at the next stage and is then outputted to the terminal DO-i0 through a buffer amplifier TI1.

An output buffer enable signal DOEi makes a change-over of the output of the output buffer circuit TI1 between a high impedance and a low impedance. At the time of writing, the output of the output buffer circuit TI1 is turned to the high impedance. P-MOS transistors QA1 to QA3 form a precharge circuit for the global bit lines GBL-i0 and $\overline{\text{GBL}}$-i0, and P-MOS transistors QA9 and QA10 form a precharge circuit for the main amplifier. These precharge circuits are controlled by a global bit line precharge control signal $\overline{\text{IOEQi}}$ and a main amplifier precharge control signal $\overline{\text{MAEQi}}$, respectively. Also, the above-mentioned control signals, that is, the global bit line precharge control signal IOEQiB, the read enable signal MAGi, the main amplifier enable signal MAi, the write enable signal WAi, the main amplifier precharge control signal $\overline{\text{MAEQi}}$ and the output buffer enable signal DOEi are all generated by external signals CC, BEi, RW and CLK in a read/write control circuit block RWCNT. The read/write control circuit block RWCNT is provided for each byte control circuit BYTCNT.

Figure 34:
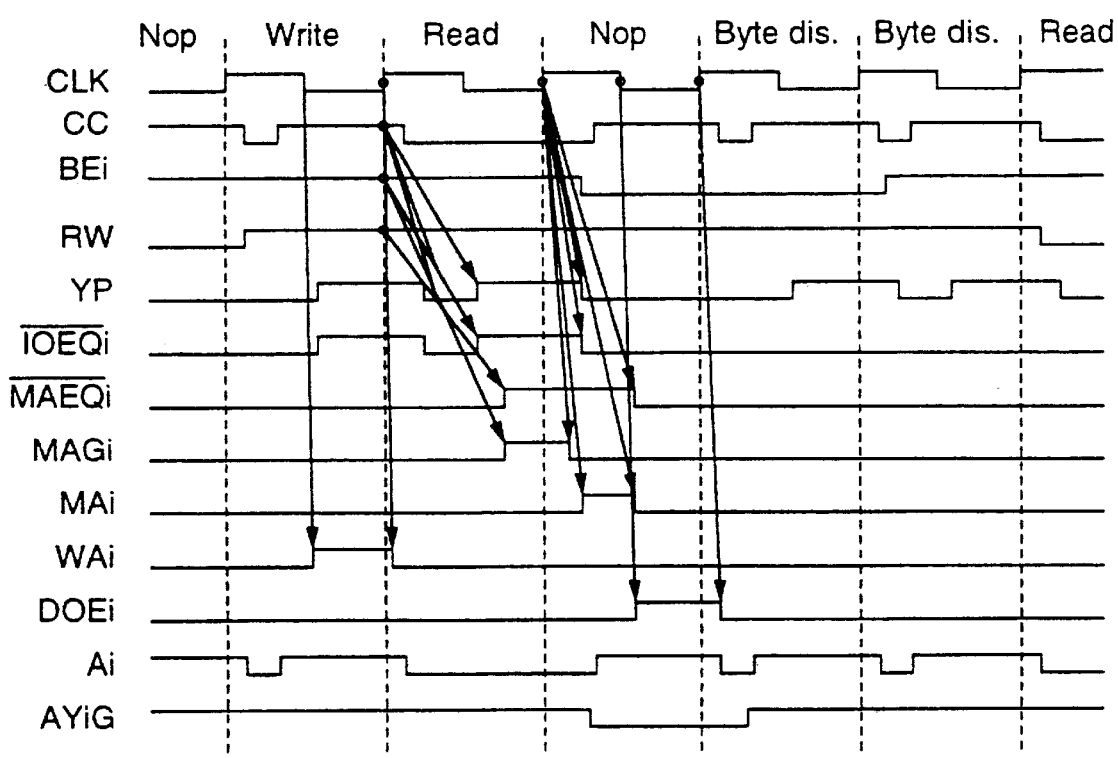
FIG. 34 is a read/write timing chart of the byte control circuit.

FIG. 34 shows a timing chart of the above-mentioned column-system signals. When the write command (CC="H" and RW="L") and the byte control signal (BEi="H") are inputted at the time of rise of the clock signal CLK, the write control signal WAi is turned to "H" so that the switch SW1 takes a turned-on condition. At this time, the global bit line precharge control signal IOEQiB is turned to "H" so that the global bit lines GBL-i0 and $\overline{\text{GBL}}$-i0 are turned to a high impedance status. On the other hand, the read enable signal MAGi, the main amplifier enable signal MAi, the main amplifier precharge control signal $\overline{\text{MAEQi}}$ and the output buffer enable signal DOEi are turned to "L" so that the reading circuit RA is inactivated. Thereafter, the write control signal WAi and the global bit line precharge control signal $\overline{\text{IOEQi}}$ are turned to "L".

Next, when the read command (CC="H" and RW="H") and the byte control signal (BEi="H") are inputted at the time of rise of the clock signal CLK, the above-mentioned control signals are changed over, as shown in FIG. 34. Namely, the global bit line precharge control signal $\overline{\text{IOEQi}}$ is turned from "H" to "L" so that the global bit lines GBL-i0 and $\overline{\text{GBL}}$-i0 are turned from a precharge status to a high impedance status. Thereafter, the read enable signal MAGi and the main amplifier precharge control signal $\overline{\text{MAEQi}}$ are turned from "H" to "L" so that the reading circuit RA is connected to the global bit lines GBL-i0 and $\overline{\text{GBL}}$-i0 through the switch SW2. Data is read from the global bit lines GBL-i0 and $\overline{\text{GBL}}$-i0 to the reading circuit RA. Thereafter, the read enable signal MAGi is turned from "H" to "L" so that the reading circuit RA is disconnected from the global bit lines GBL-i0 and $\overline{\text{GBL}}$-i0. Thereafter, the main amplifier enable signal MAi is turned from "H" to "L" so that the read data is amplified by the main amplifier and is latched by the latch circuit composed of the NAND circuits N1 and N2. Finally, the output buffer enable signal DOEi is turned from "L" to "E" so that data is read from the output buffer circuit TI1 to the exterior of the memory macro MMACRO in a period of time of DOEi="H". In FIG. 34, "Byte dis." shows that BEi is "L" and DQ-i0 to DQ-i7 are unselected bytes.

<1.6 Main Control Circuit>

Figure 35:
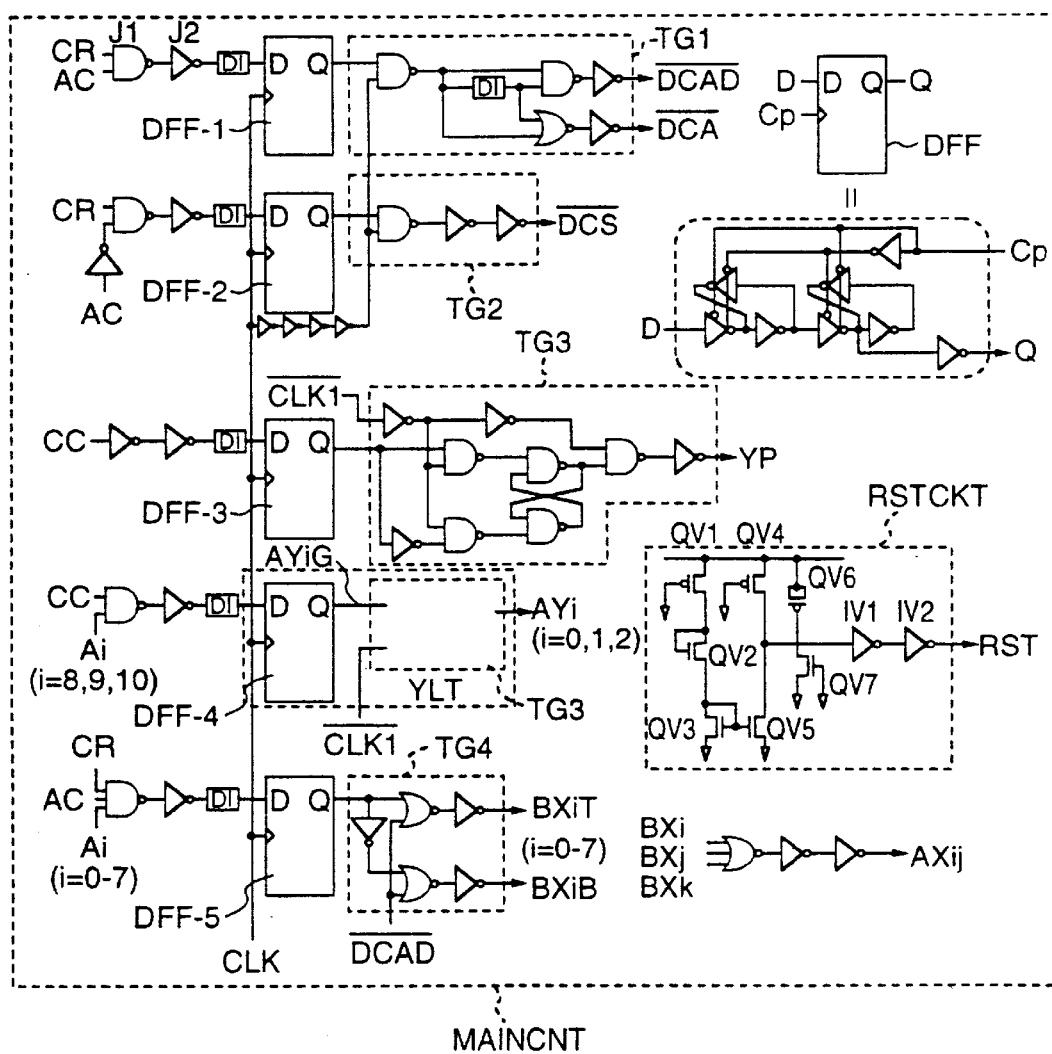
FIG. 35 is a diagram showing an example of a main control circuit of the memory macro.

FIG. 35 shows an example of the main control circuit MAINCNT. The main control circuit MAINCNT includes the combination of standard logic circuits such as NAND circuits, inverters, and D-type flip-flops (composed of inverters and clocked inverters). From control signals CR, AC and CC, a clock signal CLK and an address signal Ai inputted from the exterior of the memory macro MMACRO, the main control circuit MAINCNT generates signals including a bank close flag DCS (the inverted signal $\overline{\text{DCS}}$ of which is shown in FIG. 35), a bank active flag DCA (the inverted signal $\overline{\text{DCA}}$ of which is shown in FIG. 35), a column address enable signal YP, a row address signal (or X address signal) AXij, a column address signal (or Y address signal) AYi, and so forth shown in FIG. 29.

The bank close flag $\overline{\text{DCS}}$ (the inverted signal DCS of which is shown in FIG. 32) is generated by a flip-flop DFF-1, a logic circuit TGl and so forth at a timing as shown in FIG. 32. The bank active flag $\overline{\text{DCA}}$ (the inverted signal DCA of which is shown in FIG. 32) is generated by a flip-flop DFF-2, a logic circuit TG2 and so forth at a timing as shown in FIG. 32. The column address enable signal YP is generated by a flip-flop DFF-3, a logic circuit TG3 and so forth at a timing as shown in FIG. 34. A column address internal signal AYiG is generated by a flip-flop DFF-4 and so forth at a timing as shown in FIG. 34.

Though a Y address latch circuit YLT is shown in FIG. 29, the flip-flop DFF-4 and the logic circuit TG3 shown in FIG. 35 correspond to the Y address latch circuit YLT. The Y address latch circuit YLT may be included in the bank control circuit BNKCNT-1 or may be included in the main control circuit MAINCNT.

Reference symbol D1 denotes a delay circuit. The flip-flops DFF (DFF-1, DFF-2, DFF-3, DFF-4, DFF-5) are circuits for latching input data D by virtue of the rising edge of the clock signal CLK. A clock signal $\overline{\text{CLK1}}$ is generated by a clock generating circuit CLKCNT shown in FIG. 36b. The output BXiT of a logic circuit TG4 is a buffered X address signal, and BXiB is an inverted signal thereof. An X address signal AXij is a signal predecoded using the buffered X address signal BXiB or the inverted signal BXiB thereof. Since the logic circuits TG1, TG2, TG3 and TG4 and other logic circuits shown in FIG. 35 are simple circuits which can be readily understood by those skilled in the art, the detailed explanation thereof will be omitted.

A circuit RSTCKT is a circuit for generating a reset signal RST of a bank control circuit BNKCNT at the time of power-on. The reset signal RST will be mentioned later on. The circuit RSTCKT generates a one-shot pulse at the time of power-on. A feature of the circuit RSTCKT lies in that a capacitor is provided between a power supply line and an input terminal of an inverter IV1 so that the voltage of the input terminal of the inverter IV1 rises at a high speed even when a power supply voltage rises at a high speed. The operation of the circuit RSTCKT will now be explained.

First, when a power supply voltage VCC rises, the gate/drain voltage of an N-MOS transistor QV3 rises. When this voltage is not higher than the threshold voltages of N-MOS transistors QV3 and QV5, no current flows through the N-MOS transistors QV3 and QV5 so that the voltage of the input terminal of the inverter IV1 rises with the same voltage as the power supply voltage. Next, when the gate/drain voltage of the N-MOS transistor QV3 goes beyond the threshold voltage thereof, currents flow through the N-MOS transistors QV3 and QV5 so that the voltage of the input terminal of the inverter IV1 falls. Thus, a one-shot pulse can be generated at the time of power-on. The value of VCC with which the voltage of the input terminal of the inverter IV1 starts to fall is roughly determined by the threshold voltages of QV2 and QV3 or is represented by VCC=VT(QV2)+VT(QV3). Also, this value can be adjusted more finely by changing the W/L ratio of a P-MOS transistor QV4 and the N-MOS transistor QV5, the N-MOS transistor QV3 and a P-MOS transistor QV1, or the N-MOS transistors QV3 and QV5. A capacitor QV6 is connected between the power supply line and the input terminal of the inverter IVI in order to prevent a phenomenon that when the power supply voltage rises at a high speed, a capacitance coupled with the input terminal of the inverter IV1 causes a delay in rise of the voltage of the input terminal so that before the voltage of the input terminal exceeds the logical threshold value of the inverter IV1, a current flows through QV5 with the result that the node or input terminal cannot exceed the logical threshold value of the inverter IV1. In this manner, the circuit RSTCKT can generate a pulse surely even if the power supply rises at either high or low speed.

<1.7 Read/Write Control Circuit Block>

FIG. 36a shows an example of the read/write control circuit block RWCNT. In a manner similar to that in the main control circuit MAINCNT, signals including a main amplifier precharge control signal MAEQiB, a write enable signal WAi, a main amplifier enable signal MAi, an output buffer enable signal DOEi (the inverted signal DOEiB of which is shown in FIG. 36a), a read enable signal MAGi (the inverted signal $\overline{\text{MAGi}}$ of which is shown in FIG. 36a) and so forth shown in FIG. 33 are generated, by the combination of standard logic circuits such as NAND circuits, inverters, and D-type flip-flops (ones identical to the flip-flops DFF shown in FIG. 35), from control signals RW and CC, a clock signal CLK and a byte control signal BEi inputted from the exterior of the memory macro MMACRO.

The main amplifier precharge control signal MAEQiB, the write enable signal WAi, the main amplifier enable signal MAi, the output buffer enable signal DOEi (the inverted signal $\overline{\text{DOEi}}$ of which is shown in FIG. 36a) and the read enable signal MAGi (the inverted signal $\overline{\text{MAGi}}$ of which is shown in FIG. 36a) are generated at a timing as shown in FIG. 34. Reference symbols D1, D2 and D3 denote delay circuits. The clock generating circuit CLKCNT shown in FIG. 36b generates clock signals $\overline{\text{CLK1}}$, $\overline{\text{CLK2}}$ and $\overline{\text{CLK3}}$. The clock generating circuit CLKCNT may be included in each read/write control circuit block RWCNT or only one clock generating circuit CLKCNT may be included in the main control circuit block MAINCNT. Since the logic circuits shown in FIGS. 36a and 36b are also simple circuits which can be readily understood by those skilled in the art, the detailed explanation thereof will be omitted.

<1.8 Another Example Of Memory Cell Array>

Figure 37:
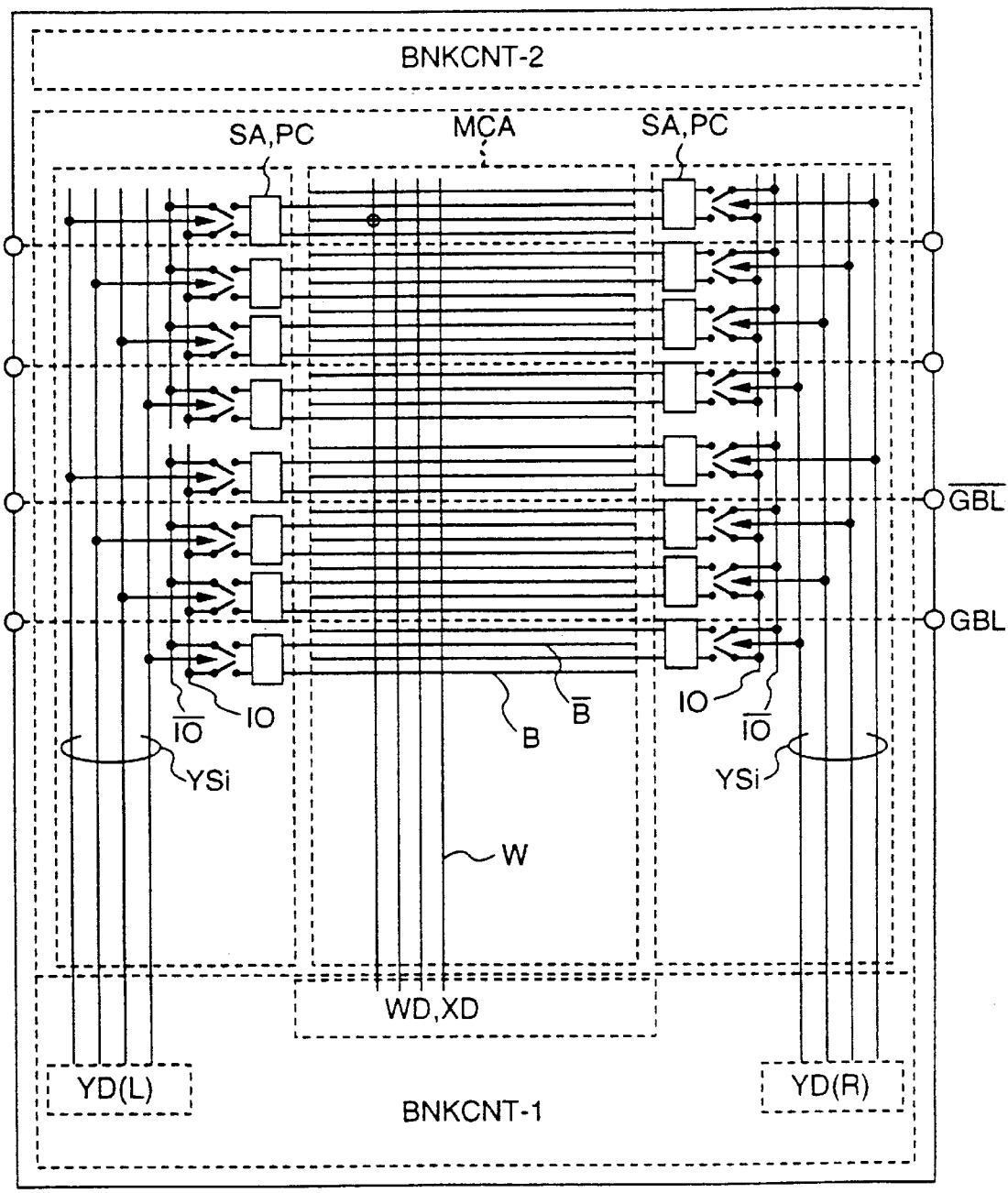
FIG. 37 is a diagram showing a second example of a bank module of the memory macro.

FIG. 37 shows another example of a memory cell array MCA section in the bank module BANK. Bit lines B and $\overline{\text{B}}$ and global bit lines GBL and $\overline{\text{GBL}}$ extend in the lateral direction of the figure. Also, word lines W, memory array input/output lines IO and $\overline{\text{IO}}$, and column address selection signals YSi extend in the longitudinal direction of the figure. The global bit lines are arranged on broken lines which connect ○ symbols at the right and left ends of the figure. Sense amplifiers SA, bit line precharge circuits PC, memory array input/output lines IO and $\overline{\text{IO}}$, and column address selection signals YSi are arranged parting onto the right and left sides of the memory cell array MCA. Accordingly, Y decoders YD are also arranged parting onto the right and left sides of the memory cell array MCA. A word driver WD, an X decoder XD and the Y decoders YD are arranged on the lower side of the memory cell array MCA, that is, near the lower side of the figure. A feature of the present example lies in that the sense amplifier SA and the bit line precharge circuit PC are arranged parting onto the right and left sides of the memory cell array MCA for each pair of bit lines. Thereby, the requirements for the layout pitch of the sense amplifiers SA are moderated so that the length of the sense amplifier SA in the bit line direction is reduced. This is particularly effective for a system in which a multiplicity of column address selection signals YSI are passed in the word line direction, as in the present invention. Namely, the reduction of the length of the sense amplifier SA in the bit line direction reduces a parasitic capacitance of that portion, thereby making it possible to obtain a larger signal from a memory cell.

<1.9 Bank Control Circuit Block>

Figure 38A:
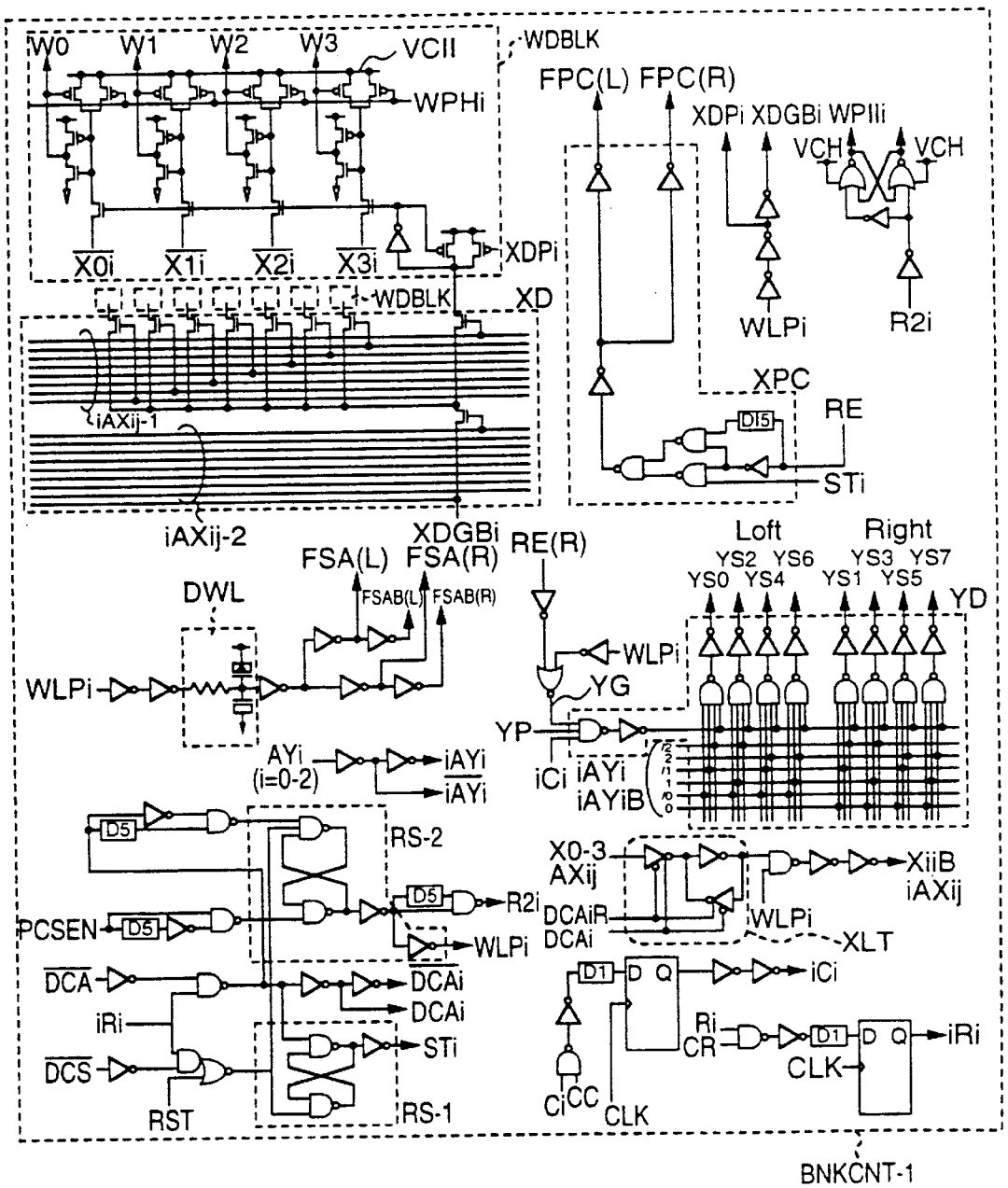
FIGS. 38a and 38b are diagrams showing an example of the bank control circuit of the memory macro.

FIG. 38a shows an example of the bank control circuit block BNKCNT-1. This example is particularly suitable for the memory cell array with the alternate arrangement of sense amplifiers shown in FIG. 37. In a manner similar to that in the read/write control circuit block RWCNT, signals including word lines W(W0, W1, W2, W3), bit line precharge signals FPC(R) and FPC(L), column address selection signals YSi (YS0, YS1, YS2, YS3, YS4, YS5, YS6, YS7), N-channel sense amplifier activating signals FSA(R) and FSA(L), P-channel sense amplifier activating signals FSAB(R) and FSAB(L) and so forth as shown in FIG. 29, are generated by the combination of standard logic circuits such as NAND circuits, inverters and D-type flip-flops, from control signals CR and CC, a row-system bank address Ri, a column-system bank address Ci and a clock signal CLK inputted from the exterior of the memory macro MMACRO and the signals $\overline{DCA}$, $\overline{DCS}$, RST and YP generated by the main control circuit block MAINCNT. Here, (R) and (L) indicate signals for sense amplifiers on the right side and sense amplifiers on the left side, respectively. A word driver WDBLK corresponds to the word driver WD shown in FIG. 29. The same reference symbols as those of the other circuits shown in FIG. 29 are used in FIG. 38a. Symbols D1, D5 and D15 denote delay circuits. The above-mentioned output RST of the power-on reset circuit RSTCKT (see FIG. 35) is inputted to WLPi and STi generating circuits so that their outputs at the time of power-on are respectively turned to "L" and "H" which are the same as those in the S0 status. Thus, the memory array takes a precharge status, thereby making it possible to suppress an increase in power-on current caused by the operation of the sense amplifier SA. Since logic circuits shown in FIG. 38a are also simple circuits which can be understood readily by those skilled in the art, the detailed explanation thereof will be omitted.

Figure 38B:
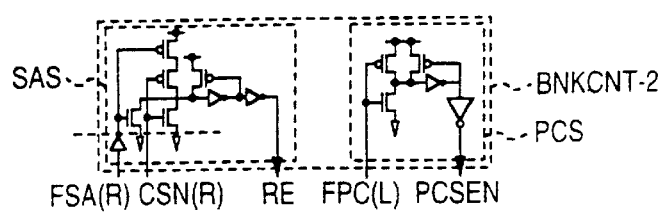

FIG. 38b shows an example of the bank control circuit BNKCNT-2. A precharge level sensor PCS is a level sensor for a bit line precharge signal FPC, and a sense amplifier level sensor SAS is a level sensor for a common driving line of the sense amplifier SA on the N-MOS transistor side. These sensors are provided for detecting the completion of precharge and a completion point of signal amplification, respectively. Namely, the precharge level sensor PCS generates a signal PCSEN and the sense amplifier level sensor SAS generates a signal RE. There are two precharge level sensors PCS which include one for right-side precharge circuit PC and the other for left-side precharge circuit PC. Also, there are two sense amplifier level sensors SAS which include one for right-side sense amplifier SA and the other for left-side sense amplifier SA. A feature of the present example lies in that in order to detect a point at which an input signal finishes falling, the logical threshold value of a CMOS logic circuit receiving that signal is lowered down to the vicinity of the threshold voltage of an N-MOS transistor. Thereby, compensation can be made to some degree even if there are the variations in threshold voltages of sense amplifiers SA and/or memory cells. The level sensor may be a differential amplifier as shown in FIG. 29. In this case, if a reference voltage Vr providing a sense level is set to be lower than the threshold voltage of N-MOS by the variations thereof, erroneous operation caused by the variations can be prevented in a manner similar to that in the above-mentioned logical threshold value system.

<1.10 Logic Circuit Block>

The logic circuit block LOGIC shown in FIG. 29 is provided with a suitable construction for performing an operation processing of image data and a processing for functions such as the drawing to the image memory (or memory macro MMACRO) and the reading from the image memory to a display device.

The shown logic circuit block LOGIC supplies an address signal Ai, a row-system bank address Ri, a column-system bank address Ci, data input/output lines DQ-i0 to DQ-i7, control signals CC, AC, CR and RW, a byte control signal BEi, a clock signal CLK and so forth to the memory macro MMACRO. Further, the logic circuit block LOGIC gives an instruction for refresh operation and an refresh address to the memory macro MMACRO by use of the above-mentioned control lines, address signals and so forth.

Also, the logic circuit block LOGIC performs an interface to the exterior of the semiconductor integrated circuit SLC. A central processing unit CPU, a display device and so forth are connected externally so that the transfer of data and commands is made by "I/O, Control signal" shown in FIG. 29.

<2. Second Example of Application to Memory/Logic Mixed LSI>

Figure 39:
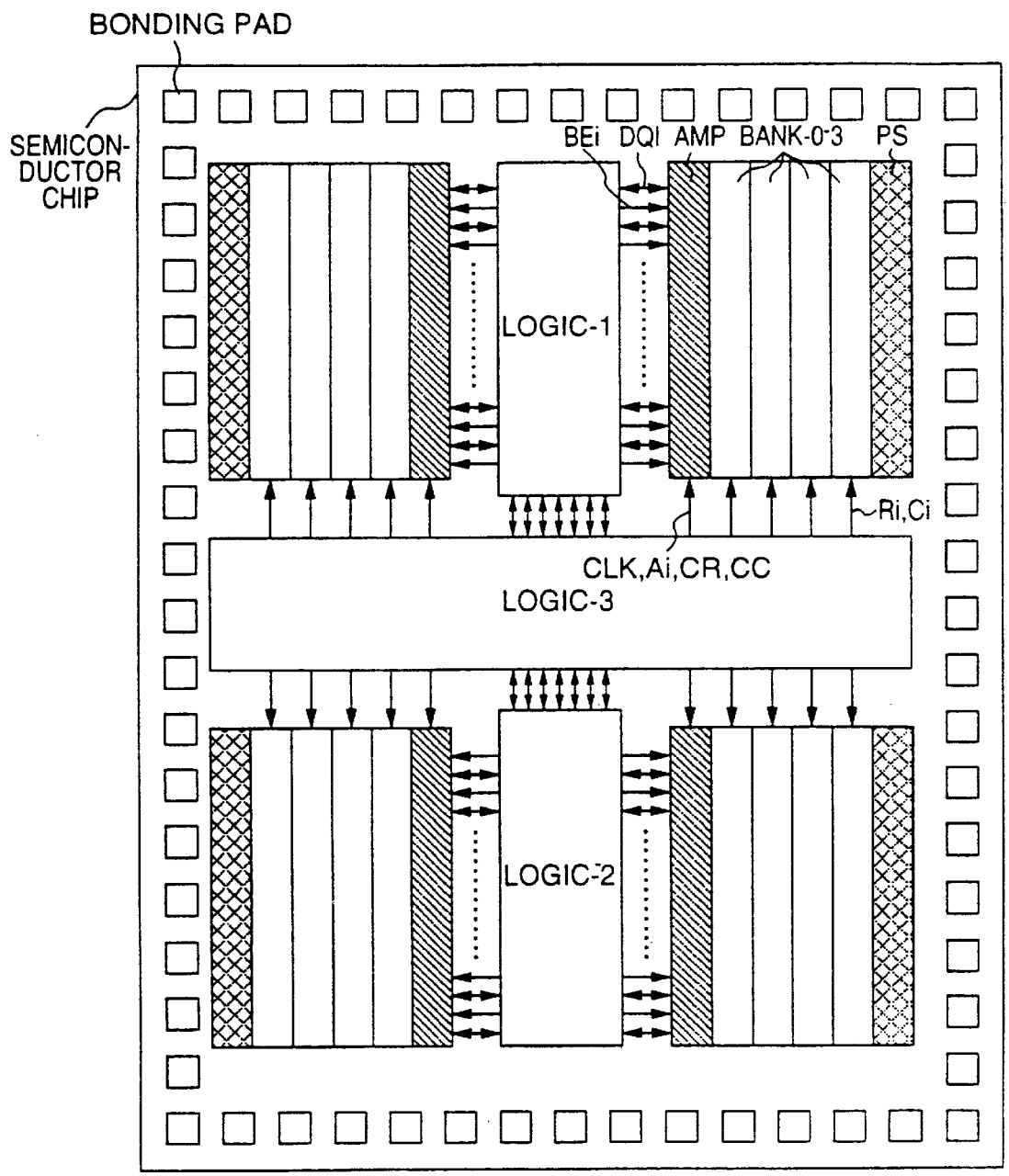
FIG. 39 is a diagram showing a second example of the application of the memory macro to a memory/logic mixed LSI.

FIG. 39 shows another embodiment of the application to a memory/logic mixed LSI. A memory macro MMACRO of the present embodiment is composed of four bank modules BANK0-3, an amplifier module AMP and a power supply module PS. Two memory macros MMACRO are arranged with a logic circuit block LOGIC-1 interposed therebetween. Also, two other memory macros MMACRO are arranged with a logic circuit block LOGIC-2 interposed therebetween. Data input/output lines DQi perform the transfer of data between each memory macro MMACRO and the logic circuit block LOGIC-1 or the logic circuit block LOGIC-2. Byte control signals BEi are inputted from the logic circuit block LOGIC-1 or the logic circuit block LOGIC-2 to each memory macro MMACRO. Control signals CR, CC, AC and RW, an address signal Ai, a clock signal CLK, a row-related bank address Ri and a column-related bank address Ci are inputted from a logic circuit block LOGIC-3 to each memory macro MMACRO.

A feature of the present embodiment lies in that four memory macros according to the present invention are provided and all data outputted from the memory macros MMACRO are processed in parallel by the logic circuit blocks LOGIC-1 and LOGIC-2. Thereby, the data transfer and processing speed can be made four times as high as that in the case where only one memory macro MMACRO is provided. Also, the data processing speed can be further improved by increasing the number of macros. The logic circuit block LOGIC-3 has a function of processing the result of operation in the logic circuit block LOGIC-1 or LOGIC-2 into a data form which is easy to be taken in a device outside of the chip and conversely into a form with which data from the exterior of the chip is easy to be operated. Such a system of processing data from a plurality of memory macros MMACRO in parallel is particularly effective for applications such as three-dimensional graphics which need to process a large amount of data in a high speed.

Though memory macros MMACRO having the same capacity are used in the present embodiment, memory macros MMACRO having different capacities may be used in accordance with applications. For example, in the case where memory macros MMACRO are used together with a microprocessor, the use as a cache memory is possible by providing the memory macro MMACRO with one or two bank modules BANK and changing the amplifier module AMP to a high-speed type. Also, the use as a main memory is possible by further increasing the number of bank modules BANK and using them in combination with a low-speed or medium-speed amplifier module AMP. The low-speed or medium-speed main amplifier is used for making the occupation area of the amplifier small. Thus, in the present invention, since the memory macro is of a module system, it is possible to change the memory capacity or the amplifier capacity freely.

<3. Third Example of Application to Memory/Logic Mixed LSI>

Figure 40:
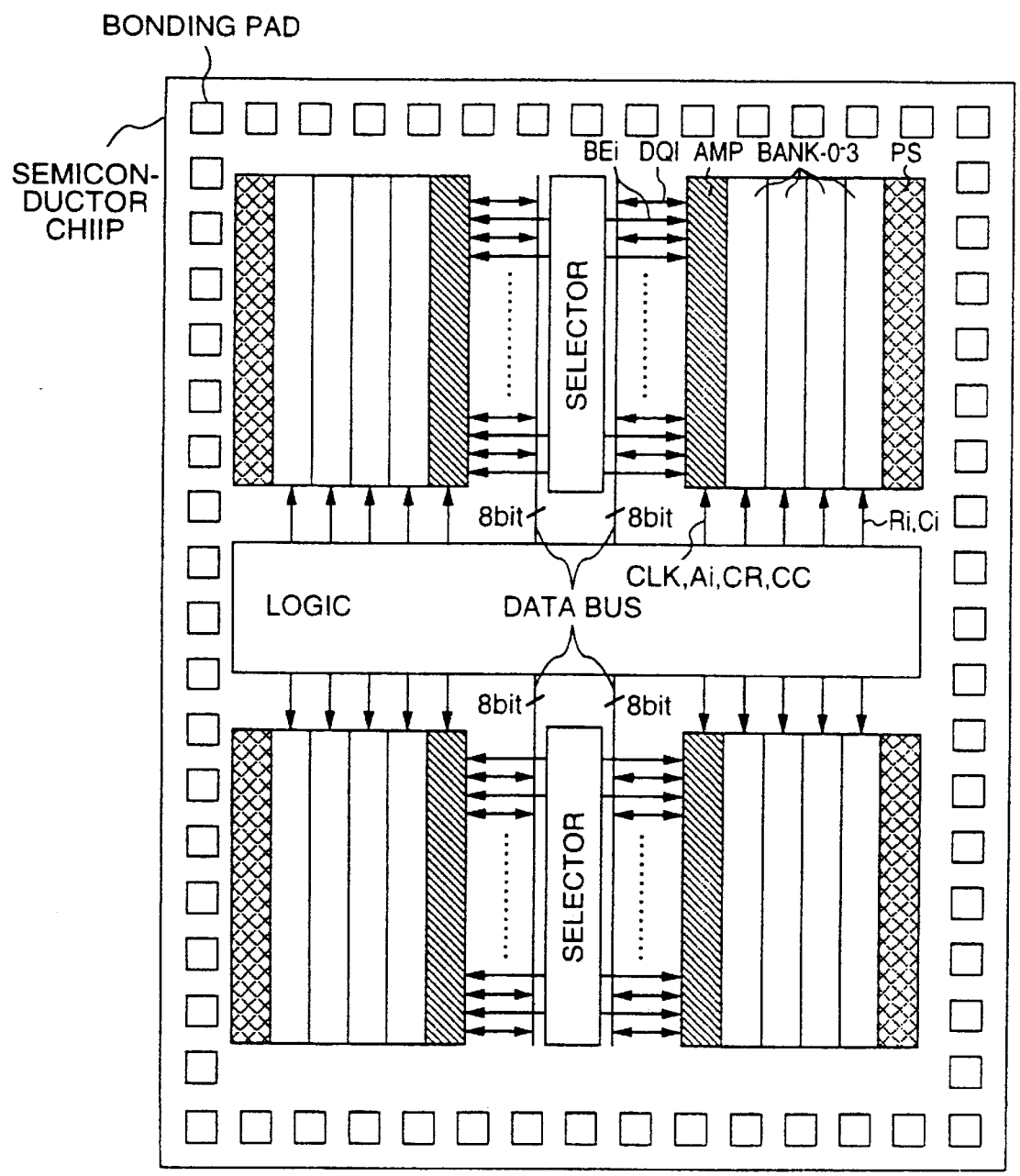
FIG. 40 is a diagram showing a third example of the application of the memory macro to a memory/logic mixed LSI.

FIG. 40 shows an embodiment of application in the case where an internal data bus width is small. A memory macro MMACRO of the present embodiment is composed of four bank modules BANK0-3, an amplifier module AMP and a power supply module PS. Two memory macros MMACRO are arranged with a selector circuit SELECTOR interposed therebetween. Also, two other memory macros MMACRO are arranged with a selector circuit SELECTOR interposed therebetween. Data input/output lines DQi perform the transfer of data between each memory macro MMACRO and a logic circuit block LOGIC. Byte control signals BEi are inputted from the selector circuit SELECTOR to each memory macro MMACRO. Control signals CR, CC, AC and RW, an address signal Ai, a clock signal CLK, a row-system bank address Ri and a column-system bank address Ci are inputted from the logic circuit block LOGIC to each memory macro MMACRO.

In FIG. 40, the data input/output lines DQi are connected in common for each byte. Therefore, the number of input/output lines coming out of one memory macro MMACRO is only 8. The change-over of data is made by the byte control signal BEi generated from the selector circuit SELECTOR. With such connection, the memory macro MMACRO of the present embodiment can be used even as an incorporated memory of an ordinary 8 to 32-bit one-chip microcomputer.

<4. ROM Bank Module>

Figure 41:
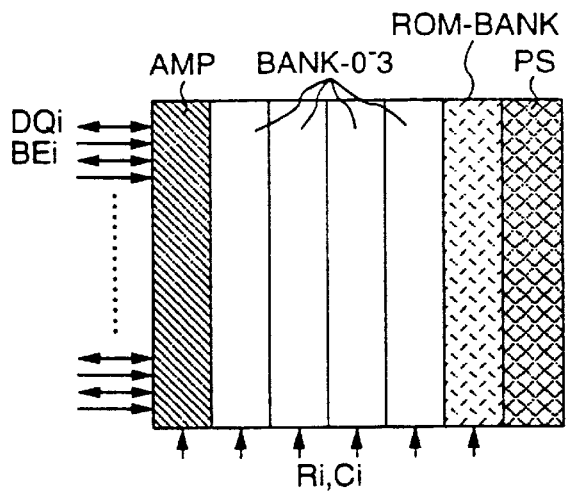
FIG. 41 is a diagram showing a second example of the construction of the memory macro.

FIG. 41 shows an embodiment in which a part of bank modules BANK of the memory macro MMACRO is replaced by a ROM (Read Only Memory) module. A memory macro MMACRO of the present embodiment is composed of four RAM bank modules BANK0-3, a ROM bank module ROM-BANK, an amplifier module AMP and a power supply module PS. A merit of the present embodiment lies in that in the case where the memory macro MMACRO is used as an incorporated memory of a one-chip microcomputer, control circuits for ROM and RAM (such as amplifier modules AMP inclusive of main control circuits MAINCNT) can be made common to each other, thereby making it possible to reduce the chip area. Also, in the case where the memory macro MMACRO of the present embodiment is incorporated in a processor for image processing or a DSP (Digital Signal Processor), it is possible to read and operate data at a high speed, for example, if the coefficients of sum-of-products operations are stored in ROM. This is because RAM and ROM are close by each other.

Figure 42:
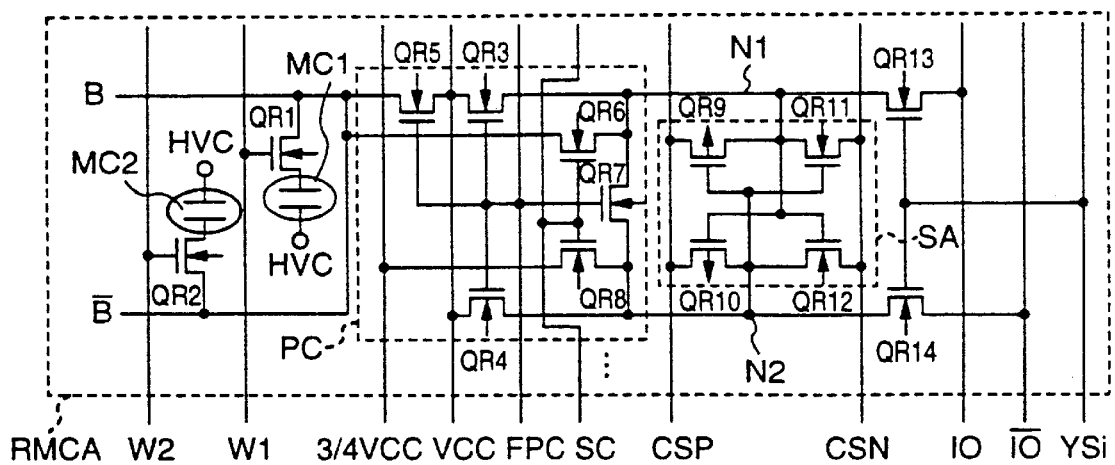
FIG. 42 is a diagram showing the construction of a ROM-BANK module of the memory macro.

FIG. 42 shows a circuit example of a memory array RMCA of a ROM module suitable for the application to the memory macro MMACRO of the present embodiment. A feature of the present example lies in that in order to conform the number and pitch of global bit lines to the RAM module (or the bank module BANK shown in FIG. 29, FIG. 31, FIG. 37 and so forth), DRAM memory cells having the same size as the RAM module are partly changed so that they are used as ROM cells. In order to use a memory cell with a DRAM construction as a ROM cell, there can be used a method in which after the formation of an insulator film of the memory cell, a mask for removing the insulator film in conformity with data to be written is added. Thereby, a cell from which the insulator film is removed (MC1 in FIG. 42) is brought into a short-circuited condition with a common electrode of the memory cell whereas a cell from which the insulator film is not removed (MC2 in FIG. 42) holds insulation or results in that information is written in the cell.

Figure 43:
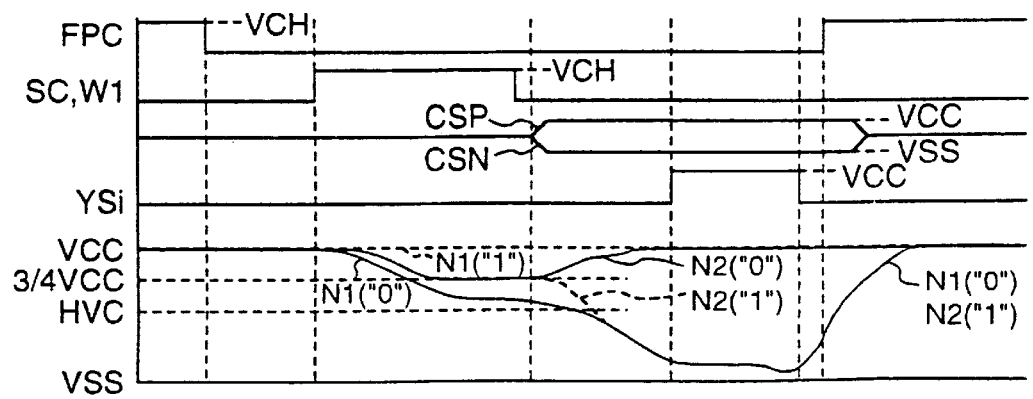
FIG. 43 is an operating waveform diagram of the ROM-BANK module.

The operation of the ROM module will be explained using FIGS. 42 and 43. When a bit line precharge signal FPC is turned to "H", N-MOS transistors QR3, QR4, QR5 and QR7 are turned on so that a bit line B and input terminals N1 and N2 of a sense amplifier assume a voltage of VCC. Next, the bit line precharge signal FPC is turned to "L" and a word line (W1 in the present example) and a transfer signal SC are turned to "H" (higher than VCC). Thus, N-MOS transistors QR1, QR6 and QR8 are turned on so that the node N1 assumes a voltage lowered to HVC and the node N2 assumes a voltage lowered to 3/4VCC. This voltage difference is amplified by operating the sense amplifier (QR9 to QR12) by turning a P-channel sense amplifier common driving line CSP and an N-channel sense amplifier common driving line CSN to "H" and "L", respectively. If this condition is left as it is, a current continues to flow through the N-MOS transistor QR1. Therefore, the transfer signal SC is turned to "L" so that the N-MOS transistors QR6 and QR8 are turned off. Thus, N1 assumes the voltage of VSS and N2 assumes the voltage of VCC. Namely, information "0" is read. If W2 is turned on in place of W1, the node N2 assumes the same voltage as that mentioned above or the voltage of 3/4VCC but the node N1 assumes the voltage of VCC since a current does not flow to a memory cell. This relationship in potential or voltage is reverse to that mentioned above. Thus, N1 assumes the voltage of VCC and N2 assumes the voltage of VSS. Namely, information "1" is read. If a column address selection signal YSi is now turned to "H", a signal appears on global bit lines GBL and $\overline{GBL}$ through input/output lines IO and $\overline{IO}$. A timing at which the word line is turned to "L" may be arbitrary if it falls within a period of time from the turn of SC to "L" until the start of precharging.

According to the present example as mentioned above, the same memory cell pattern as RAM can be used as ROM. Therefore, it is possible to readily conform the number and pitch of global bit lines to those of the RAM module. Though the disclosure has been made by way of example in conjunction with the method in which the insulator film of the DRAM cell is removed, there may be used another method, for example, a method in which a storage electrode of the memory cell is removed. Also, the conventional ROM cell may be used if the pitch of global bit lines can be made the same as that in the other bank module BANK.

Herein, ROM means a program-fixed mask memory in which information is written beforehand at a chip fabrication process. This memory is a non-volatile memory in which stored information is held even if a power supply is turned off. On the other hand, RAM is a memory in which the rewriting of data at any time and the holding-and reading of data are possible. This memory is a volatile memory in which stored information cannot be held if a power supply is turned off.

Up to here, the RAM memory cell has been explained as the DRAM cell shown in FIG. 31. However, even if SRAM cells are used, no inconvenience is caused. In this case, ROM cells of a ROM bank module can be formed by changing a part of SRAM cells.

It is of course that a module including rewritable memory cells in place of ROM cells may be used in the foregoing. For example, a module including memory cells using ferroelectric films can be used. Since the memory cell using the ferroelectric film is capable of not only rewriting like RAM but also holding information like ROM even after the turn-off of a power supply, it is also possible to construct all modules by modules which include memory cells using ferroelectric films.

Synchronous Structure Dynamic RAM Module

Figures 46, 47A, 47B:
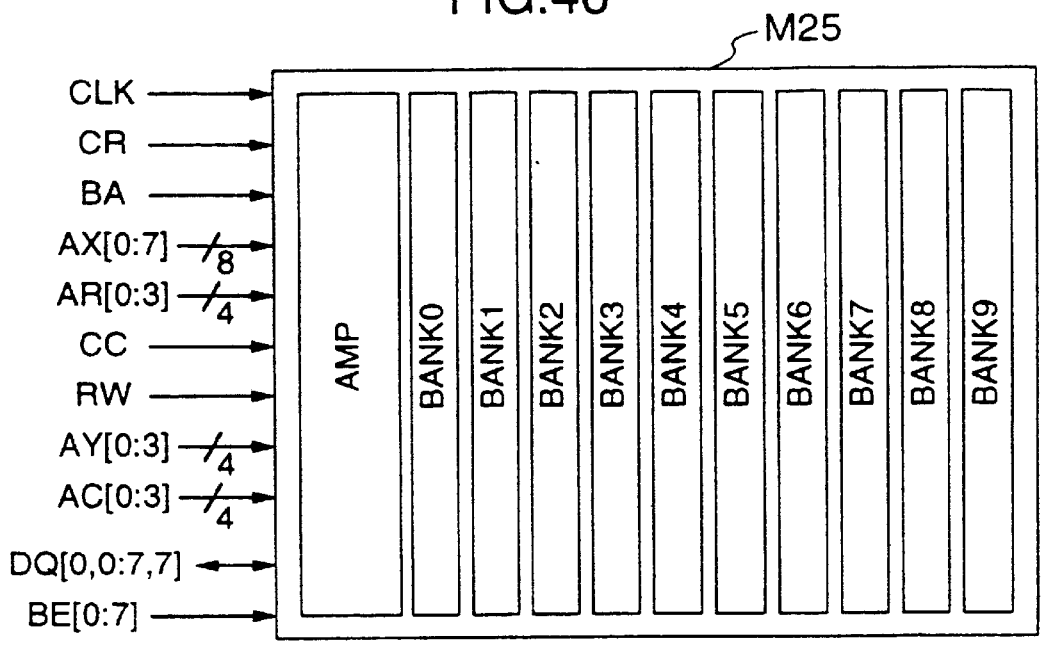
FIG. 46 is a diagram showing a DRAM module constructed using the memory macro.
FIGS. 47a and 47b are diagrams showing the truth tables of commands set in the DRAM module.

FIG. 46 shows an example of a DRAM module constructed using the memory macro MMACRO. As mentioned above, a bank module BANK of the memory macro MMACRO has a construction in which 256 word lines (eight X addresses) are provided, (n×8×i) pairs of bit lines intersect one word line, and one n-th of the bit line pairs ((log n/log 2) Y addresses) are selected by a Y decoder so that (8×i) pairs of global bit lines are inputted and outputted with data. On the other hand, each bank (BANK0-9) of a DRAM module M25 corresponds to the bank module BANK of the memory macro MMACRO in the case where n=16 and i=8. Namely, each bank (BANKi, i=0–9) of the DRAM module M25 has a 256K-bit storage capacity and is constructed such that 64 pairs of global bit lines are inputted and outputted with data. Also, the DRAM module M25 includes 10 banks (BANKi, i=0–9). Accordingly, the the DRAM module M25 forms a synchronous structure dynamic DRAM module having a 4096-word×64-bit×10-bank construction. Each bank (BANKi, i=0–9) can operate in a completely independent manner. The DRAM module M25 has an address non-multiplex construction in which the row system and the column system are controlled in a completely separated manner. AMP of the DRAM module M25 corresponds to the amplifier module AMP of the memory macro MMACRO.

<Input/Output Interface>

The DRAM module M25 is a module used in ASIC. As shown in FIG. 46, interface signals for another ASIC module include a clock signal CLK, 8 row address signals AX[0:7], 4 column address signals AY[0:3], 4 row bank address signals AR[0:31], 4 column bank address signals AC[0:3], a row command selection signal CR, a bank active/inactive signal BA, a column command selection signal CC, a read/write control signal RW, 64 data input/output signals DQ[0,0:7,7], 8 data byte control signals BE[0:7], a power supply line VDD and a ground line VSS.

The clock signal CLK corresponds to the clock signal CLK of the memory macro MMACRO. The other signals are all inputted and outputted in synchronism with the clock signal CLK.

The row address signal AX[0:7] corresponds to the X address of the address signal Ai of the memory macro MMACRO. A row address (or X address) in a bank BANK is inputted. The column address signal AY[0:3] corresponds to the Y address of the address signal Ai of the memory macro MMACRO. A column address (or Y address) in a bank BANK is inputted.

The row bank address signal AR[0:3] corresponds to the row-system bank address Ri of the memory macro MMACRO. The address of a bank BANK receiving a row command is inputted. The row-system bank address Ri of the memory macro MMACRO is not decoded or directly selects a bank module BANK. However, the row bank address signal AR[0:3] is decoded to select a bank BANK. Since there are four addresses, it is possible to select banks the number of which is 16 at the greatest.

The column bank address signal AC[0:3] corresponds to the column-system bank address Ci of the memory macro MMACRO. The address of a bank BANK receiving a column command is inputted. The column-system bank address Ci of the memory macro MMACRO is not decoded or directly selects a bank module BANK. However, the column bank address signal AC[0:3] is decoded to select a bank BANK. Since there are four addresses, it is possible to select banks the number of which is 16 at the greatest.

The row command selection signal CR corresponds to the control signal CR of the memory macro MMACRO. This signal indicates that the corresponding cycle is a row command input.

The bank active/inactive signal BA corresponds to the control signal AC of the memory macro MMACRO. This signal indicates whether the corresponding bank should be activated or inactivated.

The column command selection signal CC corresponds to the control signal CC of the memory macro MMACRO. This signal indicates that the corresponding cycle is a column command input.

The read/write control signal RW corresponds to the control signal RW of the memory macro MMACRO. This signal indicates the reading or the writing.

The data input/output signal DQ[0,0:7,7] corresponds to the I/O signal DQij for input/output of the memory macro MMACRO. This signal performs the input/output of data.

The data byte control signal BE[0:7] corresponds to the byte control signal BEi of the memory macro MMACRO. This signal performs the masking of input/output for each byte. The case of reading is such that when BE="L", the output is brought into a high impedance status whereas when BE="H", the output is enabled. The case of writing is such that when BE="L", the writing of corresponding data is not performed with the previous data being held whereas when BE="H", the writing of corresponding data is performed.

The power supply line VDD corresponds to the power supply voltage VCC of the memory macro MMACRO. The power supply line VDD is connected to 3.3V. The ground line VSS corresponds to the power supply voltage VSS of the memory macro MMACRO. The ground line VSS is connected to GND (0V).

The voltage level of an input/output signal is a so-called CMOS interface level.

<Command Operation>

FIGS. 47a and 47b show the truth tables of commands set in the DRAM module 25. In the figures, "1" indicates that an input signal has a high level (VIH), "0" indicates that an input signal has a low level (VIL), "X" indicates that an input signal has a high level (VIH) or a low level (VIL), and "V" indicates that an input signal is valid.

In a row command (com R) system, a command is set by the combination of a row command selection signal CR, a bank active/inactive signal BA, a row address signal AX[0:7] and a row bank address signal AR[0:3]. The row command selection signal CR, the bank active/inactive signal BA, the row address signal AX[0:7] and the row bank address signal AR[0:3] are latched into the DRAM module M25 by virtue of the rising edge of a clock signal CLK. In FIGS. 47a and 47b, "↑" indicates that the latching into the DRAM module M25 is made by virtue of the rising edge of the clock signal CLK.

A command NOP (no-operation) is set by CR=0. The command NOP is not an execution command. However, the internal operation is continued.

A command BA (row address strobe and bank active) is set by CR=1 and BA=1. With the command BA, a row address (AX0-AX7) and a row bank address (AR0-AR3) are designated and a bank BANK designated by the row bank address takes an active status. In a general purpose DRAM chip, the command BA corresponds to the rising of /RAS when /CAS=H. The command BA is also used for refreshing.

A command BC (precharge and bank close) is set by CR=1 and BA=0. With the command BC, a bank BANK designated by a row bank address (AR0-AR3) is precharged and is thereafter brought into a bank close status.

In a column command (com C) system, a command is set by the combination of a column command selection signal CC, a data byte control signal BE[0:7], a read/write control signal RW, a column address signal AY[0:3] and a column bank address signal AC[0:3]. The column command selection signal CC, the data byte control signal BE[0:7], the read/write control signal RW, the column address signal AY[0:3] and the column bank address signal AC[0:3] are latched into the DRAM module M25 by virtue of the rising edge of a clock signal CLK.

A command NOP (no-operation) is set by CC=0. The command NOP is not an execution command. However, the internal operation is continued.

A command RD (column address strobe and read command) is set by CC=1 and RW=1. With the command RD, a reading operation is started. A read address is designated by a column address (AY0-AY3) and a column bank address (AC0-AC3). In a general purpose DRAM chip, the command RD corresponds to the rising of /CAS when /RAS=L and WE=H. After the completion of reading, the output is brought into a high impedance status.

A command WT (column address strobe and write command) is set by CC=1 and RW=0. With the command WT, a writing operation is started. A write address is designated by a column address (AY0-AY3) and a column bank address (AC0-AC3).

The data byte control signal BE[0:7] performs an input/output data masking operation in units of one byte. At the time of reading, when BE="1", the output is brought into a low impedance status so that the output of data becomes possible. When BE="0", the output is brought into a high impedance status so that the output of data is not made. At the time of writing, when BE="1", the writing of data is performed. When BE="0", the writing of data is not performed with the previous data being held.

FIGS. 48a and 48b show the function truth tables representing the operations in the case where each command is executed subsequently to various states. In the case where a command BA is executed for a bank BANK#i when the bank BANK#i is in a bank active state, precharging (precharge) and sensing (sense) for a new row address AX are performed and the bank BANK#i is thereafter turned to a bank active status. The "bank active status" means a state in which the input of a column command (com C) is possible. In the case where the command BA is executed for the bank state, the state BANK#i when a bank BANK#j (j≠i) is in a bank active of the bank BANK#j is continued (no operation).

In the case where a command BA is executed for a bank BANK#i when the bank BANK#i is in a bank closed state, sensing (sense) for a new row address AX is performed and the bank BANK#i is thereafter turned to a bank active status. In the case where the command BA is executed for the bank BANK#i when a bank BANK#j (j≠i) is in a bank close state, the state of the bank BANK#j is continued (no operation).

In the case where a command BC is executed for a bank BANK#i when the bank BANK#i is in a bank active or bank closed state, precharging (precharge) is performed and the bank BANK#i is thereafter turned to a bank closed status. In the case where the command BC is executed for the bank BANK#i when a bank BANK#j (j≠i) is in a bank active or bank closed state, the state of the bank BANK#j is continued (no operation).

When a bank BANK#i is in a not-bank-active or not-bank-closed state, the execution of a command BA or command BC for the bank BANK#i is inhibited. In the case where the command BA or command BC is executed for the bank BANK#i when a bank BANK#j (j≠i) is in a not-bank-active or not-bank-closed state, the state of the bank BANK#j is continued (no operation).

In the case where a command RD is executed for a bank BANK#i when the bank BANK#i is in a bank active state, the reading (read) from the bank BANK#i is performed. When the bank BANK#i is in a not-bank-active state, the execution of the command RD for the bank BANK#i is inhibited. Irrespective of the state of a the bank BANK#j (j≠i) when the command RD is executed for bank BANK#i, the state of the bank BANK#j is continued (no operation).

In the case where a command WT is executed for a bank BANK#i when the bank BANK#i is in a bank active state, the writing (write) from the bank BANK#i is performed. When the bank BANK#i is in a not bank active state, the execution of the command WT for the bank BANK#i is inhibited. Irrespective of the state of a the bank BANK#j (j≠i) when the command WT is executed for bank BANK#i, the state of the bank BANK#j is continued (no operation).

Figure 49:
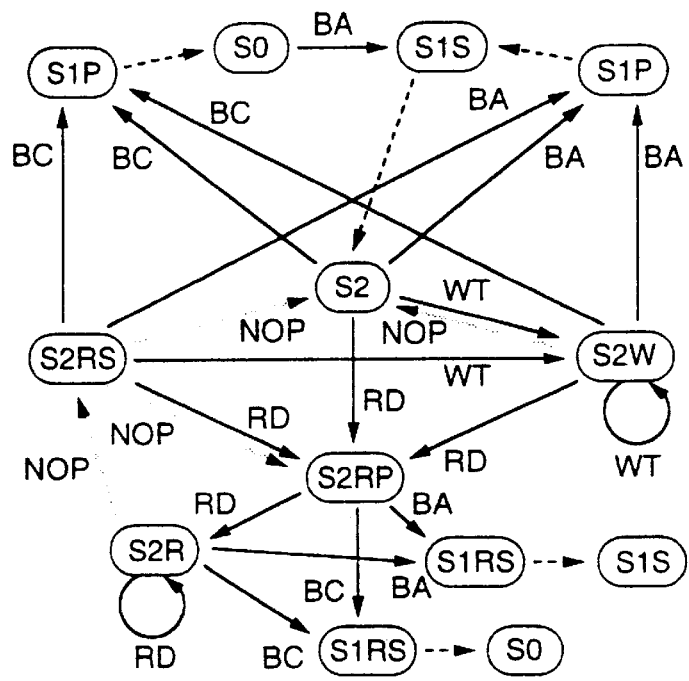
FIG. 49 is a state transition diagram of the DRAM module.

FIG. 49 shows a diagram showing the state transition of a bank for command input. The state of a bank includes a stand by status S0, a precharge status S1P, a sense status S1S, a bank active status S2, a read without output status S2RP, a read status S2R, a pipeline output only status S1RS, a pipeline output only status S2RS and a write status S2W. The state transition of a bank is caused by the input of a command BA, BC, RD, WT or NOP. In FIG. 49, an arrow attended with no command name indicates that the state transition of a bank is caused after the lapse of a predetermined time (time out).

<Read/Write Operation>

(1) Bank Active

Prior to a read or write operation, the activation of a corresponding bank BANK and a row address is performed by a command BA. A bank BANK to be activated is designated by a row bank address (AR0-AR3) and a word line is activated by a row address (AX0-AX7).

In the case of a RAS down mode (or in the case where a state before the input of the command BA is a bank active state), an interval of LA is required between the command BA and a command RD or a command WT. As shown in FIG. 49, the bank BANK is turned from a bank active status S2 to a bank active status S2 through a precharge status S1P and a sense status S1S.

In the case of a high-speed access mode (or in the case where a state before the input of the command BA is a bank close state), an interval of LA2 is required between the command BA and the command RD or the command WT. As shown in FIG. 49, the bank BANK is turned from a stand by status S0 to a bank active status S2 through a sense status S1S.

(2) Read Operation

Figure 50:
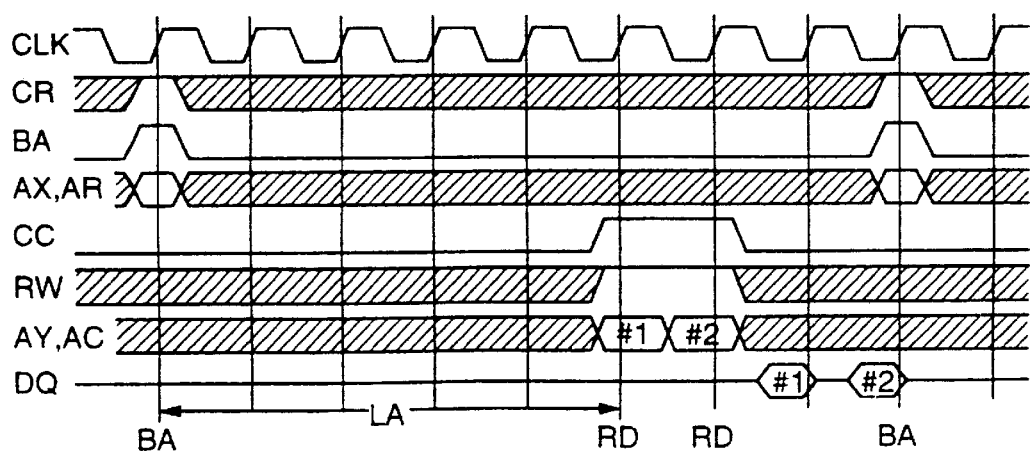
FIG. 50 is a timing chart of a read operation of the DRAM module in a RAS down mode.

FIG. 50 shows a timing chart of a page read operation in a RAS down mode. A command BA (bank active (with precharge)) is inputted and a read operation is started by the input of a command RD after an interval LA. In FIG. 50 is shown an example in which commands RD are consecutively inputted so that data is consecutively read. Though FIG. 50 shows an example in which LA is 5 clock cycles, the minimum latency will be mentioned later on. Regarding an address, an active bank is designated by the condition of a column bank address (AC0-AC3) and a column selection signal is designated by a column address (AY0-AY3). In FIG. 50 is shown a situation in which data 1 and 2 corresponding to #1 and #2 of the column address (AY0-AY3) are read. After the data is outputted, the data input/output DQ is turned to a high impedance status. The state of the read operation shown in FIG. 50 is turned from a bank active status S2 to a bank active status S2 through a precharge status S1P and a sense status S1S, as shown in FIG. 49. After the input of the command RD, the state is turned to a pipeline output only status S2RS through a read without output status S2RP and a read status S2R. After the input of a command BA, the state is turned to a precharge status S1P.

Figure 51:
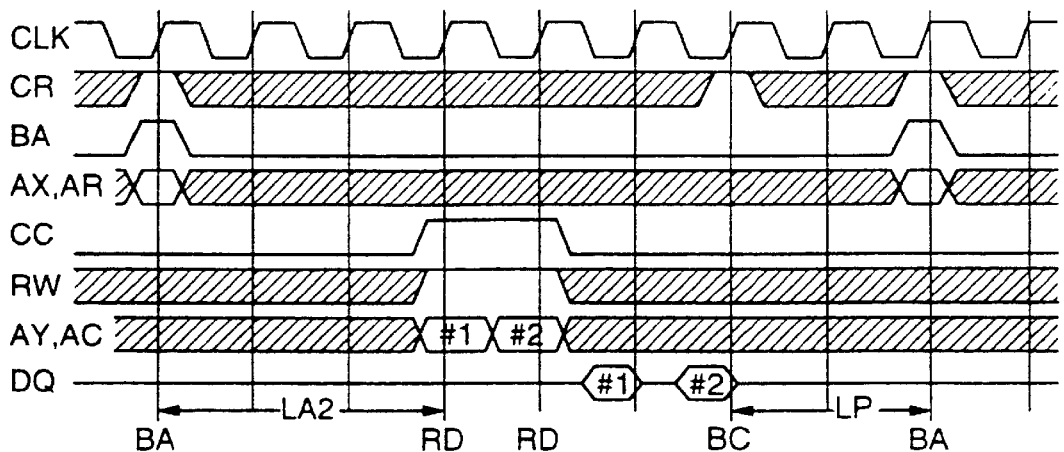
FIG. 51 is a timing chart of a read operation of the DRAM module in a high-speed access mode.

FIG. 51 shows a timing chart of a read operation in a high-speed access mode. A command BA (bank active) is inputted and a read operation is started by the input of a command RD after an interval LA2. Though FIG. 51 shows an example in which LA2 is 3 clock cycles, the minimum latency will be mentioned later on. Regarding an address, an active bank is designated by the condition of a column bank address (AC0-AC3) and a column selection signal is designated by a column address (AY0-AY3). In FIG. 51 is shown a situation in which data 1 and 2 corresponding to #1 and #2 of the column address (AY0-AY3) are read. After the data is outputted, the data input/output DQ is turned to a high impedance status. The state of the read operation shown in FIG. 51 is turned from a stand by status S0 to a bank active status S2 through a sense status S1S, as shown in FIG. 49. After the input of the command RD, the state is turned to a pipeline output only status S2RS through a read without output status S2RP and a read status S2R. After the input of a command BC, the state is turned to a stand by status S0 through a precharge status S1P. When a command BA is inputted after an interval LP, the state is turned to a sense status S1S.

(3) Write Operation

Figure 52:
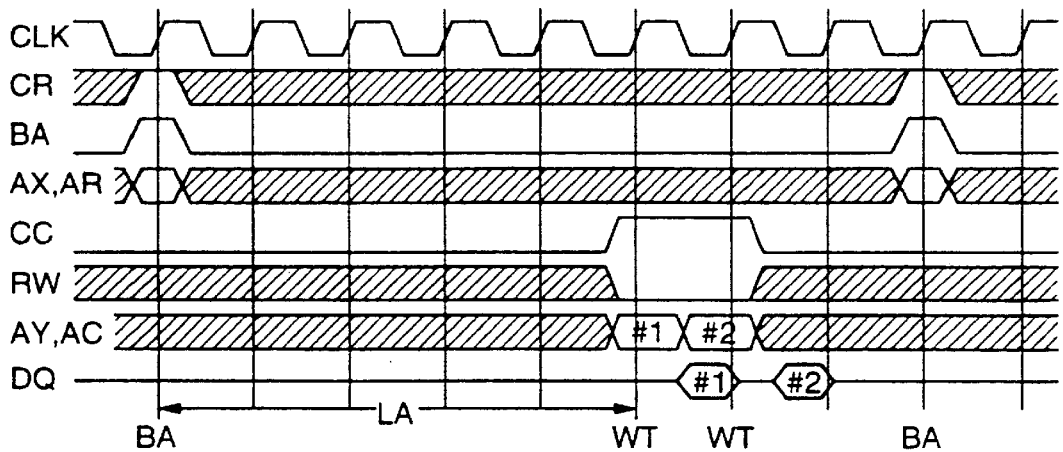
FIG. 52 is a timing chart of a write operation of the DRAM module in a RAS down mode.

FIG. 52 shows a timing chart of a page write operation in a RAS down mode. A command BA (bank active (with precharge)) is inputted and a write operation is started by the input of a command WT after an interval LA. Though FIG. 52 shows an example in which LA is 5 clock cycles, the minimum latency will be mentioned later on. Regarding an address, an active bank is designated by the condition of a column bank address (AC0-AC3) and a column selection signal is designated by a column address (AY0-AY3). In FIG. 52 is shown a situation in which data 1 and 2 corresponding to #1 and #2 of the column address (AY0-AY3) are written. The latency of data input is 1 cycle. The state of the write operation shown in FIG. 52 is turned from a bank active status S2 to a bank active status S2 through a precharge status S1P and a sense status S1S, as shown in FIG. 49. After the input of the command WT, the state is turned to a write status S2W. After the input of a command NOP, the state is turned to a bank active status S2.

Figure 53:
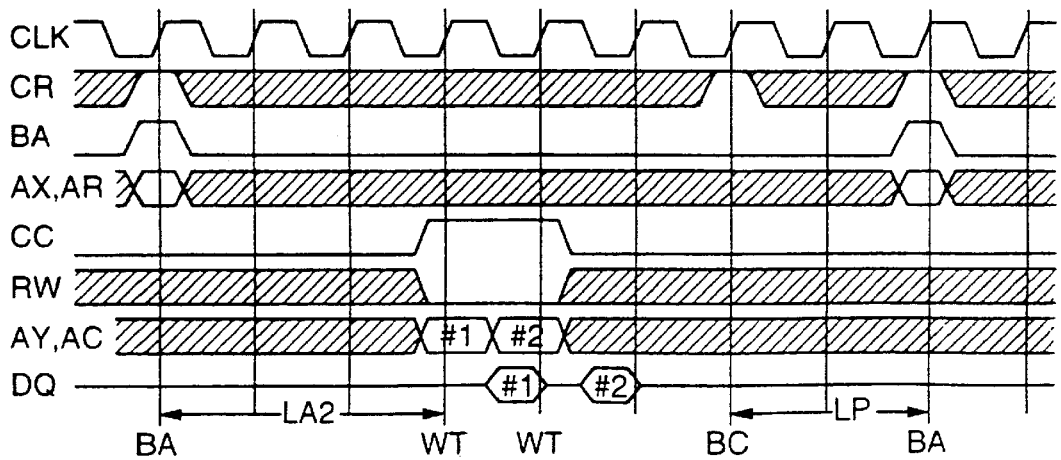
FIG. 53 is a timing chart of a write operation of the DRAM module in a high-speed access mode.

FIG. 53 shows a timing chart of a page write operation in a high-speed access mode. A command BA (bank active) is inputted and a write operation is started by the input of a command WT after an interval LA2. Though FIG. 53 shows an example in which LA2 is 3 clock cycles, the minimum latency will be mentioned later on. Regarding an address, an active bank is designated by the condition of a column bank address (AC0-AC3) and a column selection signal is designated by a column address (AY0-AY3). In FIG. 53 is shown a situation in which data 1 and 2 corresponding to #1 and #2 of the column address (AY0-AY3) are written. The latency of data input is 1 cycle. The state of the write operation shown in FIG. 53 is turned from a stand by status S0 to a bank active status S2 through a sense status S1S, as shown in FIG. 49. After the input of the command WT, the state is turned to a write status S2W. After the input of a command NOP, the state is turned to a bank active status. After the input of a command BC, the state is turned to a stand by status S0 through a precharge status S1P. When a command BA is inputted after an interval LP, the state is turned to a sense status S1S.

<Command Latency>

(1) Command RD to Command RD Latency (LRR)

Figure 54:
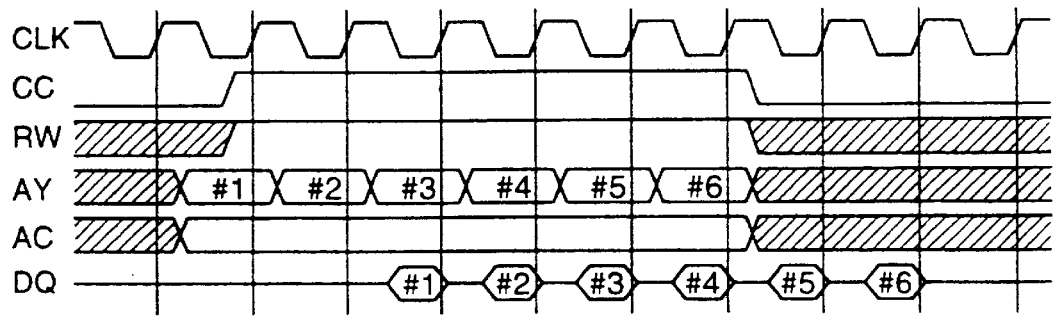
FIG. 54 is a diagram showing an interval between a command RD and a command RD in the case of the same bank and the same row address of the DRAM module.

When commands RD are consecutively executed in the case of the same bank and the same row address, as shown in FIG. 54, the reading is enabled in each cycle. Namely, the minimum interval LRR between the commands RD and RD is 1 cycle. This is because the state is subjected to a transition from a bank active status S2 shown in FIG. 49 to a read status S2R through a read without output status S2RP. However, it is not possible to consecutively execute commands RD for the same bank and different row addresses. It is required that a new command BA or a command BC and a command BA should be executed before the input of the succeeding command RD and thereafter the command RD should be executed newly.

Figure 55:
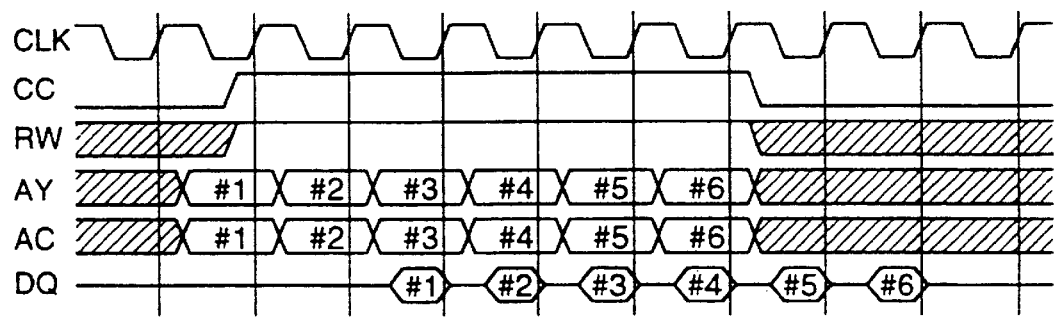
FIG. 55 is a diagram showing an interval between a command RD and a command RD in the case of different banks of the DRAM module.

The case of access to the address of another bank is such that if a plurality of banks are in their bank active statuses, as shown in FIG. 55, the execution of commands RD for the active banks is enabled in consecutive cycles.

(2) Command WT to Command WT Latency (LWW)

Figure 56:
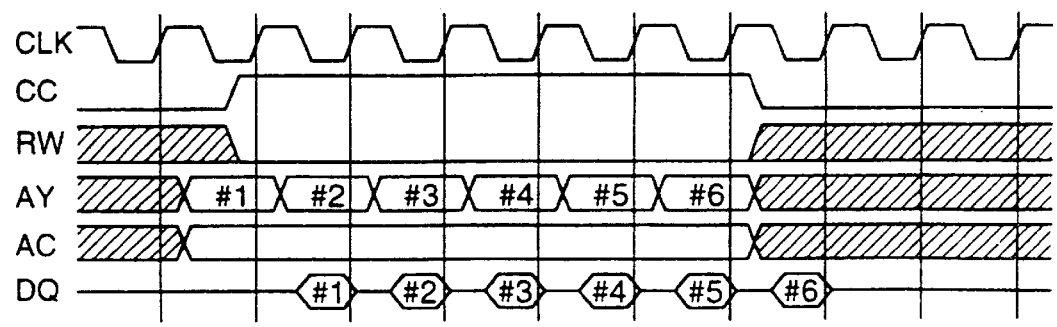
FIG. 56 is a diagram showing an interval between a command WT and a command WT in the case of the same bank and the same row address of the DRAM module.

When commands WT are consecutively executed in the case of the same bank and the same row address, as shown in FIG. 56, the writing is enabled in each cycle. Namely, the minimum interval LWW between the commands WT and WT is 1 cycle. This is because the state is subjected to a transition from a bank active status S2 shown in FIG. 49 to a write status S2W. However, it is not possible to consecutively execute commands WT for the same bank and different row addresses. It is required that a new command BA should be executed before the input of the succeeding command WT and thereafter the command WT should be executed newly.

Figure 57:
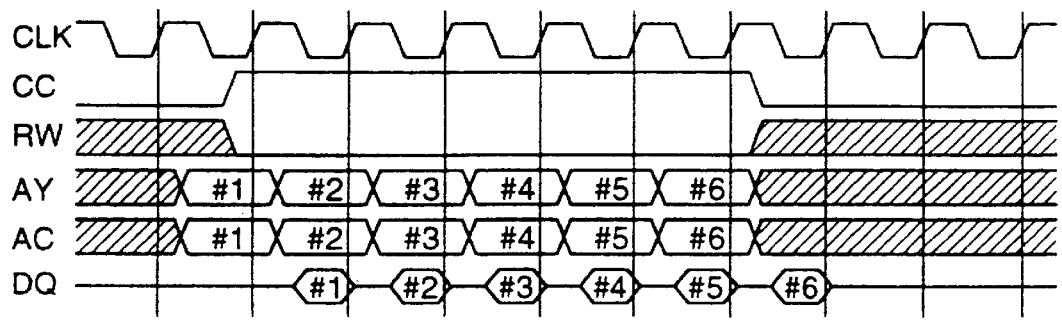
FIG. 57 is a diagram showing an interval between a command WT and a command WT in the case of different banks of the DRAM module.

The case of access to the address of another bank is such that if a plurality of banks are in their bank active statuses, as shown in FIG. 57, the execution of commands WT for the active banks is enabled in consecutive cycles.

(3) Command RD to Command WT Latency (LRW)

Figure 58:
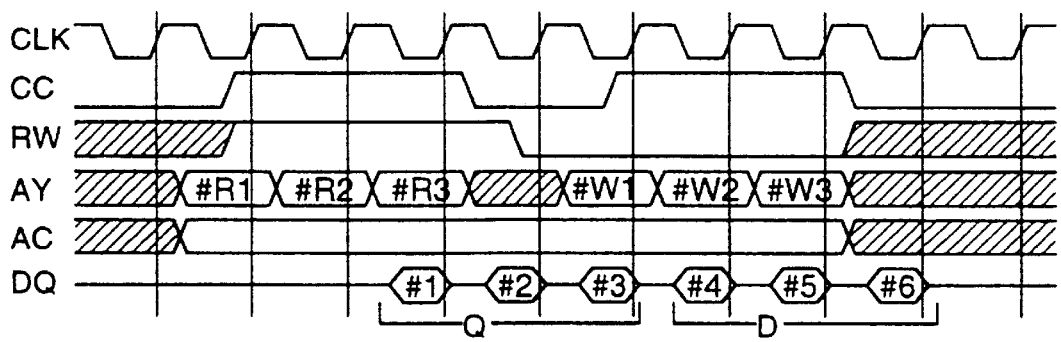
FIG. 58 is a diagram showing an interval between a command RD and a command WT in the case of the same bank and the same row address of the DRAM module.

When commands WT are consecutively executed for the same row address of the same bank subsequently to a command RD, as shown in FIG. 58, it is necessary to insert a command NOP of 1 cycle at the minimum between the command RD and the command WT. Namely, the minimum interval LRW between the command RD and the command WT is 2 cycles. This is because since the state is in a read without output status S2RP or a read status S2R shown in FIG. 49, it is necessary to execute a command NOP to make a transition to a pipeline output only status S2RS. Also, it is not possible to execute a command WT for a different row address of the same bank subsequently to the command RD. It is required that a new command BA should be executed before the input of a command WT and thereafter the command WT should be executed newly. Reference symbol Q shown in FIG. 58 represents data output, and symbol D represents data input.

The case of access to the address of another bank is such that if a plurality of banks are in their bank active statuses, the execution of a command WT for the active bank is enabled subsequently to a command RD. In this case, however, it is necessary to insert a command NOP of 1 cycle at the minimum between the command RD and the command WT.

(4) Command WT to Command RD Latency (LWR)

Figure 59:
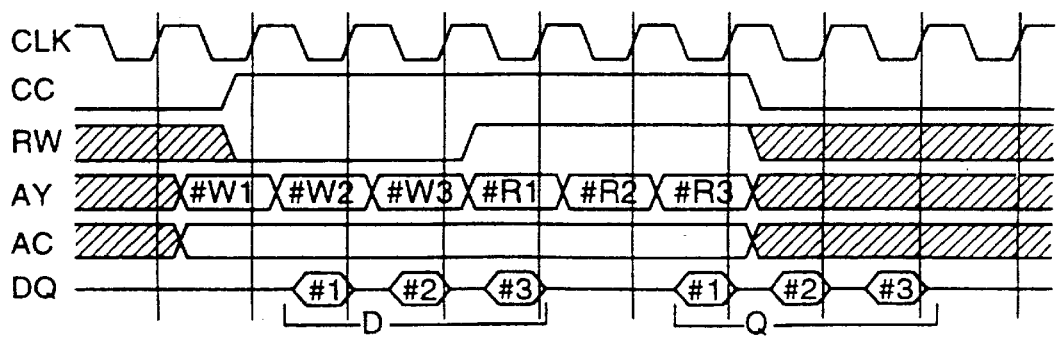
FIG. 59 is a diagram showing an interval between a command WT and a command RD in the case of the same bank and the same row address of the DRAM module.

When commands RD are consecutively executed for the same row address of the same bank subsequently to a command WT, as shown in FIG. 59, the reading is possible in consecutive cycles. Namely, the minimum interval LWR between the command WT and the command RD is 1 cycle. This is because since the state is in a write status S2W shown in FIG. 49, the execution of the command RD is immediately enabled. However, it is not possible to execute a command RD for a different row address of the same bank subsequently to the command WT. It is required that a new command BA should be executed before the input of a command RD and thereafter the command RD should be executed newly. Reference symbol Q shown in FIG. 59 represents data output, and symbol D represents data input.

The case of access to the address of another bank is such that if a plurality of banks are in their bank active statuses, the execution of a command RD for the active bank is enabled subsequently to a command WT. The execution of a command WT and a command RD is enabled in consecutive cycles.

(5) Command RD to Command BA/BC Latency (LR)

Figure 60:
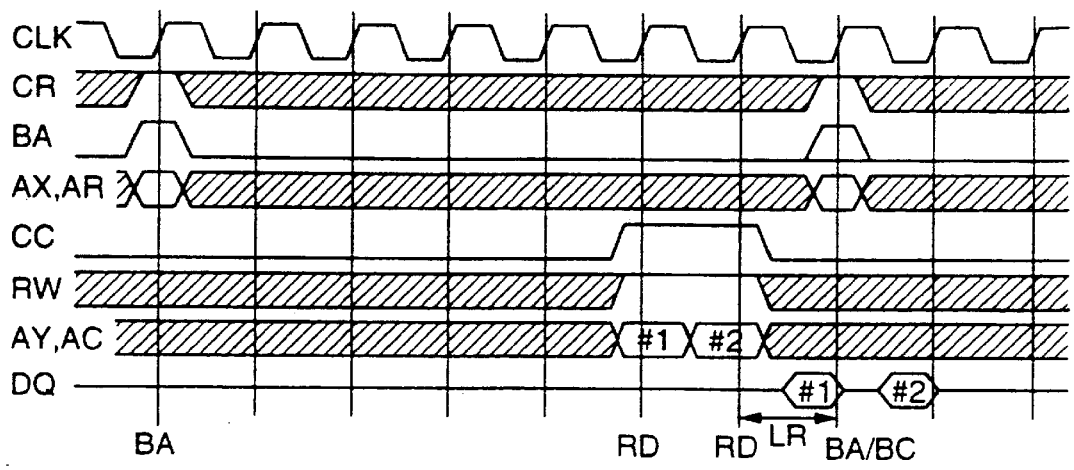
FIG. 60 is a diagram showing an interval between a command RD and a command BA or BC in the case of the same bank of the DRAM module.

As shown in FIG. 60, a command BA or a command BC can be executed for the same bank subsequently to a command RD. Namely, the minimum interval LR between the command RD and the command BA or the command BC is 1 cycle. This is because since the state is in a read without output status S2RP or a read status S2R shown in FIG. 49, the execution of the command BA or the command BC is immediately enabled.

(6) Command WT to Command BA/BC Latency (LR)

Figure 61:
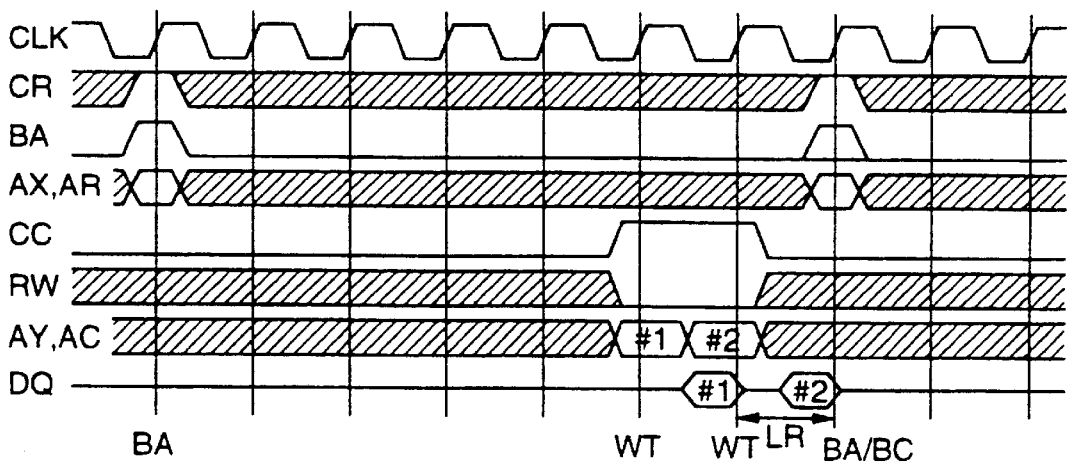
FIG. 61 is a diagram showing an interval between a command WT and a command BA or BC in the case of the same bank of the DRAM module.

As shown in FIG. 61, a command BA or a command BC can be executed for the same bank subsequently to a command WT. Namely, the minimum interval LR between the command WT and the command BA or the command BC is 1 cycle. This is because the state is in a write status S2W shown in FIG. 49.

(7) Command BA to Command BA Latency (LC)

Figure 62:
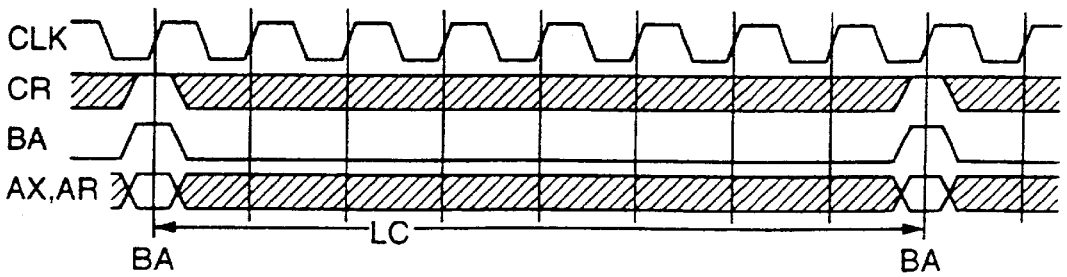
FIG. 62 is a diagram showing an interval between a command BA and a command BA in the case of the same bank of the DRAM module in a RAS down mode.
Figure 63:
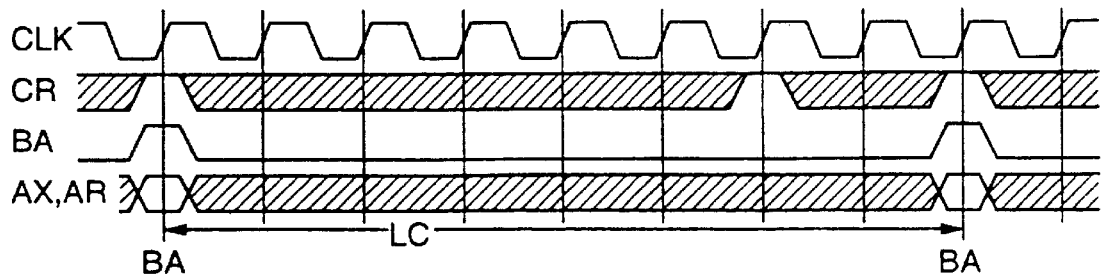
FIG. 63 is a diagram showing an interval between a command BA and a command BA in the case of the same bank of the DRAM module in a high-speed access mode.

As shown in FIGS. 62 and 63, in either RAS down mode or high-speed access mode, it is necessary that an interval between two commands BA for the same bank satisfies LC. Though each of FIGS. 62 and 63 shows an example in which LC is 8 clock cycles, the minimum latency will be mentioned later on. Between different banks, the execution of two commands BA is enabled in consecutive cycles.

(8) Command BC to Command BA Latency (LP)

As shown in FIGS. 51 and 53, the execution of a command BA for the same bank after a command BC requires that an interval LP is satisfied. The minimum latency will be mentioned later on.

<Data Byte Control>

Figure 64:
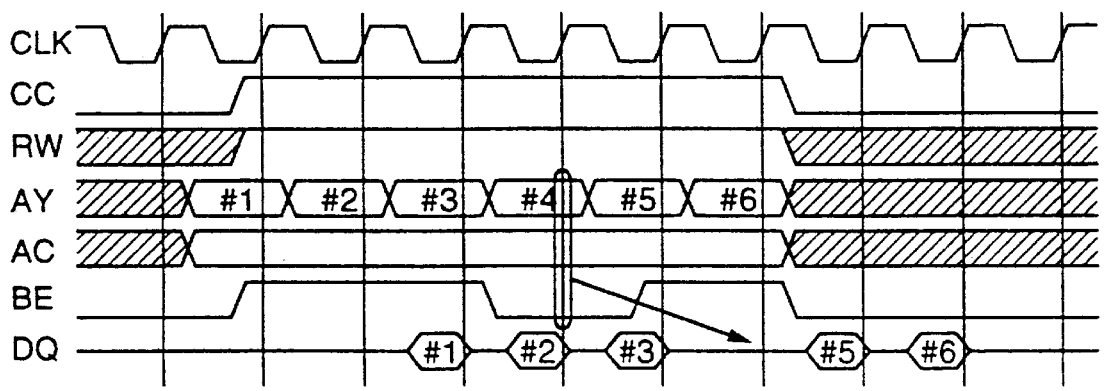
FIG. 64 is a diagram showing the latency of a byte control signal in the DRAM module at the time of reading.

A data byte control signal BEi performs a masking operation for input/output data. At the time of reading, the data byte control signal BEi enables the control of an output buffer. In the case where BEi=1, the output of the output buffer is turned to a low impedance status so that the output of data is made possible. In the case where BEi=0, the output of the output buffer is turned to a high impedance status so that the output of data is inhibited. As shown in FIG. 64, the latency of the data byte control signal BEi at the time of reading is 2. FIG. 64 shows an example in which since BEi=0 is set for data corresponding an address of #4, the corresponding data is not outputted to a data input/output DQ.

Figure 65:
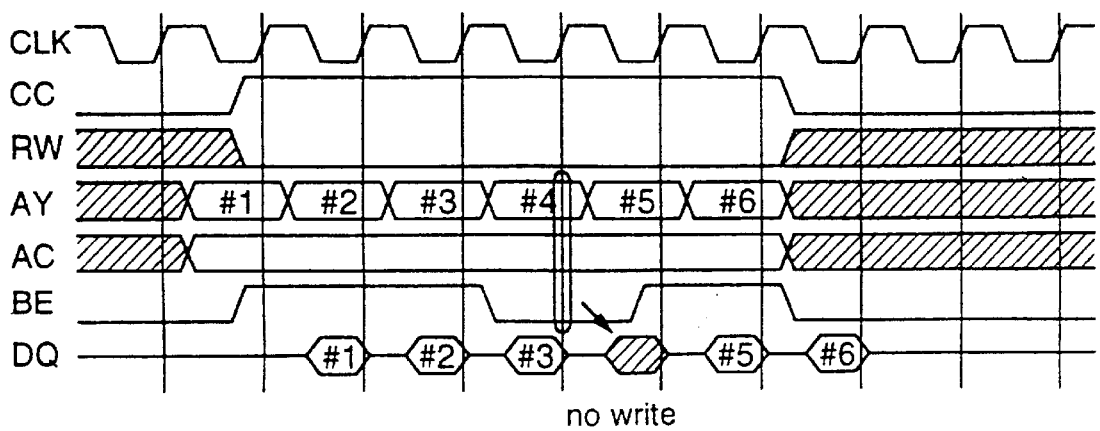
FIG. 65 is a diagram showing the latency of a byte control signal in the DRAM module at the time of writing.

At the time of writing, the data byte control signal BEi enables the masking of input data. In the case where BEi=1, the writing of input data is made possible. In the case where BEi=0, the corresponding data is not written and the previous data is held. As shown in FIG. 65, the latency of the data byte control signal BEi at the time of writing is 1. FIG. 65 shows an example in which since BEi=0 is set for data corresponding an address of #4, the corresponding data on a data input/output DQ is not written.

<Refresh>

The DRAM module M25 is refreshed in accordance with a row activation/refreshing system. Namely, the refreshing is made by selecting each word line of each bank by use of a command BA. The refresh cycle at the time of normal operation is 2560 cycles/16 ms. (The refreshing of all row addresses requires 2560 cycles.) The refresh cycle at the time of data holding can be extended to 2560 cycles/64 ms.

<Electrical Characteristics>

FIGS. 66a and 66b show the AC characteristics of the DRAM module M25. The minimum value of a system clock cycle tC is 15 ns, that is, the maximum operating clock frequency is 66 MHz. In FIG. 66a, the AC characteristics are determined on the basis of tT=0.5 ns (tT: the rise time and fall time of each signal) and the timing of an input signal defined based on 0.5×VDD. Meanwhile, an access time is defined on the basis of 0.5×VDD and a load condition being CL=0.3 pF, where CL represents a load capacitance.

FIGS. 67a to 67c show the operating frequency minimum latencies of the DRAM module M25. When the system clock cycle tC is 15 ns which is the minimum value, LA, LA2, LP and LC are 4, 2, 2 and 6, respectively. The reason why the minimum latency depends upon the system clock cycle tC is that internal circuits do not operate in complete synchronism with the system clock signal CLK.

In the foregoing, the present invention has been described on the basis of the embodiments thereof. The summary of effects obtained by the embodiments are as follow.

(1) Since a memory core having a plurality of I/O lines, a transfer circuit module and a logic library are stored in a data base, a semiconductor chip having a memory and a logic circuit integrated thereon can be designed in a short period of time. Further, high-speed data transfer between the memory core having the plurality of I/O lines and the logic circuit can be realized while changing a transfer pattern in a real time by a transfer circuit having a small area.

(2) Also, in a transfer circuit of the embodiment, since data to be ttansferred between a memory core and a logic circuit such as arithmetic unit is transf erred passing t hrough one stage of switches, high-speed data transfer can be realized.

(3) Further, on e stage of or a small number of stages of switch groups correspond to one transfer pattern. Therefore, in the case where the number of transfer patterns is small, a reduced number of stages suffice, thereby making it possible to reduce an occupation area.

(4) A memory macro (or memory core) is constructed by the combination of functional modules such as an amplifier module, a bank module and a power supply module. In the bank module are arranged row-system circuits which operate independently of each other and a multiplicity of I/O lines which extend in a bit line direction. There is constructed that the I/O lines are connected by merely arranging the modules so that they are adjacent to each other. With this construction, the number of bank modules can be increased and decreased while the number of I/O lines is kept constant. Therefore, it is possible to change a capacity freely in a range from a small capacity to a large capacity while maintaining the high-speed ability of the data transfer rate. Also, since the bank module can use the power supply module and the amplifier module in common, the overhead of the whole of the memory macro is little.

(5) A circuit capable of activating and inactivating the I/O lines in units of one byte is provided in an amplifier module. Thereby, the number of I/O lines coming out of a memory macro can be increased and decreased in units of one byte.

(6) In a memory having a plurality of banks, there are provided a plurality of addresses which designate each bank. Thereby, it becomes possible to input an activation command for one bank and a read or write command for another bank in the same cycle so that the reading or writing over different banks can be performed for consecutive cycles.

In the foregoing, the invention made by the present inventors has been described concretely on the basis of the embodiments. It is needless to say that the present invention is not limited to such embodiments and various changes are possible within a scope which does not depart from the subject matter of the invention. For example, in the case where the pitch of I/O lines MIOi of a memory core MR is conformed to the pitch of I/O lines LIOi of a logic circuit, it is possible to unite the memory core and a transfer circuit TG. Accordingly, the unitary structure of the memory core MR and the transfer circuit TG may be termed memory core or memory macro.

What is claimed is:

1. A method of designing a semiconductor integrated circuit device, which comprises:

preparing designing data stored in a data storage, said designing data including:

a memory bank module having a memory array, a plurality of global data lines extending in a first direction, and a plurality of power supply lines extending in the first direction;

an amplifier module including a plurality of amplifiers each of which is provided for the corresponding one of the plurality of global data lines;

a power supply module;

and a logic library; and building a first memory macro by arranging a predetermined number of the memory bank modules, the amplifier module, and the power supply module in a row in the first direction, wherein the amplifier module is placed at a first edge of the row of the memory bank modules, and the power supply module is placed at a second edge of the row of the memory bank.

2. A method of designing a semiconductor integrated circuit device according to claim 1, wherein the first edge is opposite to the second edge.

3. A method of designing a semiconductor integrated circuit device according to claim 1, wherein said designing data stored in the data storage further includes a main control circuit module, wherein the memory array of the memory bank module stored in the data storage further includes a plurality of word lines, a plurality of bit lines, and a plurality of memory cells arranged at the points of intersection thereof, wherein the memory bank module stored in the data storage further includes a control circuit having a row decoder coupled to the plurality of word lines, and a column decoder coupled to the control nodes of a plurality of column switches for coupling the plurality of bit lines with the plurality of global data lines, wherein said building step for the first memory macro further includes placing the main control circuit module at the first edge of the row of the memory bank modules.

4. A method of designing a semiconductor integrated circuit device according to claim 3, wherein each of the plurality of memory cells is a DRAM type memory cell having one transistor and one capacitor.

5. A method of designing a semiconductor integrated circuit device according to claim 1, which further comprises:

building a second memory macro by arranging a predetermined number of the memory bank modules, the amplifier module, and the power supply module in a row in the first direction, wherein the amplifier module is placed at a third edge of the row of the memory bank modules, the power supply module is placed at a fourth edge of the row of the memory bank, and the third edge is opposite to the fourth edge.

6. A method of designing a semiconductor integrated circuit device according to claim 1, which further comprises:

building a logic circuit using the logic library data; and making connection pattern between the logic circuit and the plurality of amplifiers of the amplifier module.

7. A method of designing a semiconductor integrated circuit device according to claim 6, wherein the memory array of the memory bank module stored in the data storage further includes a plurality of word lines, a plurality of bit lines, and a plurality of memory cells arranged at the points of intersection thereof, wherein each of the plurality of memory cells is a DRAM type memory cell having one transistor and one capacitor.

8. A method of designing a semiconductor integrated circuit device according to claim 1, wherein said designing data includes layout pattern data of the contained modules.

9. A method of designing a semiconductor integrated circuit device according to claim 1, wherein said designing data stored in the data storage further includes a switch group module which has a plurality of switches.

10. A method of designing a semiconductor integrated circuit device according to claim 9, which further comprises:

building a transfer circuit by arranging a predetermined number of th3e switch group modules in a row in the first direction; and placing the transfer circuit adjoining the amplifier module of the first memory macro.

11. A method of designing a semiconductor integrated circuit device according to claim 10, wherein the switch group module has a plurality of signal lines extending in the first direction, each of the plurality of signal lines being provided for the corresponding one of the plurality of amplifiers in the amplifier module and the corresponding one of the plurality of switches.

12. A method of designing a semiconductor integrated circuit device according to claim 9, wherein said designing data stored in the data storage further includes a buffer group module.

13. A method of designing a semiconductor integrated circuit device according to claim 12, wherein the building step if the transfer circuit further includes a step for placing a predetermined number of the buffer group modules to be adjoining one of the switch group modules.

14. A method of designing a semiconductor integrated circuit device according to claim 1, wherein by the arranging step of the first memory macro, the plurality of data lines is connected among the memory bank modules and to the corresponding one of the plurality of the amplifiers, each of the plurality of power supply lines is connected among the memory bank modules and to the power supply module.

15. A method of designing a semiconductor integrated circuit device according to claim 1, wherein the memory array of the memory bank module stored in the data storage further includes a plurality of word lines, a plurality of bit lines, and a plurality of memory cells arranged at the points of intersection thereof, wherein each of the plurality of memory cells is a DRAM type memory cell having one transistor and one capacitor.

* * * * *